(12) United States Patent
Akimoto

(10) Patent No.: US 12,464,859 B2
(45) Date of Patent: Nov. 4, 2025

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

(*) Notice: Subject to any disclaimer, the term of this patent is extended or adjusted under 35 U.S.C. 154(b) by 524 days.

(21) Appl. No.: 18/062,973

(22) Filed: Dec. 7, 2022

(65) Prior Publication Data

US 2023/0108577 A1    Apr. 6, 2023

Related U.S. Application Data

(63) Continuation of application No. PCT/JP2021/019782, filed on May 25, 2021.

(30) Foreign Application Priority Data

Jun. 18, 2020  (JP) ................. 2020-105291

(51) Int. Cl.
*H10H 20/81*    (2025.01)
*H10H 20/01*    (2025.01)
(Continued)

(52) U.S. Cl.
CPC .... *H10H 20/814* (2025.01); *H10H 20/01335* (2025.01); *H10H 20/81* (2025.01);
(Continued)

(58) Field of Classification Search
CPC ........... H10H 20/814; H10H 20/01335; H10H 20/81; H10H 20/825; H10H 20/833;
(Continued)

(56) References Cited

U.S. PATENT DOCUMENTS

2002/0070454 A1    6/2002  Yasukawa
2003/0201508 A1*  10/2003  Yasukawa .......... H10D 30/6758
                                                    257/E29.295
(Continued)

FOREIGN PATENT DOCUMENTS

CN     110459557 A    11/2019
EP     3 316 301 A1    5/2018
(Continued)

OTHER PUBLICATIONS

International Search Report with English Translation and Written Opinion dated Aug. 3, 2021 in corresponding International Application No. PCT/JP2021/019782.

*Primary Examiner* — S M Sohel Imtiaz
(74) *Attorney, Agent, or Firm* — Foley & Lardner LLP

(57) ABSTRACT

A method for manufacturing an image display device according to an embodiment includes preparing a structure including a semiconductor layer formed on a first substrate, bonding the semiconductor layer to a first surface of a second substrate, removing the first substrate, forming a light-emitting element including a light-emitting surface opposite to a bottom surface on the first surface by etching the semiconductor layer, forming a first insulating film that covers the first surface and the light-emitting element, forming a circuit element on the first insulating film, forming a second insulating film that covers the circuit element and the first insulating film, exposing a surface including the light-emitting surface by removing a portion of the first and second insulating films, forming a via extending through the first and second insulating films, and forming a wiring layer on the second insulating film.

25 Claims, 34 Drawing Sheets

(51) Int. Cl.
  *H10H 20/814* (2025.01)
  *H10H 20/825* (2025.01)
  *H10H 20/833* (2025.01)
  *H10H 20/851* (2025.01)
  *H10H 20/857* (2025.01)

(52) U.S. Cl.
  CPC ........ *H10H 20/825* (2025.01); *H10H 20/833* (2025.01); *H10H 20/851* (2025.01); *H10H 20/857* (2025.01); *H10H 20/032* (2025.01); *H10H 20/0361* (2025.01); *H10H 20/0364* (2025.01)

(58) Field of Classification Search
  CPC .. H10H 20/851; H10H 20/857; H10H 20/018; H10H 20/84; H10D 86/0212; H10D 86/411; H10D 86/60; H01L 25/0753; H01L 25/167
  See application file for complete search history.

(56) References Cited

U.S. PATENT DOCUMENTS

| | | | | |
|---|---|---|---|---|
| 2003/0207545 A1* | 11/2003 | Yasukawa | ......... | H10D 30/6758 |
| | | | | 438/149 |
| 2007/0082486 A1 | 4/2007 | Yang et al. | | |
| 2009/0209086 A1* | 8/2009 | Tanaka | ................. | H10D 86/60 |
| | | | | 257/E21.561 |
| 2012/0241733 A1* | 9/2012 | Morooka | ............. | H10K 59/123 |
| | | | | 438/34 |
| 2014/0367719 A1* | 12/2014 | Jain | ........................ | H05B 33/10 |
| | | | | 438/27 |
| 2016/0322503 A1 | 11/2016 | Tezuka et al. | | |
| 2018/0114878 A1 | 4/2018 | Danesh et al. | | |
| 2018/0196564 A1* | 7/2018 | Lin | ........................ | G06F 3/0412 |
| 2018/0351035 A1 | 12/2018 | Chung et al. | | |
| 2019/0157523 A1* | 5/2019 | Hong | ................... | H10D 86/451 |
| 2019/0273179 A1 | 9/2019 | Iguchi et al. | | |
| 2019/0355766 A1 | 11/2019 | Zhang et al. | | |
| 2020/0274023 A1 | 8/2020 | Kang | | |
| 2020/0303471 A1 | 9/2020 | Akimoto | | |
| 2021/0217805 A1 | 7/2021 | Kusunoki et al. | | |
| 2021/0327865 A1 | 10/2021 | Yamazaki et al. | | |
| 2022/0149228 A1 | 5/2022 | Akimoto | | |

FOREIGN PATENT DOCUMENTS

| | | |
|---|---|---|
| EP | 3 355 352 A1 | 8/2018 |
| JP | 2002-057283 A | 2/2002 |
| JP | 2002-141492 A | 5/2002 |
| JP | 2003-172950 A | 6/2003 |
| JP | 2003-207806 A | 7/2003 |
| JP | 2005-333042 A | 12/2005 |
| JP | 2007-053357 A | 3/2007 |
| JP | 2009-224769 A | 10/2009 |
| JP | 2012-204077 A | 10/2012 |
| JP | 2018-508971 A | 3/2018 |
| JP | 2018-508972 A | 3/2018 |
| JP | 2018-205741 A | 12/2018 |
| JP | 2019-153783 A | 9/2019 |
| JP | 2019-534565 A | 11/2019 |
| JP | 2020-507107 A | 3/2020 |
| TW | 201642471 A | 12/2016 |
| WO | WO-2016/100662 A1 | 6/2016 |
| WO | WO-2018/132070 A1 | 7/2018 |
| WO | WO-2019/220246 A1 | 11/2019 |
| WO | WO-2020/049392 A1 | 3/2020 |
| WO | WO-2021/014972 A1 | 1/2021 |

* cited by examiner

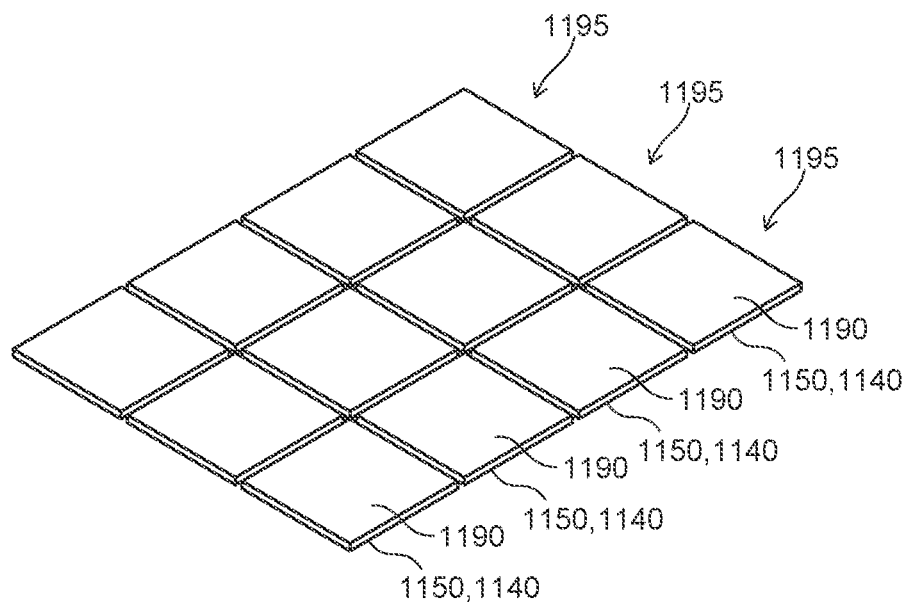
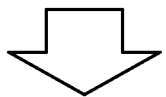
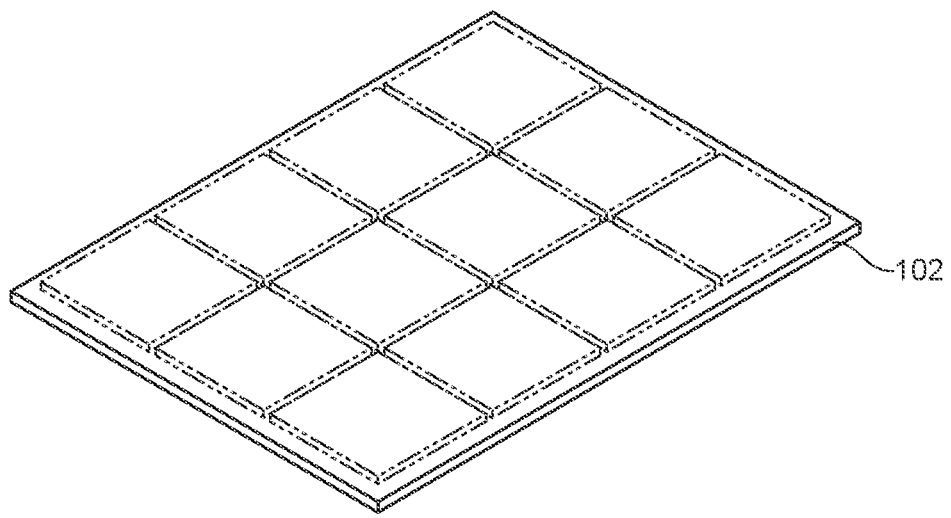
FIG. 6
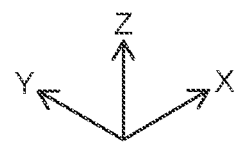

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2021/019782, filed May 25, 2021, which claims priority to Japanese Application No. 2020-105291, filed Jun. 18, 2020. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

An embodiment of the invention provides a method for manufacturing an image display device in which a transfer process of a light-emitting element is shortened, and the yield is increased.

A method for manufacturing an image display device according to an embodiment of the invention includes a process of preparing a second substrate that includes a semiconductor layer including a light-emitting layer formed on a first substrate, a process of bonding the semiconductor layer to a first surface of a third substrate, a process of removing the first substrate, a process of forming a light-emitting element that includes a bottom surface on the first surface and a light-emitting surface located opposite to the bottom surface by etching the semiconductor layer, a process of forming a first insulating film that covers the first surface and the light-emitting element, a process of forming a circuit element on the first insulating film, a process of forming a second insulating film that covers the circuit element and the first insulating film, a process of exposing a surface including the light-emitting surface by removing a portion of the first insulating film and a portion of the second insulating film, a process of forming a via extending through the first and second insulating films, and a process of forming a wiring layer on the second insulating film. The light-emitting element includes the connection part formed on the first surface. The via is located between the wiring layer and the connection part and electrically connects the wiring layer and the connection part.

An image display device according to an embodiment of the invention includes a substrate including a first surface, a light-emitting element including a bottom surface on the first surface and a light-emitting surface that is a surface opposite to the bottom surface, a first insulating film covering the first surface and a side surface of the light-emitting element, a circuit element located on the first insulating film, a second insulating film covering the circuit element and the first insulating film, a via provided to extend through the first and second insulating films, and a wiring layer located on the second insulating film. The light-emitting element includes a connection part formed on the first surface. The via is located between the wiring layer and the connection part and electrically connects the wiring layer and the connection part.

An image display device according to an embodiment of the invention includes a substrate including a first surface, a semiconductor layer including a bottom surface on the first surface, a surface opposite to the bottom surface, and multiple light-emitting surfaces at the surface, a first insulating film covering the first surface and a side surface of the semiconductor layer, multiple transistors located on the first insulating film, a second insulating film covering the multiple transistors and the first insulating film, multiple vias provided to extend through the first and second insulating films, and a wiring layer located on the second insulating film. The semiconductor layer includes a connection part formed on the first surface. The multiple vias are located between the wiring layer and the connection part and electrically connect the wiring layer and the connection part.

According to an embodiment of the invention, a method for manufacturing an image display device is realized in which a transfer process of a light-emitting element is shortened, and the yield is increased.

BRIEF DESCRIPTION OF THE DRAWINGS

FIG. 6 is a schematic perspective view illustrating the method for manufacturing the image display device of the first embodiment.

DETAILED DESCRIPTION

Figure 1:
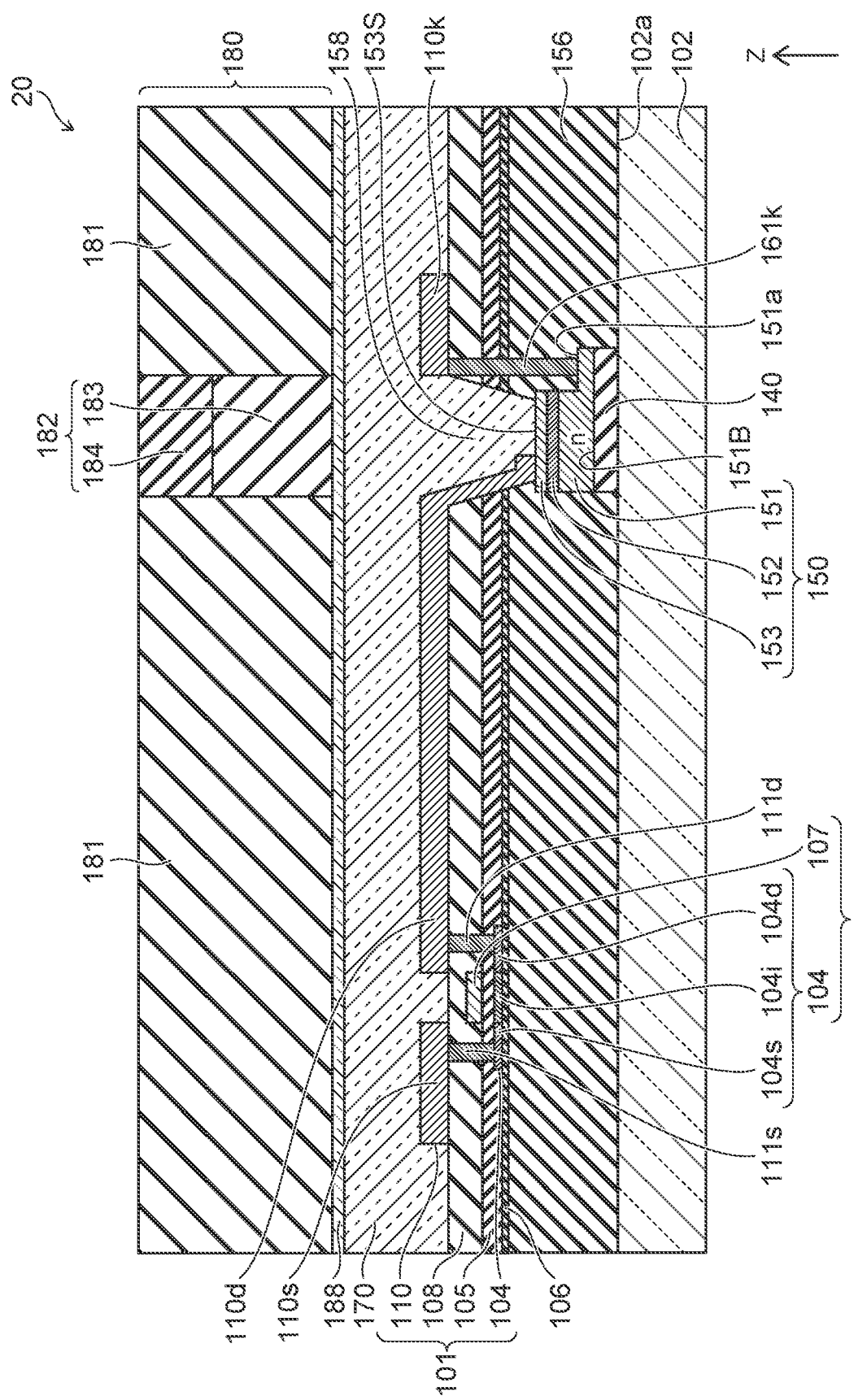
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment. A pixel that is included in an image displayed in the image display device includes multiple subpixels 20.

Figure 14:
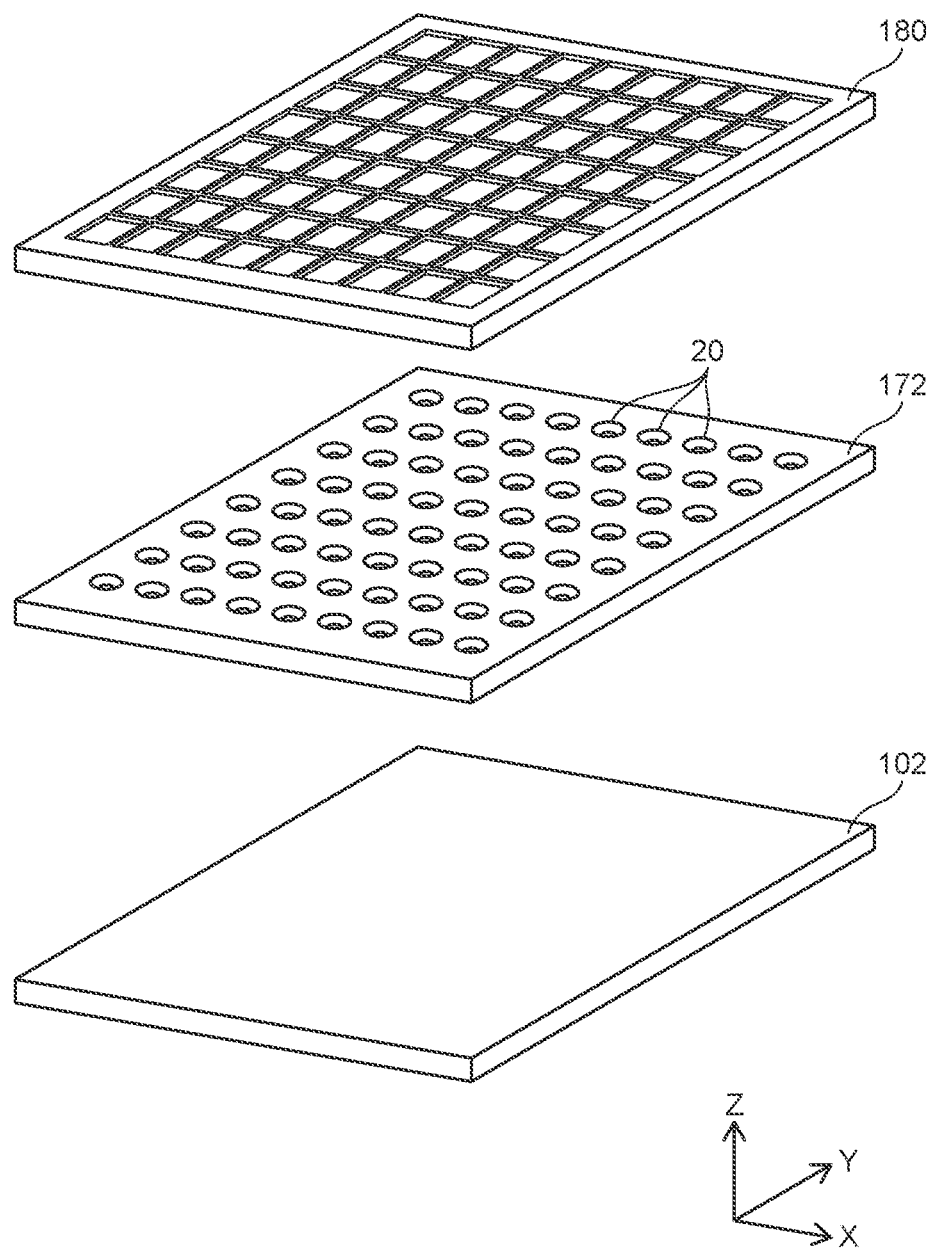
FIG. 14 is a schematic perspective view illustrating the image display device according to the first embodiment.

Hereinbelow, the description may use an XYZ three-dimensional coordinate system. The subpixels 20 are arranged in a two-dimensional planar shape as shown in FIG. 14 below. The two-dimensional plane in which the subpixels 20 are arranged is taken as an XY plane. The subpixels 20 are arranged along an X-axis direction and a Y-axis direction. FIG. 1 illustrates an auxiliary cross section along line AA' of FIG. 4 below, and is a cross-sectional view in which cross sections of multiple planes perpendicular to the XY plane are linked in one plane. In the other drawings as well, as in FIG. 1, in a cross-sectional view of multiple planes perpendicular to the XY plane, the X-axis and the Y-axis are not illustrated, and the Z-axis that is perpendicular to the XY plane is shown. That is, in these drawings, the plane perpendicular to the Z-axis is taken as the XY plane. Although the positive direction of the Z-axis may be called "up" or "above" and the negative direction of the Z-axis may be called "down" or "below" for convenience, directions along the Z-axis are not necessarily directions in which gravity acts. Also, a length in a direction along the Z-axis may be called a height.

The subpixel 20 includes a light-emitting surface 153S that is substantially parallel to the XY plane. The light-emitting surface 153S is a surface that radiates light mainly in the positive direction of the Z-axis orthogonal to the XY plane.

As shown in FIG. 1, the subpixel 20 of the image display device includes a substrate 102, a light-emitting element 150, a first inter-layer insulating film 156, a transistor 103, a second inter-layer insulating film 108, a via 161k, and a wiring layer 110.

According to the embodiment, the substrate 102 on which the light-emitting element 150 is formed is a light-transmitting substrate, e.g., a glass substrate. The substrate 102 includes a first surface 102a. The first surface 102a is a surface that is substantially parallel to the XY plane. The transistor 103 is a thin film transistor (Thin Film Transistor, TFT) and is formed on the first inter-layer insulating film 156. The light-emitting element 150 is formed on the first surface 102a. The light-emitting element 150 is driven by a TFT provided with the first inter-layer insulating film 156 interposed. The process of forming the circuit element that includes the TFT on a large glass substrate is advantageous in that the process is established for manufacturing a liquid crystal panel, an organic EL panel, etc., and an existing plant can be utilized.

The subpixel 20 further includes a color filter 180. The color filter 180 (a wavelength conversion member) is located on a surface resin layer 170 with a transparent thin film adhesive layer 188 interposed. The surface resin layer 170 is located on the second inter-layer insulating film 108 and the wiring layer 110.

The configuration of the subpixel 20 will now be described in detail.

In the example, the light-emitting element 150 is located on the first surface 102a with a buffer layer 140 interposed. The buffer layer 140 is formed of an insulating material. The buffer layer 140 is used when growing a semiconductor layer for forming the light-emitting element 150, and is elaborated in the description of the manufacturing method below.

The light-emitting element 150 includes the light-emitting surface 153S. The light-emitting element 150 is a prismatic or cylindrical element that includes a bottom surface 151B on the first surface 102a. The light-emitting surface 153S is the surface of the light-emitting element 150 opposite to the bottom surface 151B. In the example, the bottom surface 151B of the light-emitting element 150 is a surface that contacts the buffer layer 140.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the bottom surface 151B toward the light-emitting surface 153S. Accordingly, in the example, the n-type semiconductor layer 151 is located in contact with the buffer layer 140.

The n-type semiconductor layer 151 includes a connection part 151a. The connection part 151a is provided to protrude together with the buffer layer 140 on the first surface 102a in one direction from the n-type semiconductor layer 151. The height of the connection part 151a is equal to the height of the n-type semiconductor layer 151, or is less than the height of the n-type semiconductor layer 151, and the light-emitting element 150 is formed in a staircase shape. The connection part 151a is of the n-type and is electrically connected with the n-type semiconductor layer 151. The connection part 151a is connected to one end of the via 161k, and the n-type semiconductor layer 151 is electrically connected to the via 161k via the connection part 151a.

When the light-emitting element 150 has a prismatic shape, the shape of the light-emitting element 150 when projected onto the XY plane is, for example, substantially square or rectangular. When the shape of the light-emitting element 150 when projected onto the XY plane is polygonal including rectangular, the corners of the light-emitting element 150 may be rounded. When the shape of the light-emitting element 150 when projected onto the XY plane is a cylindrical shape, the shape of the light-emitting element 150 when projected onto the XY plane is not limited to circular and may be, for example, elliptical. The degrees of freedom of the wiring layout, etc., are increased by appropriately selecting the shape, arrangement, etc., of the light-emitting element in a plan view.

For example, a gallium nitride compound semiconductor that includes a light-emitting layer of $In_XAl_YGa_{1-X-Y}N$ (0≤X, 0≤Y, and X+Y<1), etc., is favorably included in the light-emitting element 150. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be a wavelength in the range of the near-ultraviolet region to the visible region, e.g., about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above and can be appropriately set.

The surface areas of the light-emitting layers 152 when projected onto the XY plane are set according to the light emission colors of the red, green, and blue subpixels. Hereinbelow, the surface area when projected onto the XY plane may be called simply the surface area. The surface area of the light-emitting layer 152 is appropriately set according to the luminous efficiency, the conversion efficiency of a color conversion part 182 of the color filter 180, etc. That is, the surface areas of the light-emitting layers 152 of the subpixels 20 of the light emission colors may be the same or may be different between the light emission colors. The surface area of the light-emitting layer 152 is the surface area of the region surrounded with the outer perimeter of the light-emitting layer 152 projected onto the XY plane.

The first inter-layer insulating film 156 (a first insulating film) covers the first surface 102a. The first inter-layer insulating film 156 covers the side surface of the buffer layer 140 and the side surface of the light-emitting element 150. The first inter-layer insulating film 156 insulates the light-emitting elements 150 from each other. The first inter-layer insulating film 156 insulates the light-emitting element 150 from circuit elements such as the transistor 103, etc. The first inter-layer insulating film 156 provides a flat surface for forming a circuit 101 that includes circuit elements such as the transistor 103, etc. By covering the light-emitting element 150, the first inter-layer insulating film 156 protects the light-emitting element 150 from thermal stress when forming the transistor 103, etc.

The first inter-layer insulating film 156 is formed of an organic insulating material. The organic insulating material that is included in the first inter-layer insulating film 156 is favorably a white resin. A white resin reflects the light of the light-emitting element 150 emit in the lateral direction, returning light caused by the interface of the color filter 180, etc.; therefore, using a white resin as the first inter-layer insulating film 156 contributes to the substantial improvement of the luminous efficiency of the light-emitting element 150.

The white resin is formed by dispersing fine scattering particles having a Mie (Mie) scattering effect in a silicon resin such as SOG (Spin On Glass) or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter that is about ½ of the light wavelength. For example, $TiO_2$, $Al_2SO_3$, ZnO, etc., are examples of such a fine scattering particle.

Alternatively, the white resin can be formed also by utilizing many fine pores or the like dispersed in the transparent resin. When whitening the first inter-layer insulating film 156, for example, a $SiO_2$ film or the like that is formed by ALD (Atomic-Layer-Deposition) or CVD overlapping SOG, etc., may be used.

The first inter-layer insulating film 156 may be a black resin. By using a black resin as the first inter-layer insulating film 156, the scattering of the light in the subpixel 20 is suppressed, and stray light is more effectively suppressed. An image display device in which stray light is suppressed can display a sharper image.

A TFT underlying film 106 is formed over the first inter-layer insulating film 156. The TFT underlying film 106 is provided to ensure flatness when forming the transistor 103 and to protect a TFT channel 104 of the transistor 103 from contamination when heat processing, etc. The TFT underlying film 106 is, for example, an insulating film of $SiO_2$, etc.

The transistor 103 is formed on the TFT underlying film 106. In addition to the transistor 103, other circuit elements such as transistors, capacitors, etc., are formed on the TFT underlying film 106, and the circuit 101 is configured using wiring portions, etc. For example, in FIG. 3 below, the transistor 103 corresponds to a drive transistor 26. Also, a select transistor 24, a capacitor 28, etc., are circuit elements in FIG. 3. The circuit 101 includes the TFT channel 104, an insulating layer 105, the second inter-layer insulating film 108, vias 111s and 111d, and the wiring layer 110.

In the example, the transistor 103 is a p-channel thin film transistor (Thin Film Transistor, TFT). The transistor 103 includes the TFT channel 104 and a gate 107. Favorably, the TFT channel 104 is formed by a low-temperature polysilicon (Low Temperature Poly Silicon, LTPS) process. In the LTPS process, the TFT channel 104 is formed by polycrystallizing and activating a region of amorphous Si formed on the TFT underlying film 106. For example, laser annealing with a laser is used to polycrystallize and activate the amorphous Si region. The TFT that is formed by the LTPS process has sufficiently high mobility.

The TFT channel 104 includes regions 104s, 104i, and 104d. The regions 104s, 104i, and 104d each are located on the TFT underlying film 106. The region 104i is located between the region 104s and the region 104d. The regions 104s and 104d are doped with p-type impurities such as boron ions ($B^+$), boron fluoride ions ($BF^{2+}$), etc., and have ohmic connections with the vias 111s and 111d.

The gate 107 is located on the TFT channel 104 with the insulating layer 105 interposed. The insulating layer 105 is provided to insulate the TFT channel 104 and the gate 107 and to insulate from other adjacent circuit elements. The current that flows between the regions 104s and 104d can be controlled by a channel that is formed in the region 104*i* when a potential that is less than that of the region 104*s* is applied to the gate 107.

The insulating layer 105 is, for example, $SiO_2$. The insulating layer 105 may be a multilevel insulating layer that includes $SiO_2$, $Si_3N_4$, etc., according to the covered region.

For example, the gate 107 may be formed of polycrystal Si or may be formed of a refractory metal such as W, Mo, etc. Generally, the polycrystal Si film of the gate 107 is formed by CVD, etc.

The second inter-layer insulating film 108 is located on the gate 107 and the insulating layer 105. For example, the second inter-layer insulating film 108 is formed of the same material as the first inter-layer insulating film 156. That is, the second inter-layer insulating film 108 is formed of a white resin, an inorganic film such as $SiO_2$, etc. The second inter-layer insulating film 108 also functions as a planarization film for forming the wiring layer 110.

The first inter-layer insulating film 156, the TFT underlying film 106, the insulating layer 105, and the second inter-layer insulating film 108 are configured as described above and therefore are not provided at the upper part of the light-emitting surface 153S. That is, the light-emitting surface 153S is exposed from the first inter-layer insulating film 156, the TFT underlying film 106, the insulating layer 105, and the second inter-layer insulating film 108 by an opening 158. As described below, the opening 158 is filled with the surface resin layer 170.

The vias 111*s* and 111*d* are provided to extend through the second inter-layer insulating film 108 and the insulating layer 105. The wiring layer 110 is formed on the second inter-layer insulating film 108. The wiring layer 110 includes multiple wiring portions that may have different potentials. In the example, the wiring layer 110 includes wiring portions 110*s*, 110*d*, and 110*k*.

A portion of the wiring portion 110*s* is located above the region 104*s*. For example, another part of the wiring portion 110*s* is connected to a power supply line 3 shown in FIG. 3 below. A portion of the wiring portion 110*d* (a second wiring portion) is located above the region 104*d*. Another part of the wiring portion 110*d* is connected to a surface including the light-emitting surface 153S. The surface including the light-emitting surface 153S is in the same plane as the light-emitting surface 153S, and one end of the other part of the wiring portion 110*d* is connected to this surface at a surface other than the light-emitting surface 153S. A portion of the wiring portion 110*k* (a first wiring portion) is located above the connection part 151*a*. For example, another part of the wiring portion 110*k* is connected to a ground line 4 shown in FIG. 3 below.

For the wiring layers in FIG. 1 and subsequent cross-sectional views, unless otherwise noted, the reference numeral of one wiring portion included in the wiring layer to be marked with a reference numeral is displayed at a position beside the wiring portion.

The via 111*s* is located between the wiring portion 110*s* and the region 104*s* and electrically connects the wiring portion 110*s* and the region 104*s*. The via 111*d* is located between the wiring portion 110*d* and the region 104*d* and electrically connects the wiring portion 110*d* and the region 104*d*.

The wiring portion 110*s* is connected to the region 104*s* by the via 111*s*. The region 104*s* is a source region of the transistor 103. Accordingly, the source region of the transistor 103 is electrically connected to the power supply line 3 by the via 111*s* and the wiring portion 110*s*.

The wiring portion 110*d* is connected to the region 104*d* by the via 111*d*. The region 104*d* is a drain region of the transistor 103. Accordingly, the drain region of the transistor 103 is electrically connected to the p-type semiconductor layer 153 by the via 111*d* and the wiring portion 110*d*.

The via 161*k* is provided to extend through the second inter-layer insulating film 108, the insulating layer 105, the TFT underlying film 106, and the first inter-layer insulating film 156. The via 161*k* is located between the wiring portion 110*k* and the connection part 151*a* and electrically connects the wiring portion 110*k* and the connection part 151*a*. Accordingly, the n-type semiconductor layer 151 is electrically connected to the ground line 4 via the connection part 151*a*, the via 161*k*, and the wiring portion 110*k*.

For example, the wiring layer 110 and the vias 111*s*, 111*d*, and 161*k* are formed of Al, an alloy of Al, a stacked film of Al, Ti, and the like, etc. For example, in a stacked film of Al and Ti, Al is stacked on a thin film of Ti, and then Ti is stacked on the Al.

The surface resin layer 170 covers the second inter-layer insulating film 108 and the wiring layer 110. The surface resin layer 170 also fills the interior of the opening 158. The surface resin layer 170 covers the light-emitting surface 153S from above. The surface resin layer 170 that is filled into the opening 158 covers the side surfaces of the first inter-layer insulating film 156, the TFT underlying film 106, the insulating layer 105, and the second inter-layer insulating film 108. The surface resin layer 170 is a transparent resin, protects the inter-layer insulating film 156 and the wiring layer 110, and provides a planarized surface for bonding the color filter 180.

The color filter 180 includes a light-shielding part 181 and the color conversion part 182. The color conversion part 182 is located directly above the light-emitting surface 153S of the light-emitting element 150 to correspond to the shape of the light-emitting surface 153S. The part of the color filter 180 other than the color conversion part 182 is the light-shielding part 181. The light-shielding part 181 is a so-called black matrix that reduces blur due to color mixing of the light emitted from the adjacent color conversion parts 182, etc., and makes it possible to display a sharp image.

The color conversion part 182 has one, two, or more layers. FIG. 1 shows a case in which the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, the first layer is the color conversion layer 183, and the second layer is the filter layer 184. The color conversion layer 183 of the first layer is located at a position that is more proximate to the light-emitting element 150. The filter layer 184 is stacked on the color conversion layer 183.

The color conversion layer 183 converts the wavelength of the light emitted by the light-emitting element 150 into the desired wavelength. When the subpixel 20 emits red, for example, light of the wavelength of the light-emitting element 150, i.e., 467 nm±20 nm, is converted into light of a wavelength of about 630 nm±20 nm. When the subpixel 20 emits green light, for example, light of the wavelength of the light-emitting element 150, i.e., 467 nm±20 nm, is converted into light of a wavelength of about 532 nm±20 nm.

The filter layer 184 blocks the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without the light having passed through the color conversion layer 183. When the wavelength of the light emitted by the light-emitting element 150 is about 467 nm±20 nm, the subpixel 20 may output the light without the light having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

Figure 2:
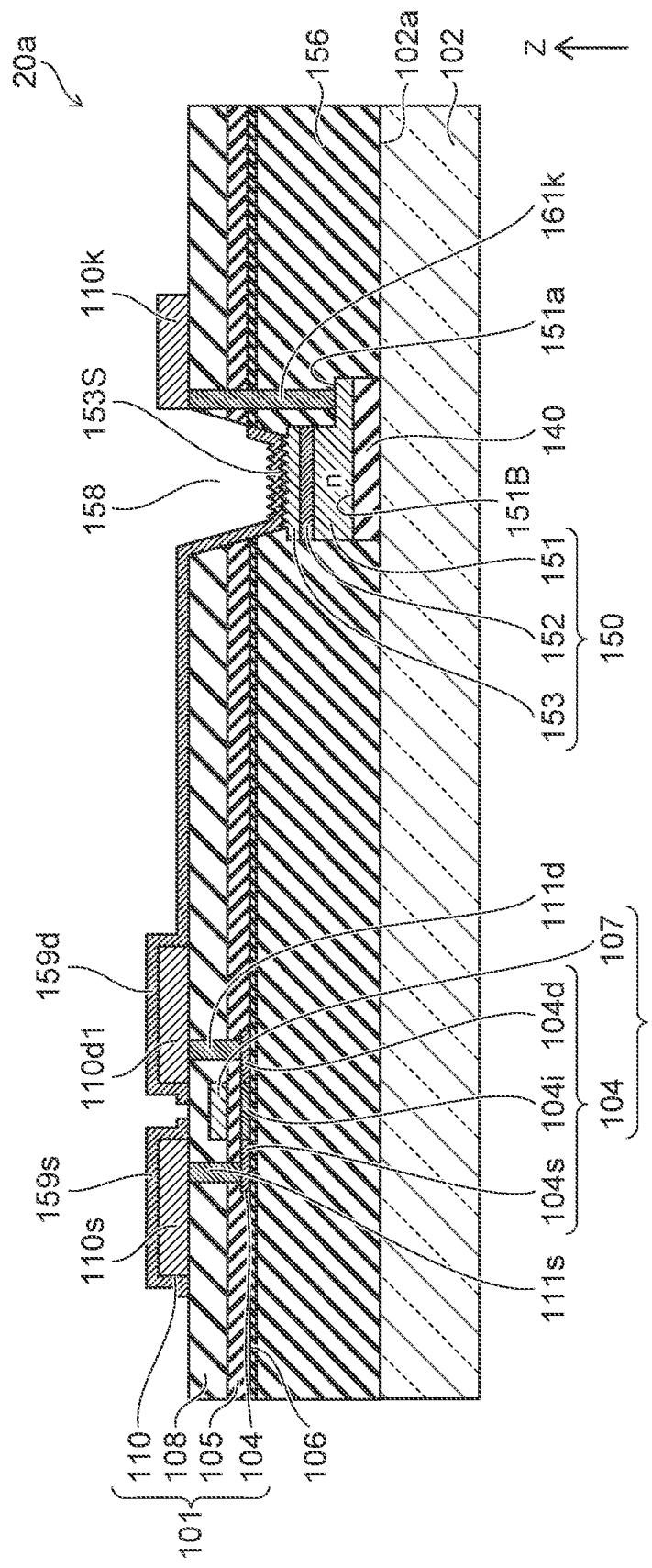
FIG. 2 is a cross-sectional view schematically showing a portion of a modification of the image display device according to the first embodiment.

FIG. 2 is a cross-sectional view schematically showing a portion of a modification of the image display device according to the embodiment.

In FIG. 2 and subsequent cross-sectional views of the subpixel, the surface resin layer 170, the transparent thin film adhesive layer 188, and the color filter 180 are not illustrated to avoid complexity. Unless otherwise specified, in subsequent drawings other than cross-sectional views for describing manufacturing methods, the surface resin layer 170 and the structural component above the surface resin layer 170 are located on the second inter-layer insulating film 108, on the wiring layer 110, and in the opening 158. This is similar for the other embodiments and their modifications described below as well.

In a subpixel 20a in the case of FIG. 2, the connection method between the light-emitting element 150 and an wiring portion 110d1 is different from the connection method between the light-emitting element 150 and the wiring portion 110d according to the first embodiment described above. The modification differs from the first embodiment also in that a light-transmitting electrode 159s is provided over the wiring portion 110s. Otherwise, the modification is the same as the first embodiment, the same components are marked with the same reference numerals, and a detailed description is omitted as appropriate.

As shown in FIG. 2, the subpixel 20a includes the light-emitting element 150, the wiring portion 110d1, and a light-transmitting electrode 159d. The wiring portion 110d1 is located above the region 104d and the via 111d. The wiring portion 110d1 is connected to the region 104d by the via 111d. The wiring portion 110d1 does not extend to reach the light-emitting surface 153S and is not directly connected to the light-emitting surface 153S.

The light-transmitting electrode 159d is provided over the wiring portion 110d1. The light-transmitting electrode 159d is provided over the light-emitting surface 153S. The light-transmitting electrode 159d also is located between the wiring portion 110d1 and the light-emitting surface 153S and electrically connects the wiring portion 110d1 and the light-emitting surface 153S.

The light-transmitting electrode 159s is provided over the wiring portion 110s. The light-transmitting electrode 159d and the light-transmitting electrode 159s are formed of transmissive conductive films. An ITO film, a ZnO film, or the like is favorably included in the light-transmitting electrodes 159d and 159s. A light-transmitting electrode also may be provided on the wiring portion 110k.

It is favorable to perform surface roughening of the light-emitting surface 153S. The light extraction efficiency of the light-emitting element 150 can be increased when the light-emitting surface 153S is a rough surface.

By providing the light-transmitting electrode 159d on the light-emitting surface 153S, the connection area between the light-transmitting electrode 159d and the p-type semiconductor layer 153 can be increased, and the surface area of the light-emitting surface 153S can be increased; therefore, the luminous efficiency can be increased. When the light-emitting surface 153S is a rough surface, the luminous efficiency can be further increased by reducing the contact resistance by increasing the connection area between the light-emitting surface 153S and the light-transmitting electrode 159d.

The embodiment can include any configuration of the subpixels 20 and 20a described above.

Figure 3:
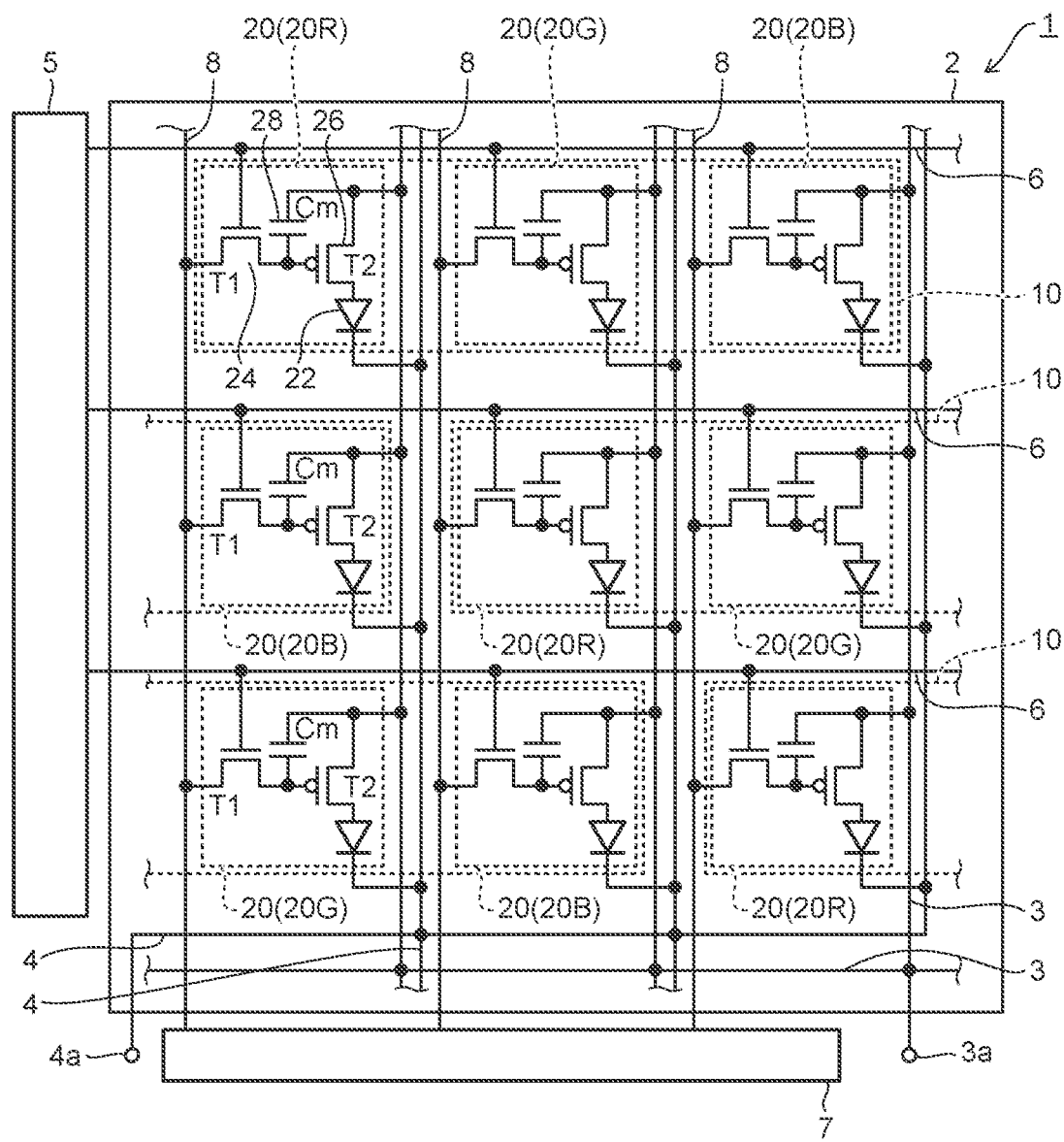
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3a and a GND terminal 4a. The power supply terminal 3a and the GND terminal 4a are located respectively at end portions of the power supply line 3 and the ground line 4, and are connected to a DC power supply circuit located outside the display region 2. The power supply terminal 3a supplies a positive voltage when referenced to the GND terminal 4a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

Figure 4:
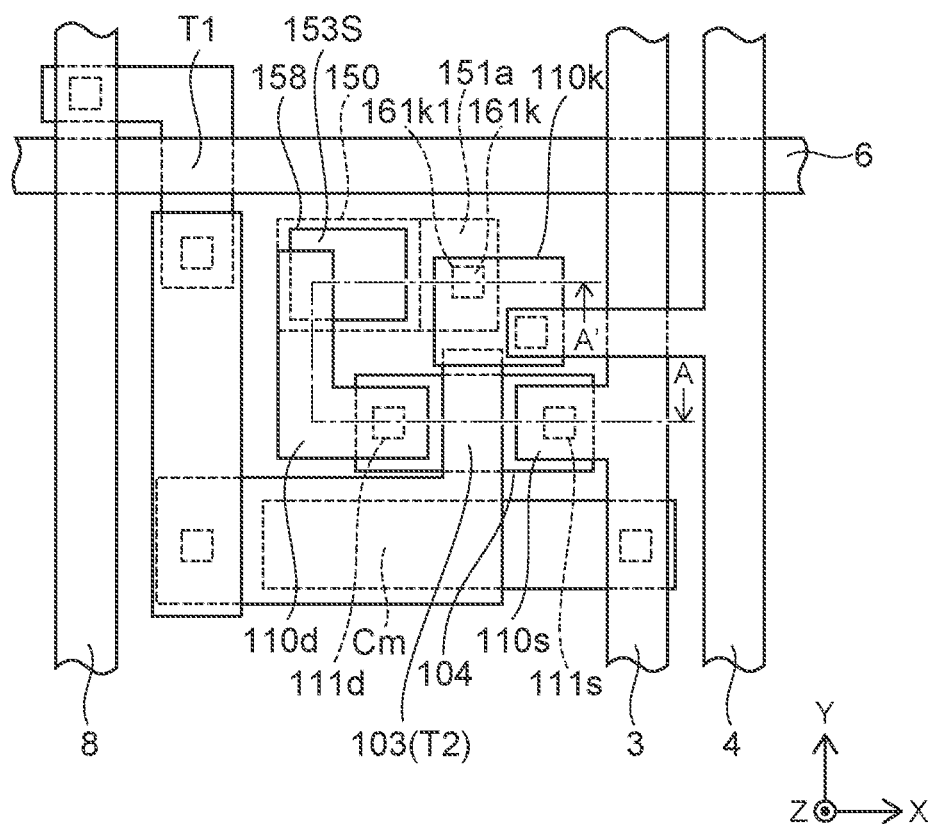
FIG. 4 is a schematic plan view illustrating a portion of the image display device of the first embodiment.

The subpixel 20 includes a light-emitting element 22, the select transistor 24, the drive transistor 26, and the capacitor 28. In FIGS. 3 and 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and an anode electrode of the light-emitting element 22 is connected to a drain electrode of the drive transistor 26. Major electrodes of the drive transistor 26 and the select transistor 24 are drain electrodes and source electrodes. The anode electrode of the light-emitting element 22 is connected to a p-type semiconductor layer. The cathode electrode of the light-emitting element 22 is connected to an n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage that is applied between the gate and source of the drive transistor 26, and the light-emitting element 22 emits light of a luminance corresponding to the current that flows.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

FIG. 4 is a schematic plan view illustrating a portion of the image display device of the embodiment.

According to the embodiment as described in reference to FIG. 1, the light-emitting element 150 and the drive transistor 103 are stacked in the Z-axis direction with the first inter-layer insulating film 156 interposed. The light-emitting element 150 corresponds to the light-emitting element 22 in FIG. 3. The drive transistor 103 corresponds to the drive transistor 26 in FIG. 3 and is labeled as T2.

As shown in FIG. 4, the cathode electrode of the light-emitting element 150 is provided by the connection part 151a. The connection part 151a is located in a layer that is lower than the transistor 103 and the wiring layer 110. The connection part 151a is electrically connected to the wiring portion 110k by the via 161k. More specifically, one end of the via 161k is connected to the connection part 151a. The other end of the via 161k is connected to the wiring portion 110k via a contact hole 161k1.

The anode electrode of the light-emitting element 150 is provided by the p-type semiconductor layer 153 shown in FIG. 1. The wiring portion 110d extends to the surface including the light-emitting surface 153S via the opening 158. The p-type semiconductor layer 153 is connected to one end of the wiring portion 110d via the surface including the light-emitting surface 153S. The surface including the light-emitting surface 153S is a surface in the same plane as the light-emitting surface 153S. The one end of the wiring portion 110d is connected to the surface including the light-emitting surface 153S, and the remaining surface is the light-emitting surface 153S.

Another end of the wiring portion 110d is connected to the drain electrode of the transistor 103 by the via 111d. The drain electrode of the transistor 103 is the region 104d shown in FIG. 1. The source electrode of the transistor 103 is connected to the wiring portion 110s by the via 111s. The source electrode of the transistor 103 is the region 104s shown in FIG. 1. In the example, the wiring layer 110 includes the power supply line 3, and the wiring portion 110s is connected to the power supply line 3.

In the example, the ground line 4 is located in a higher layer than the wiring layer 110. Although not illustrated in FIG. 1, an inter-layer insulating film also is provided on the wiring layer 110. The ground line 4 is located on the inter-layer insulating film of the uppermost layer and is insulated from the power supply line 3.

Thus, the light-emitting element 150 can be electrically connected to the wiring layer 110 located in a higher layer than the light-emitting element 150 by using the via 161k. Also, the light-emitting element 150 can be electrically connected to the wiring layer 110 located in a higher layer than the light-emitting element 150 by providing the opening 158 that exposes the light-emitting surface 153S.

A method for manufacturing the image display device 1 of the embodiment will now be described.

Figure 5A:
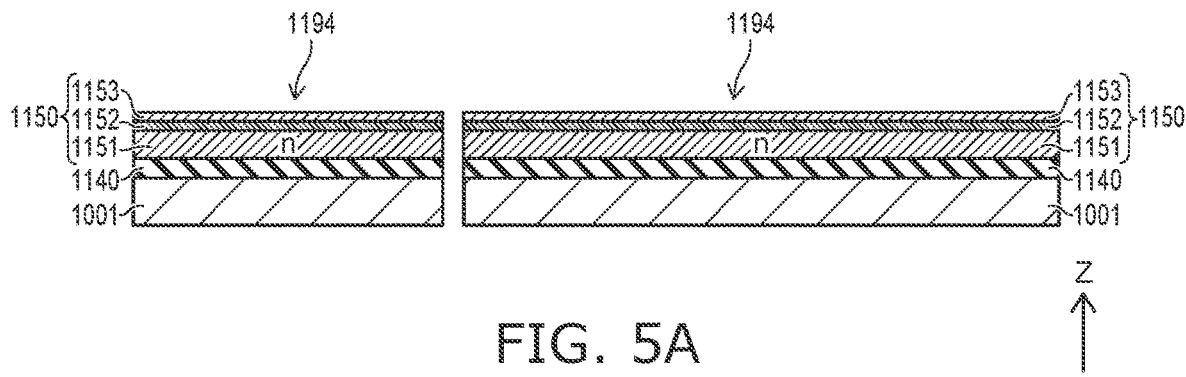
FIG. 5A is a schematic cross-sectional view illustrating a method for manufacturing the image display device of the first embodiment.
Figure 5B:
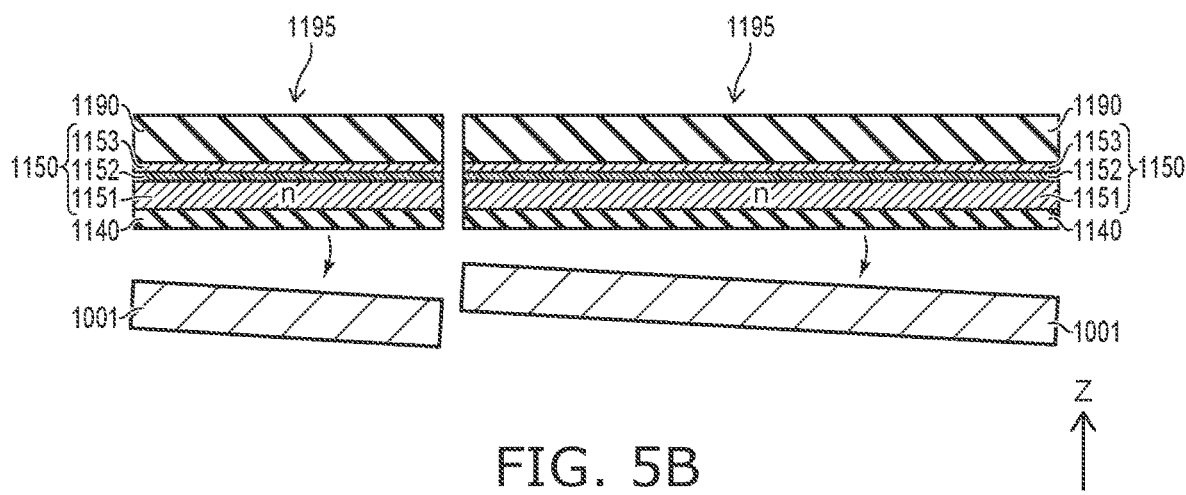
FIG. 5B is a schematic cross-sectional view illustrating the method for manufacturing the image display device of the first embodiment.
Figure 5C:
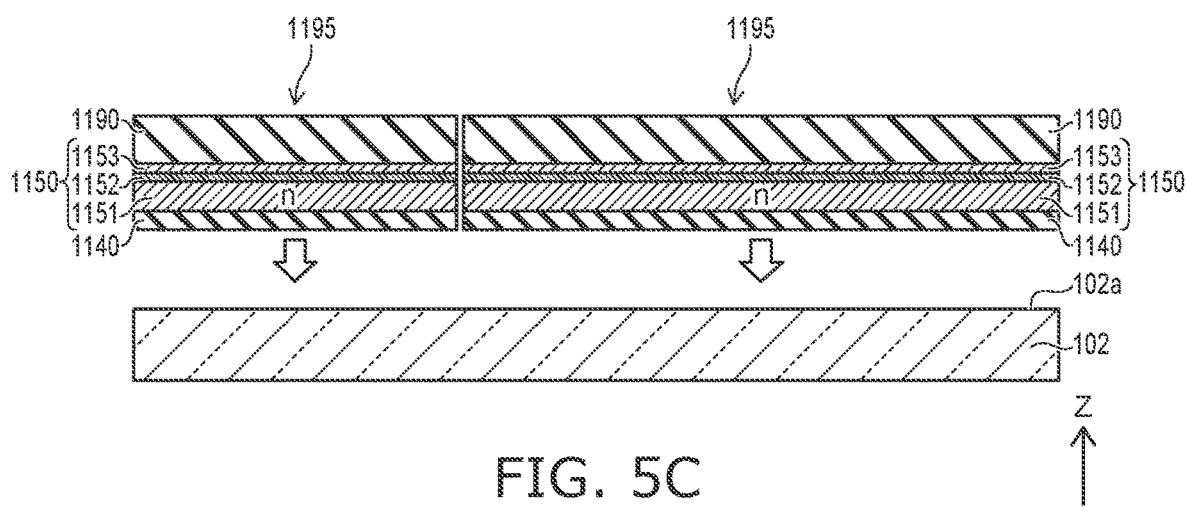
FIG. 5C is a schematic cross-sectional view illustrating the method for manufacturing the image display device of the first embodiment.

FIGS. 5A to 5C are schematic cross-sectional views illustrating the method for manufacturing the image display device of the embodiment.

According to the method for manufacturing the image display device 1 of the embodiment as shown in FIG. 5A, multiple semiconductor growth substrates 1194 are prepared. The multiple semiconductor growth substrates 1194 each include a crystal growth substrate 1001, a buffer layer 1140, and a semiconductor layer 1150. The crystal growth substrate (a first substrate) 1001 is, for example, a Si substrate, a sapphire substrate, etc. Favorably, a Si substrate is used as the crystal growth substrate 1001. Also, as described below, a more inexpensive glass substrate or the like also can be used when a low-temperature crystal growth process such as low-temperature sputtering or the like is used.

The buffer layer 1140 is formed at one surface of the crystal growth substrate 1001. The buffer layer 1140 favorably includes a nitride such as AlN, etc. Mismatch at the interface between the crystal growth substrate 1001 and the GaN crystal can be relaxed by performing the crystal growth of the semiconductor layer 1150 via the buffer layer 1140.

The semiconductor layer 1150 is formed on the buffer layer 1140. The semiconductor layer 1150 includes an n-type semiconductor layer 1151, a light-emitting layer 1152, and a p-type semiconductor layer 1153. The n-type semiconductor layer 1151, the light-emitting layer 1152, and the p-type semiconductor layer 1153 are stacked in this order from the buffer layer 1140 side. For example, vapor deposition (Chemical Vapor Deposition, CVD) is used to form the semiconductor layer 1150, and it is favorable to use metal-organic chemical vapor deposition (Metal Organic Chemical Vapor Deposition, MOCVD). Alternatively, epitaxial crystal growth of the semiconductor layer 1150 by low-temperature sputtering is possible even at a process temperature of not more than 700° C., which enables a manufacturing cost reduction by using machines and/or glass substrates that have low heat resistance. The semiconductor layer 1150 includes, for example, GaN, and more specifically, $In_XAl_YGa_{1-X-Y}N$ ($0 \leq X$, $0 \leq Y$, and $X+Y<1$), etc.

There are cases where crystal defects caused by crystal lattice constant mismatch occur in the initial stage of the crystal growth, and the crystal in which the crystal defects occur is of the n-type. Therefore, an advantage is provided in that the yield is easily increased because the production process margin can be increased when the semiconductor layer 1150 is formed on the crystal growth substrate 1001 from the n-type semiconductor layer 1151 as in the example.

As shown in FIG. 5B, after the semiconductor layer 1150 is formed on the buffer layer 1140, a support substrate 1190 is bonded to the exposed surface of the p-type semiconductor layer 1153. For example, the support substrate 1190 is formed of quartz glass, Si, etc. After the support substrate 1190 is bonded to the semiconductor layer 1150, a substrate 1195 is formed by removing the crystal growth substrate 1001. For example, wet etching and/or laser lift-off is used to remove the crystal growth substrate 1001.

The processes up to the formation of the semiconductor growth substrate 1194 and the process of performing the processing after the substrate 1195 is formed may be performed in the same plant or may be performed in different plants. For example, the substrate 1195 may be manufactured in a first plant, and the subsequent processes may be performed by transferring the substrate 1195 to a second plant that is different from the first plant.

As shown in FIG. 5C, the multiple substrates 1195 are bonded to one substrate 102 (a third substrate). The semiconductor layers 1150 of the multiple substrates 1195 each are bonded via the buffer layers 1140 to the first surface 102a of one substrate 102.

The surfaces of the substrates are bonded to each other in the substrate bonding process. In this process, for example, the substrates are bonded to each other by heating the substrates and by performing thermal compression bonding. A low melting-point metal and/or a low melting-point alloy may be used when performing thermal compression bonding. The low melting-point metal can be, for example, Sn, In, etc., and the low melting-point alloy can be, for example, an alloy having Zn, In, Ga, Sn, Bi, etc., as a major component.

Other than the method described above, in the substrate bonding process, the bonding surfaces of the substrates may be closely adhered by planarizing with chemical mechanical polishing (Chemical Mechanical Polishing, CMP), etc., and then by cleaning the bonding surfaces in a vacuum by plasma processing.

The substrate 102 is, for example, a substantially rectangular glass substrate that is about 1500 mm×1800 mm. The substrate 1195 has a rectangular shape or a square shape that is about several tens of mm square to 150 mm square, and when converted to wafer dimensions, has, for example, a size of about 4 inches to 6 inches. The size of the substrate 102 is appropriately selected according to the size of the image display device, etc. When the size of the substrate 102 is, for example, a rectangular shape or a square shape that is about several tens of mm square to 150 mm square, one semiconductor layer 1150 may be bonded to one substrate 102 as in the second embodiment described below.

FIG. 6 is a perspective view illustrating the method for manufacturing the image display device of the embodiment.

The diagram above the arrow of FIG. 6 shows the multiple substrates 1195 arranged in a lattice shape. The diagram below the arrow of FIG. 6 shows the disposition of the substrate 102. The arrow of FIG. 6 shows that the multiple substrates 1195 arranged in the lattice shape are bonded at the positions of the double dot-dash lines as described below.

It should be noted that the light-emitting element 150 is not formed at the edge portion or the vicinity of the edge portion of the semiconductor layer 1150 because the crystal quality degrades at the edge portion and the vicinity of the edge portion of the semiconductor layer 1150.

As shown in FIG. 6, the edge portion of the semiconductor layer 1150 is formed to be substantially aligned with the edge portion of the support substrate 1190. Therefore, for example, the multiple substrates 1195 are positioned to face the substrate 102 in a lattice shape as shown by the solid lines of FIG. 6 to reduce the gap between the adjacent substrates 1195 as much as possible. The semiconductor layers 1150 are bonded on the substrate 102 via the buffer layers 1140 as shown by the double dot-dash lines of FIG. 6.

When multiple semiconductor layers 1150 are bonded to one substrate 102, the substrate 102 to which the multiple semiconductor layers 1150 are bonded can be subdivided before or after embedding the color filter to make image display devices of the quantity and size corresponding to the number of subdivisions. Because it is favorable for the edge portion of the semiconductor layer 1150 at which the crystal quality degrades to be the edge portion of the display region, it is favorable for the subdivision unit to be set to match the shape of the substrate 1195. The embedding process of the color filter is described below with reference to FIG. 12 and FIGS. 13A to 13D.

FIGS. 7A to 8B are schematic cross-sectional views illustrating the method for manufacturing the image display device of the embodiment.

FIGS. 7A to 8B show two types of modifications related to the substrate bonding process. In the substrate bonding process, the processes of FIGS. 7A to 7C can be used instead of the processes of FIGS. 5A to 5C. Also, the processes of FIGS. 8A and 8B may be used instead of the processes of FIGS. 5A to 5C.

Figure 7A:
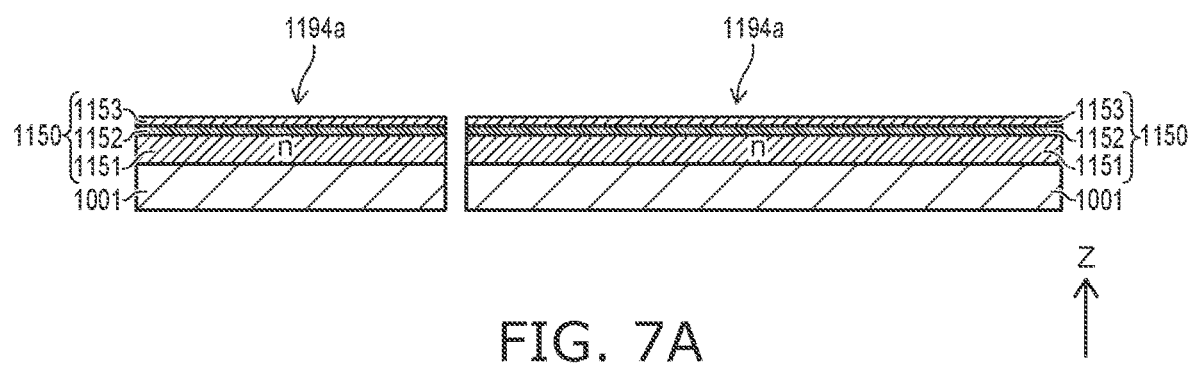
FIG. 7A is a schematic cross-sectional view illustrating the method for manufacturing the image display device of the first embodiment.
Figure 7B:
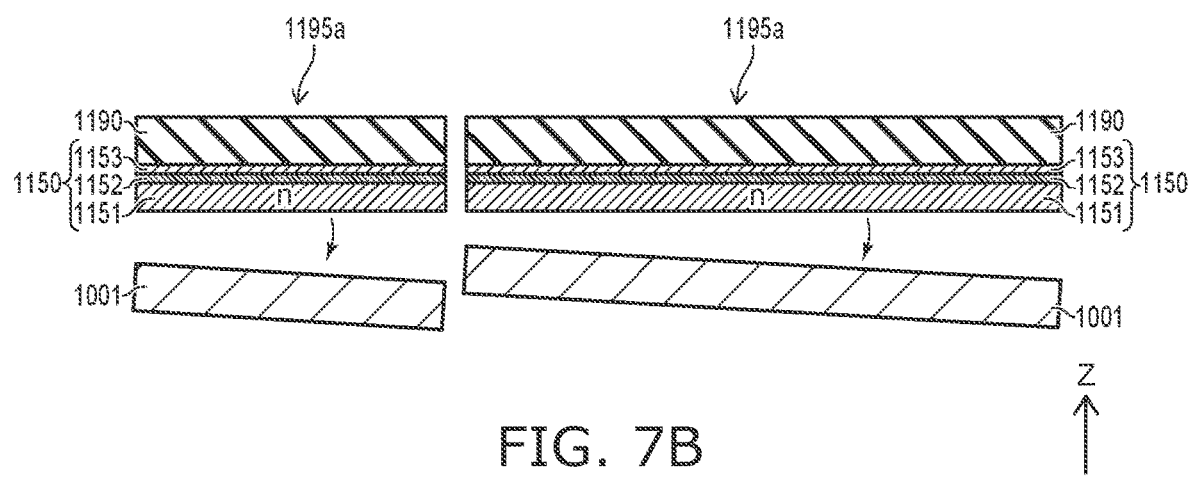
FIG. 7B is a schematic cross-sectional view illustrating the method for manufacturing the image display device of the first embodiment.
Figure 7C:
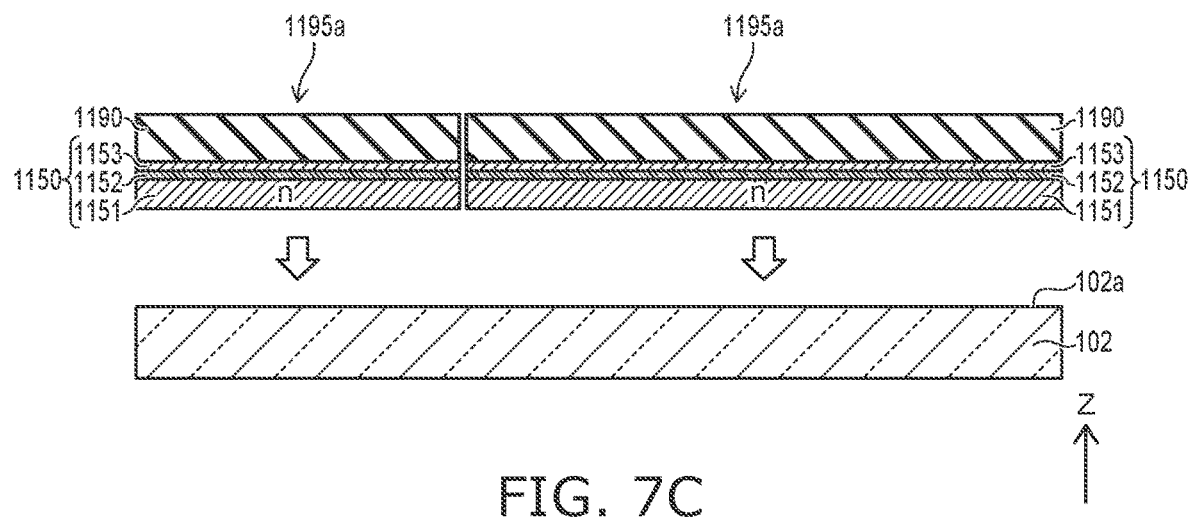
FIG. 7C is a schematic cross-sectional view illustrating the method for manufacturing the image display device of the first embodiment.

In the manufacturing processes shown in FIGS. 7A to 7C, the semiconductor layer 1150 is formed on one surface of the crystal growth substrate 1001 without interposing the buffer layer 1140 shown in FIG. 5A.

As shown in FIG. 7A, multiple semiconductor growth substrates 1194a are prepared instead of the multiple semiconductor growth substrates 1194 shown in FIG. 5A. The multiple semiconductor growth substrates 1194a each include the crystal growth substrate 1001 and the semiconductor layer 1150. The semiconductor layer 1150 is formed directly on the one surface of the crystal growth substrate 1001. Similarly to FIG. 5A, CVD, MOCVD, or the like is used to form the semiconductor layer 1150.

As shown in FIG. 7B, the support substrate 1190 is bonded to the exposed surface of the p-type semiconductor layer 1153. After the support substrate 1190 is bonded to the semiconductor layer 1150, a substrate 1195*a* is formed by removing the crystal growth substrate 1001 by using wet etching, laser lift-off, etc.

As shown in FIG. 7C, the exposed surface of the n-type semiconductor layer 1151 is positioned to face the first surface 102*a* of the substrate 102. Subsequently, the exposed surface of the n-type semiconductor layer 1151 is bonded to the first surface 102*a*.

Figure 8A:
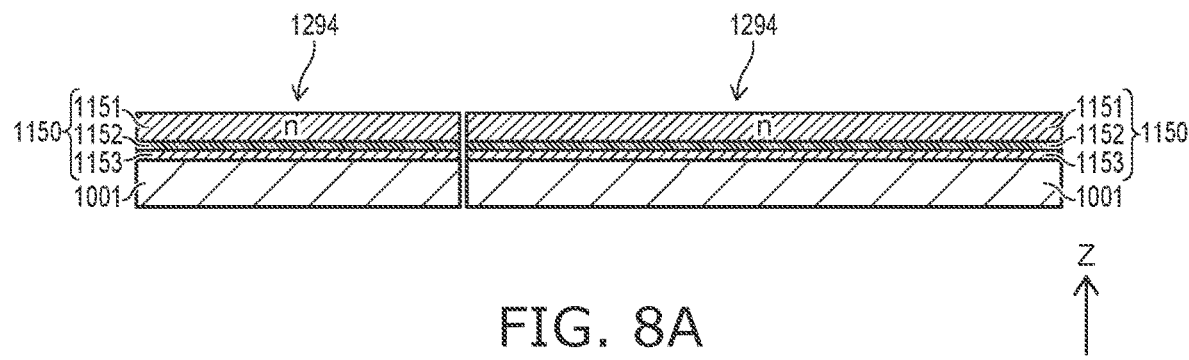
FIG. 8A is a schematic cross-sectional view illustrating the method for manufacturing the image display device of the first embodiment.
Figure 8B:
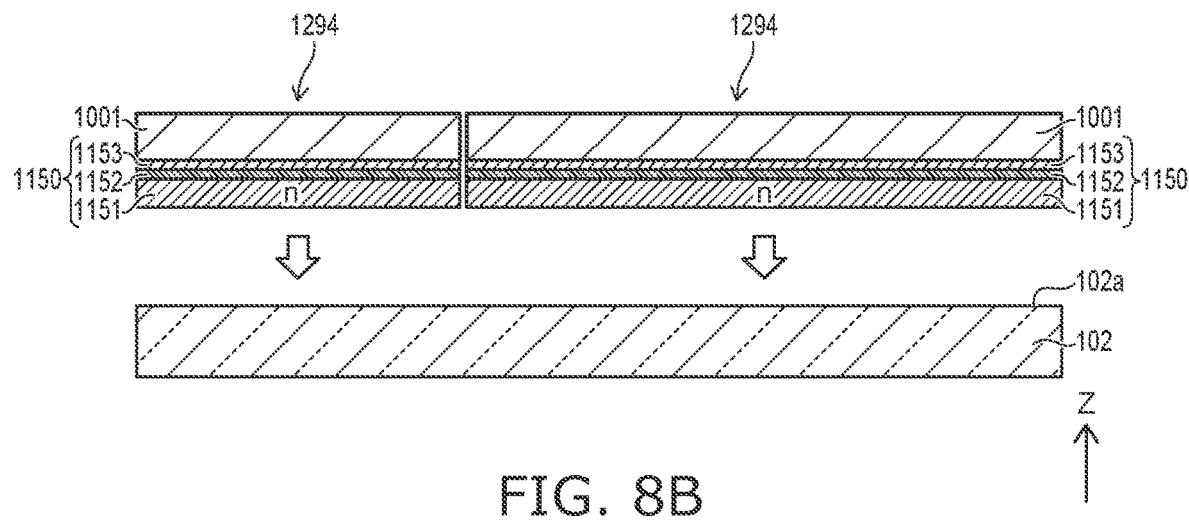
FIG. 8B is a schematic cross-sectional view illustrating the method for manufacturing the image display device of the first embodiment.

In FIGS. 8A and 8B, a semiconductor growth substrate 1294 is bonded to the substrate 102 without being transferred to a support substrate. In the semiconductor growth substrate 1294, the stacking order of the semiconductor layers formed on the crystal growth substrate 1001 is different from those of FIGS. 5A and 7A.

As shown in FIG. 8A, the multiple semiconductor growth substrates 1294 each include the crystal growth substrate 1001 and the semiconductor layer 1150. The semiconductor layer 1150 is directly grown on one surface of the crystal growth substrate 1001. The semiconductor layer 1150 includes the p-type semiconductor layer 1153, the light-emitting layer 1152, and the n-type semiconductor layer 1151. The p-type semiconductor layer 1153, the light-emitting layer 1152, and the n-type semiconductor layer 1151 are stacked in this order from the crystal growth substrate 1001 side.

As shown in FIG. 8B, the semiconductor growth substrate 1294 is vertically inverted, and the exposed surface of the n-type semiconductor layer 1151 is positioned to face the first surface 102*a* of the substrate 102. The exposed surface of the n-type semiconductor layer 1151 positioned to face the first surface 102*a* is bonded to the first surface 102*a* of the substrate 102.

Instead of the semiconductor growth substrate 1294, a buffer layer may be formed on the crystal growth substrate 1001, and the p-type semiconductor layer 1153, the light-emitting layer 1152, and the n-type semiconductor layer 1151 may be formed on the buffer layer in this order from the buffer layer side. In such a case, it is necessary to add a process of removing the remaining buffer layer either before or after the process of forming the light-emitting element by patterning the semiconductor layer 1150.

The method for bonding the semiconductor layer 1150 to the substrate 102 is not limited to the methods described above, and the following methods also can be used. Namely, the semiconductor layer 1150 is formed on the crystal growth substrate 1001, then is stored in a container in a state in which the crystal growth substrate 1001 is removed, has the support substrate 1190 mounted inside, for example, a container, and is stored. After storing, the semiconductor layer 1150 is removed from the container and bonded to the substrate 102. Also, the semiconductor layer 1150 may be stored in a container without having the support substrate 1190 mounted. After storing, the semiconductor layer 1150 is removed from the container and bonded to the substrate 102 as-is.

The description continues now by returning to the manufacturing process after the substrate bonding process.

FIGS. 9A to 10B are schematic cross-sectional views illustrating the method for manufacturing the image display device of the embodiment.

Figure 9A:
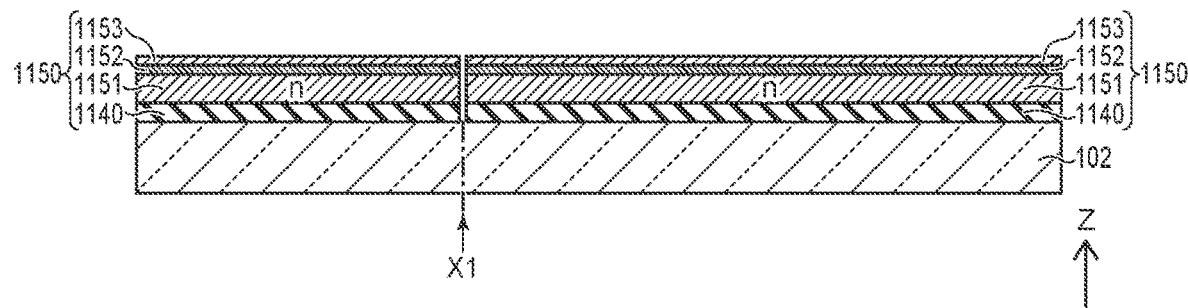
FIG. 9A is a schematic cross-sectional view illustrating the method for manufacturing the image display device of the first embodiment.

As shown in FIG. 9A, the support substrate 1190 shown in FIG. 5C is removed by wet etching, laser lift-off, etc.

As described in reference to FIG. 6, the multiple substrates 1195 are arranged adjacent to each other and bonded to the substrate 102. A position X1 is the position at which the edge portions of mutually-adjacent substrates 1195 are arranged. The edge portions of the semiconductor layers 1150 also are proximate and adjacent to each other at the position X1.

Figure 9B:
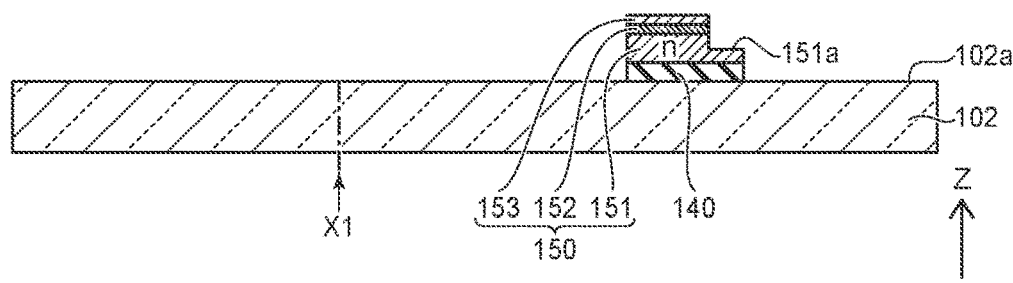
FIG. 9B is a schematic cross-sectional view illustrating the method for manufacturing the image display device of the first embodiment.

As shown in FIG. 9B, the light-emitting element 150 is formed by patterning the semiconductor layer 1150 shown in FIG. 9A into the desired shape by etching. The light-emitting element 150 is formed at a position sufficiently distant to the region including the position X1. The region that includes the position X1 is determined based on the evaluation result of evaluating the crystal quality at the edge portion vicinity of the semiconductor layer 1150.

The connection part 151*a* is formed in the light-emitting element 150; subsequently, other parts are formed by further etching. The light-emitting element 150 that includes the connection part 151*a* protruding on the first surface 102*a* from the n-type semiconductor layer 151 in the positive direction of the X-axis can be formed thereby. For example, a dry etching process is used, and favorably, anisotropic plasma etching (Reactive Ion Etching, RIE) is used to form the light-emitting element 150. The buffer layer 1140 shown in FIG. 9A is etched together with the semiconductor layer 1150 and remains as the buffer layer 140 between the first surface 102*a* and the n-type semiconductor layer 151.

Figure 9C:
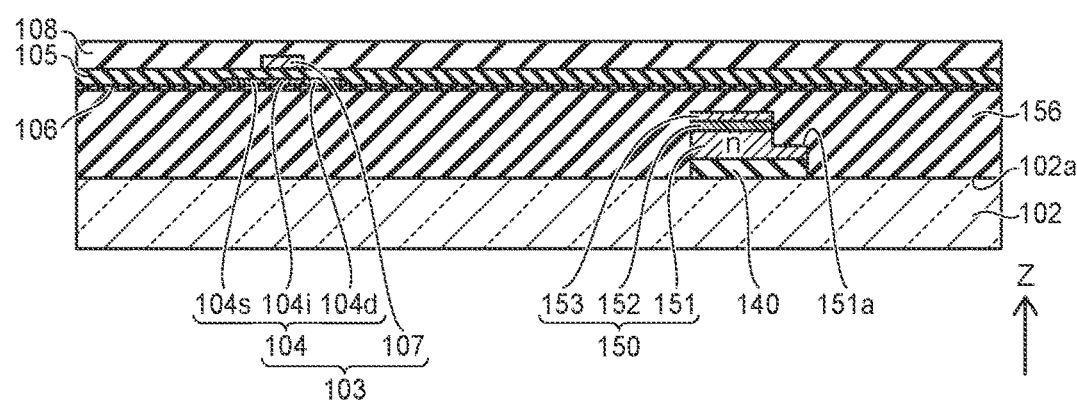
FIG. 9C is a schematic cross-sectional view illustrating the method for manufacturing the image display device of the first embodiment.

As shown in FIG. 9C, the first inter-layer insulating film 156 (a first insulating film) that covers the first surface 102*a*, the buffer layer 140, and the light-emitting element 150 is formed. The TFT underlying film 106 is formed by, for example, CVD, etc., on the first inter-layer insulating film 156.

The TFT channel 104 is formed at a prescribed position on the TFT underlying film 106. For example, the transistor 103 is formed as follows in a LTPS process. First, an amorphous Si film is formed in the shape of the TFT channel 104. For example, CVD or the like is used to form the amorphous Si. The amorphous Si film that is formed is polycrystallized by laser annealing, and the TFT channel 104 is formed.

Subsequently, the source electrode and the drain electrode of the TFT channel 104 are formed by, for example, introducing impurity ions of $B^+$ or the like into the regions 104*s* and 104*d* by using ion implantation technology, etc. The formation process of the source electrode and the drain electrode may be performed after the formation process of the gate 107.

The insulating layer 105 is formed over the TFT underlying film 106 and the TFT channel 104. For example, the insulating layer 105 is formed by CVD, etc. The gate 107 is formed at a position on the TFT channel 104 with the insulating layer 105 interposed. An appropriate formation method according to the material of the gate 107 is used to form the gate 107. For example, in the case of polycrystal Si, the gate 107 is formed similarly to the TFT channel 104 by polycrystallizing by laser annealing of amorphous Si.

The second inter-layer insulating film 108 (a second insulating film) is provided to cover the insulating layer 105 and the gate 107. An appropriate formation method according to the material of the second inter-layer insulating film 108 is applied to form the second inter-layer insulating film 108. For example, technology such as ALD, CVD, or the like is used when the second inter-layer insulating film 108 is formed of $SiO_2$.

It is sufficient for the second inter-layer insulating film 108 to have enough flatness to form the wiring layer 110, and a planarizing process may not always be performed. The number of processes can be reduced when a planarizing process is not performed on the second inter-layer insulating film 108. For example, when there is a location at the periphery of the light-emitting element 150 at which the thickness of the second inter-layer insulating film 108 is thin, a sufficient opening diameter of a via hole 162k can be ensured because the depth of the via hole 162k becomes shallow. It is therefore easier to ensure the electrical connection by the via, and the reduction of the yield due to defects of the electrical characteristics can be suppressed.

Figure 10A:
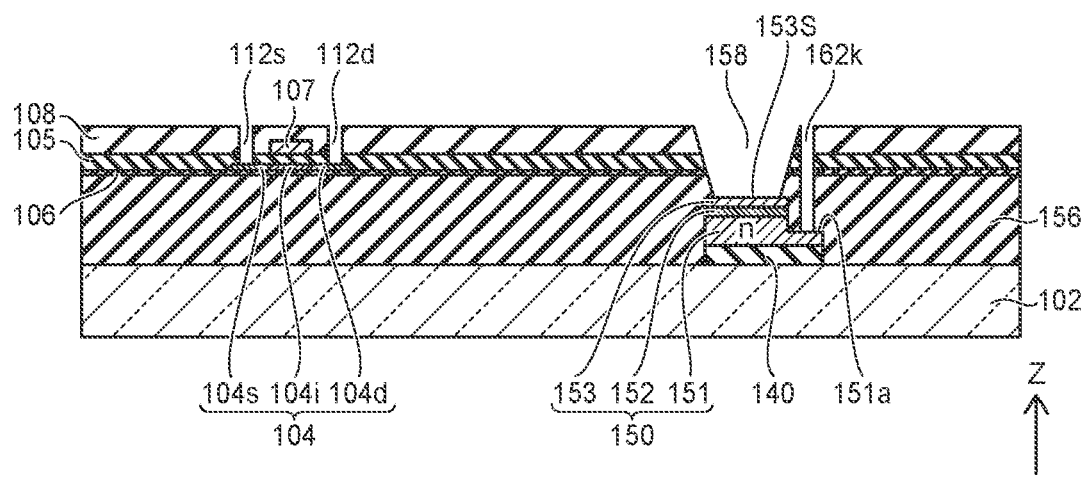
FIG. 10A is a schematic cross-sectional view illustrating the method for manufacturing the image display device of the first embodiment.

As shown in FIG. 10A, the via hole 162k extends through the second inter-layer insulating film 108, the insulating layer 105, the TFT underlying film 106, and the first inter-layer insulating film 156 and is formed to reach the surface of the connection part 151a. The opening 158 is formed to reach the light-emitting surface 153S by removing a portion of the second inter-layer insulating film 108, a portion of the insulating layer 105, a portion of the TFT underlying film 106, and a portion of the first inter-layer insulating film 156. The portion of the second inter-layer insulating film 108, the portion of the insulating layer 105, the portion of the TFT underlying film 106, and the portion of the first inter-layer insulating film 156 are locations of the insulating layers and the insulating films formed on the light-emitting surface 153S. A via hole 112d extends through the second inter-layer insulating film 108 and the insulating layer 105 and is formed to reach the surface of the region 104d. A via hole 112s extends through the second inter-layer insulating film 108 and the insulating layer 105 and is formed to expose the surface of the region 104s. For example, RIE or the like is used to form the via holes and openings.

Figure 10B:
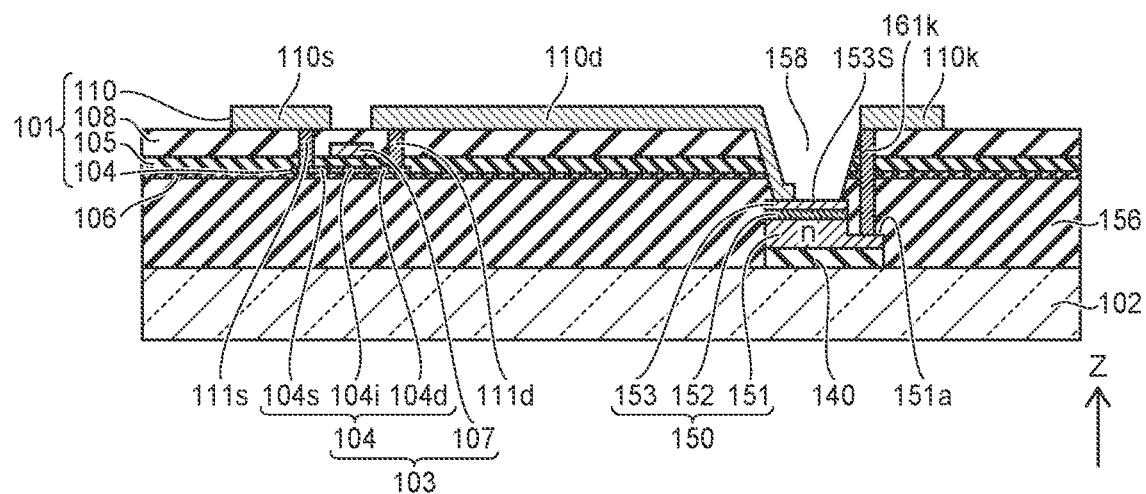
FIG. 10B is a schematic cross-sectional view illustrating the method for manufacturing the image display device of the first embodiment.

As shown in FIG. 10B, the via 161k is formed by filling the via hole 162k shown in FIG. 10A with a conductive material. Also, the vias 111d and 111s each are formed by filling the conductive material into the via holes 112d and 112s shown in FIG. 10A. Subsequently, the wiring layer 110 is formed on the second inter-layer insulating film 108, and the wiring portions 110k, 110d, and 110s are formed. The wiring layer 110 may be formed simultaneously with the formation of the vias 161k, 111d, and 111s.

Figure 11A:
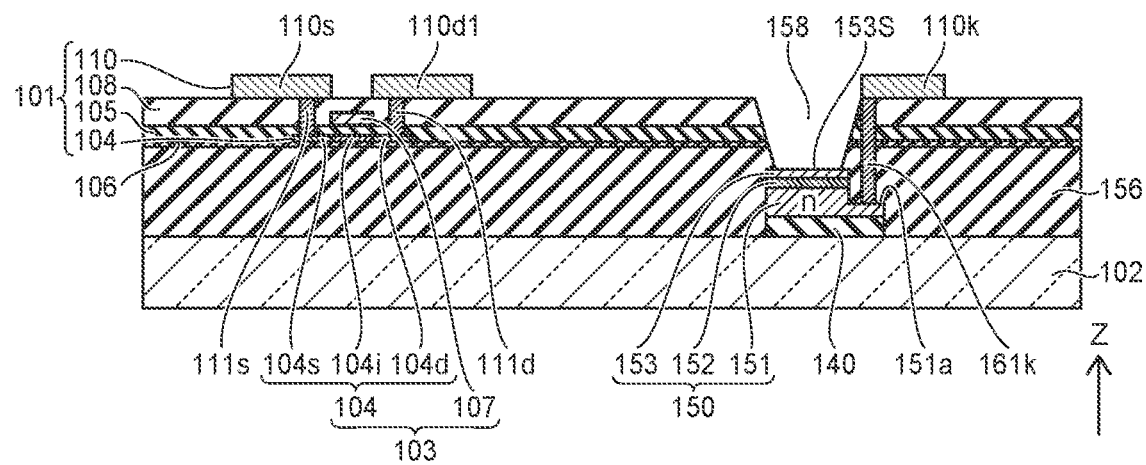
FIG. 11A is a schematic cross-sectional view illustrating a manufacturing method of a modification of the image display device of the first embodiment.
Figure 11B:
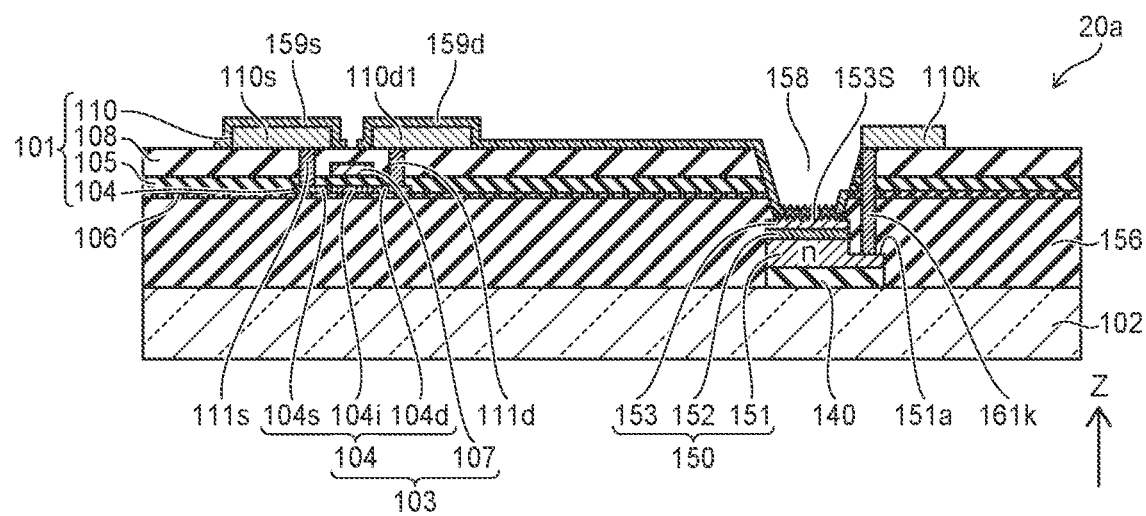
FIG. 11B is a schematic cross-sectional view illustrating the manufacturing method of the modification of the image display device of the first embodiment.

FIGS. 11A and 11B are schematic cross-sectional views illustrating a manufacturing method of a modification of the image display device of the embodiment.

FIGS. 11A and 11B show processes for forming the subpixel 20a shown in FIG. 2. The modification includes the same processes as the processes described above up to the formation of the second inter-layer insulating film 108 and the formation of the via holes 162k, 112d, and 112s. In the following description, the processes of FIGS. 11A and 11B are performed in the process of FIG. 10A and subsequent processes.

As shown in FIG. 11A, the vias 161k, 111d, and 111s are formed by filling the via holes 162k, 112d, and 112s shown in FIG. 10A with a conductive material. Subsequently, the wiring layer 110 is formed, and the wiring portions 110k, 110d1, and 110s are formed. Here, one end of the wiring portion 110d1 is connected with the via 111d. On the other hand, the other end of the wiring portion 110d1 is not directly connected to the light-emitting surface 153S and is at a position separated from the opening 158. The vias 161k, 111d, and 111s and the wiring layer 110 may be simultaneously formed as in the first embodiment.

As shown in FIG. 11B, the light-transmitting electrode 159d is formed over the wiring portion 110d1 and the light-emitting surface 153S. The light-transmitting electrode 159d also is formed between the wiring portion 110d1 and the light-emitting surface 153S and electrically connects the wiring portion 110d1 and the light-emitting surface 153S. The light-transmitting electrode 159s is formed over the wiring portion 110s. The light-transmitting electrodes 159d and 159s are simultaneously formed. When a light-transmitting electrode is formed on the wiring portion 110k, the light-transmitting electrode is formed simultaneously with the light-transmitting electrodes 159d and 159s. Here, the surface roughening on the light-emitting surface 153S can be performed at any timing after providing the opening 158 up to the formation of the light-transmitting electrode 159d.

Thus, the subpixel 20a of the modification is formed.

For example, the circuit of FIG. 3 is a drive circuit driving the light-emitting element 150 by the select transistor 24, the drive transistor 26, and the capacitor 28. Such a drive circuit is formed in the subpixels 20 and 20a. A portion of the circuit other than the drive circuit is formed, for example, in the peripheral edge part of the display region 2 shown in FIG. 1 outside the subpixels 20 and 20a. For example, the row selection circuit 5 shown in FIG. 3 is formed simultaneously with the drive transistors, the select transistors, etc., and is formed in the peripheral edge part of the display region 2. That is, the row selection circuit 5 can be simultaneously embedded by the manufacturing processes described above.

It is desirable for the signal voltage output circuit 7 to be embedded in a semiconductor device that is manufactured by manufacturing processes in which higher integration by fine patterning is possible. For example, the signal voltage output circuit 7 is mounted to another substrate together with a CPU and/or other circuit components, and is connected to the subpixels 20 and 20a via, for example, connectors and the like located in the peripheral edge part of the display region before embedding the color filter described below or after embedding the color filter.

In the image display device 1 of the embodiment, an image can be generated in the display region 2 by each light-emitting element 150 radiating light upward from the light-emitting surface 153S. However, when light is scattered lower than the light-emitting surface 153S, the luminous efficiency is substantially reduced because the substrate 102 is transmissive. Therefore, for example, by providing a light-reflecting film, a light-reflecting plate, etc., at the side of the surface of the substrate 102 opposite to the first surface 102a, the scattering of the light in the substrate 102 direction can be reflected in the direction of the light-emitting surface 153S. Such a light-reflecting film or the like may be included in the substrate 102 or may be provided inside a case, a frame, or the like that fixes the image display device 1.

Figure 12:
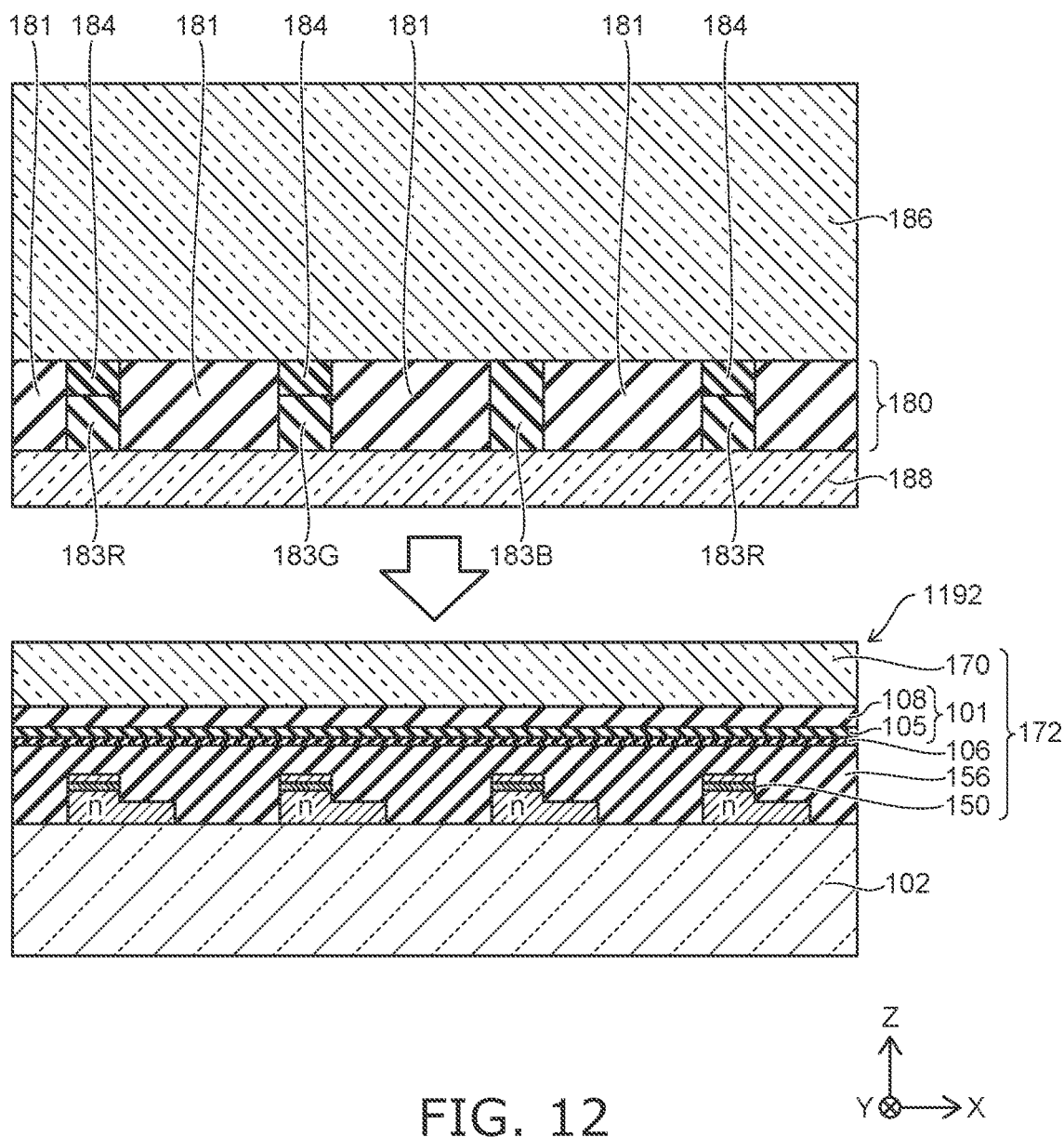
FIG. 12 is a schematic cross-sectional view illustrating the method for manufacturing the image display device of the first embodiment.

FIG. 12 is a schematic cross-sectional view illustrating the method for manufacturing the image display device of the embodiment.

In FIG. 12, the diagram above the arrow shows a configuration including the color filter 180, and the diagram below the arrow shows a structural component including the light-emitting element 150, etc., formed in the processes described above. The arrow of FIG. 12 shows the process of bonding the color filter to the structural component including the light-emitting element 150, etc.

To avoid complexity in FIG. 12, the components other than the illustrated components on the substrate 102 are not illustrated. The components that are not illustrated are the buffer layer 140, the circuit 101 including the TFT channel 104, the wiring layer 110, etc., and the via 161k shown in FIG. 1. Also, a portion of the color conversion members such as the color filter 180, etc., is displayed in FIG. 12. In the description related to FIGS. 12 to 13D, the light-emitting element 150, the first inter-layer insulating film 156, the circuit 101, the TFT underlying film 106, and the surface resin layer 170 are called a light-emitting circuit part 172, and the structural component that includes the substrate 102, the light-emitting circuit part 172, and the components that are not illustrated is called a structure body 1192. In FIG. 12, the TFT channel 104, the vias 111s and 111d, and the wiring layer 110 among the components included in the circuit 101 are not illustrated.

As shown in FIG. 12, the color filter (the wavelength conversion member) 180 is bonded to the structure body 1192 at one surface. The other surface of the color filter 180 is bonded to a glass substrate 186. The transparent thin film adhesive layer 188 is located at the one surface of the color filter 180, and bonding to the exposed surface of the surface resin layer 170 of the structure body 1192 is performed via the transparent thin film adhesive layer 188.

In the color filter 180 of the example, the color conversion parts are arranged in the positive direction of the X-axis in the order of red, green, and blue. For red, a red color conversion layer 183R is located in the first layer; for green, a green color conversion layer 183G is located in the first layer. The filter layer 184 is located in the second layer for both red and green. For blue, a single-layer color conversion layer 183B may be provided, and the filter layer 184 may be provided. Although the light-shielding part 181 is located between the color conversion parts, it goes without saying that the frequency characteristics of the filter layer 184 can be modified for each color of the color conversion parts.

The color filter 180 is adhered to the structure body 1192 so that the positions of the color conversion layers 183R, 183G, and 183B of each color match the positions of the light-emitting elements 150.

FIGS. 13A to 13D are schematic cross-sectional views showing a modification of the method for manufacturing the image display device of the embodiment.

FIGS. 13A to 13D show a method of using an inkjet method to form the color filter.

Figure 13A:
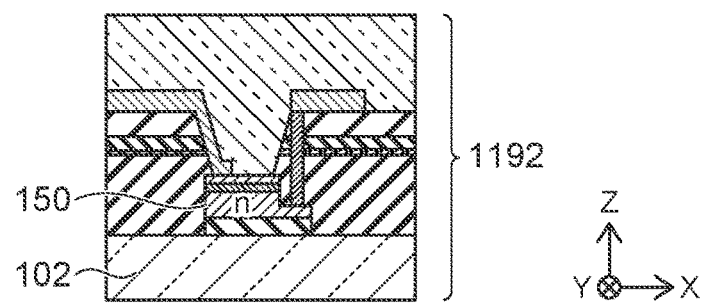
FIG. 13A is a schematic cross-sectional view illustrating the method for manufacturing the image display device of the first embodiment.

As shown in FIG. 13A, the structure body 1192 in which the components such as the light-emitting element 150, etc., are formed on the substrate 102 is prepared.

Figure 13B:
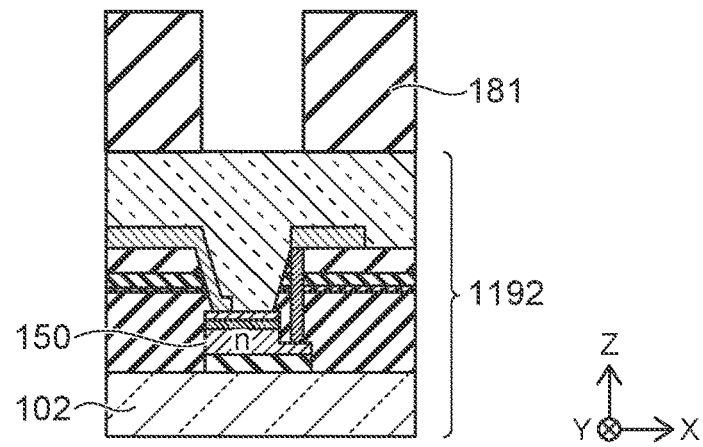
FIG. 13B is a schematic cross-sectional view illustrating the method for manufacturing the image display device of the first embodiment.

As shown in FIG. 13B, the light-shielding part 181 is formed on the structure body 1192. For example, the light-shielding part 181 is formed using screen printing, photolithography technology, etc.

Figure 13C:
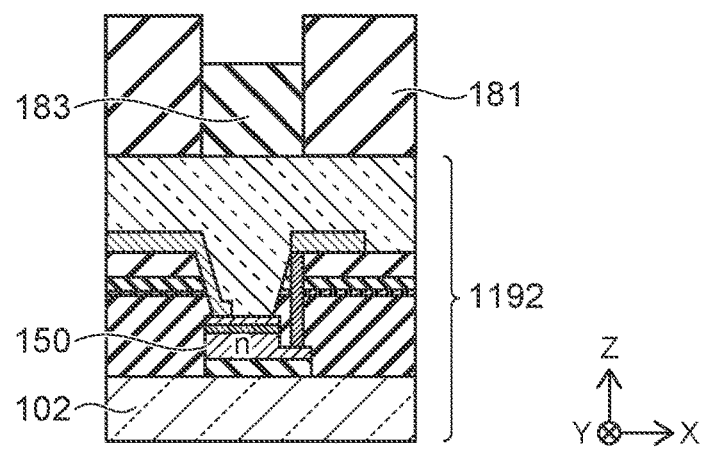
FIG. 13C is a schematic cross-sectional view illustrating the method for manufacturing the image display device of the first embodiment.

As shown in FIG. 13C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility. After printing with the inkjet nozzle, drying processing is performed using an appropriate temperature and time. The thickness of the coating when coloring is set to be less than the thickness of the light-shielding part 181.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable for the thickness of the coating of the blue fluorescer to be about equal to the thickness of the light-shielding part 181.

Figure 13D:
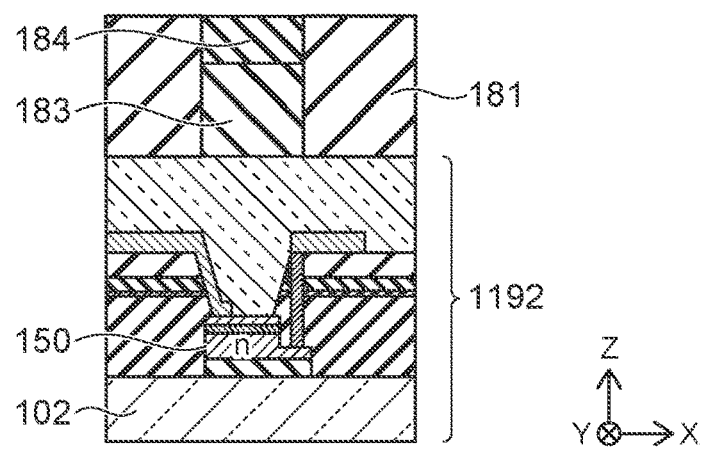
FIG. 13D is a schematic cross-sectional view illustrating the method for manufacturing the image display device of the first embodiment.

As shown in FIG. 13D, a coating for the filter layer 184 is dispensed from the inkjet nozzle. The coating is applied to overlap the coating of the fluorescer. The total thickness of the coating of the fluorescer and the coating is set to be about equal to the thickness of the light-shielding part 181.

It is desirable to make the color conversion layer 183 as thick as possible to increase color conversion efficiency for both a film-type color filter and an inkjet-type color filter. On the other hand, when the color conversion layer 183 is too thick, the emitted light of the color-converted light approximates Lambertian, but the blue light that is not color-converted has an emission angle limited by the light-shielding part 181. Therefore, a problem undesirably occurs in that the display color of the display image has viewing angle dependence. To match the light distribution of the blue light that is not color-converted and the light distribution of the light of the subpixels in which the color conversion layer 183 is provided, it is desirable to set the thickness of the color conversion layer 183 to be about half of the opening size of the light-shielding part 181.

For example, in the case of a high-definition image display device of about 250 ppi, the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

FIG. 14 is a schematic perspective view illustrating the image display device according to the embodiment.

In the image display device of the embodiment as shown in FIG. 14, the light-emitting circuit part 172 that includes many subpixels 20 is located on the substrate 102. The color filter 180 is located on the light-emitting circuit part 172. The other embodiments and their modifications described below also have configurations similar to that shown in FIG. 14.

Effects of the image display device 1 of the embodiment will now be described.

According to the method for manufacturing the image display device 1 of the embodiment, the light-emitting element 150 is formed by etching the semiconductor layer 1150 after bonding the semiconductor layer 1150 to the substrate 102. Subsequently, the light-emitting element 150 is covered with the first inter-layer insulating film 156, and the circuit 101 that includes circuit elements such as the transistor 103 driving the light-emitting element 150, etc., is made on the first inter-layer insulating film 156. Therefore, the manufacturing processes are markedly reduced compared to when singulated light-emitting elements are individually transferred to the substrate 102.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the method for manufacturing the image display device of the embodiment obtains the following effects.

As described above, according to the method for manufacturing the image display device 1 of the embodiment, the transfer process is completed in one process because the light-emitting elements are formed by etching after bonding the entire semiconductor layer 1150 to the substrate 102. Therefore, according to the method for manufacturing the image display device 1 of the embodiment, the time of the transfer process of a conventional manufacturing method can be reduced, and the number of processes can be reduced.

Furthermore, the semiconductor layer 1150 is bonded to the substrate 102 at the wafer level without pre-singulation or forming electrodes at positions corresponding to the circuit elements. Therefore, alignment is unnecessary at the bonding stage. Accordingly, the bonding process can be easily performed in a short period of time. Because alignment is unnecessary when bonding, it is also easy to downsize the light-emitting element 150, which is favorable for a higher definition display.

According to the embodiment, for example, a glass substrate formed as described above can be covered with an inter-layer insulating film, and drive circuits, scanning circuits, etc., that include TFTs, etc., can be formed on the planarized surface by using a LTPS process, etc. Therefore, an advantage is provided in that existing flat panel display manufacturing processes and plants can be utilized.

According to the embodiment, the light-emitting element 150 that is formed in a lower layer than the transistor 103, etc., can be electrically connected to power supply lines, ground lines, drive transistors, etc., formed in the upper layer by forming vias extending through the first inter-layer insulating film 156, the TFT underlying film 106, the insulating layer 105, and the second inter-layer insulating film 108. Thus, a uniform connection structure can be easily realized by using technically-established multilayer wiring technology, and the yield can be increased. Accordingly, the reduction of the yield due to connection defects of the light-emitting elements, etc., is suppressed.

Second Embodiment

Figure 15:
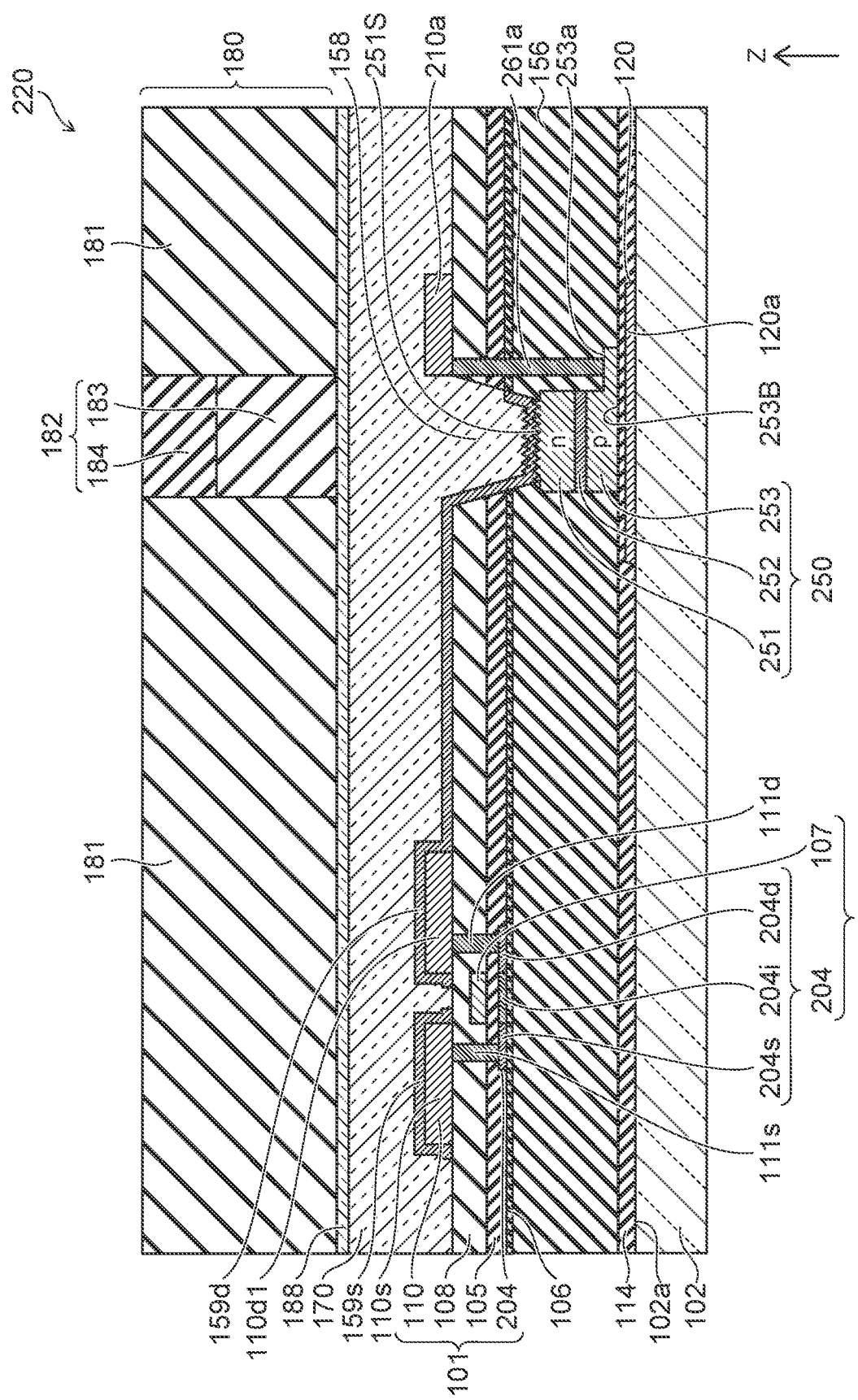
FIG. 15 is a schematic cross-sectional view illustrating a portion of an image display device according to a second embodiment.

FIG. 15 is a schematic cross-sectional view illustrating a portion of an image display device according to the embodiment.

The embodiment differs from the other embodiments described above in that a light-reflecting layer 120 that includes a light-reflecting plate 120a is located on the first surface 102a, and a light-emitting element 250 is located on the light-reflecting plate 120a with an insulating layer 114 interposed. The embodiment differs from the other embodiments described above in that an n-type semiconductor layer 251 provides a light-emitting surface 251S. The configuration of the embodiment differs from that of the other embodiments described above in that the light-emitting element 250 is driven by a transistor 203. The same components as the other embodiments are marked with the same reference numerals, and a detailed description is omitted as appropriate.

As shown in FIG. 15, a subpixel 220 of the image display device of the embodiment includes the substrate 102, the light-reflecting layer 120, the light-emitting element 250, the first inter-layer insulating film 156, the transistor 203, the second inter-layer insulating film 108, a via 261a, and the wiring layer 110.

The light-reflecting layer 120 (the light-reflective layer) is located on the first surface 102a. The light-reflecting layer 120 includes the light-reflecting plate 120a. The light-reflecting plate 120a (a first part) is a member that is film-shaped, layer-shaped, or plate-shaped and has the shape of a rectangle, any polygon, an ellipse, a circle, etc., when projected onto the XY plane.

The light-reflecting layer 120 includes multiple light-reflecting plates 120a, and the light-reflecting plates 120a are located at each location at which the light-emitting elements 250 are located. In the example, the multiple light-reflecting plates 120a are separated from each other.

It is sufficient for the outer perimeter of the light-reflecting plate 120a to be set to include the outer perimeter of the light-emitting element 250 when the light-emitting element 250 is projected onto the XY plane. The light-reflecting plate 120a may be provided for each light-emitting element 250 or may be provided for a plurality of the light-emitting elements 250. The light-reflecting plate 120a may not be divided for each light-emitting element 250 and may be, for example, formed by being connected in a lattice shape. In such a case, for example, the light-emitting elements 250 are located on the positions of the lattice at which the light-reflecting plates 120a cross. The light-reflecting layer 120 may be a single light-reflecting plate 120a. For example, the single light-reflecting plate 120a is provided over the entire surface of the display region 2 shown in FIG. 2.

The light-reflecting plate 120a includes a light-reflective material. For example, the light-reflecting plate 120a is formed of a metal material such as Ag, an alloy including Ag, etc. As long as the light-reflecting plate 120a is a light-reflective material, the light-reflecting plate 120a is not limited to Ag, etc., and can be an appropriate material.

The insulating layer 114 is provided over the first surface 102a, the light-reflecting layer 120, and the light-reflecting plate 120a. The insulating layer 114 is formed of an oxide film of $SiO_2$, etc. The insulating layer 114 is provided to insulate the light-reflecting plate 120a from the light-emitting element 250. Also, as described below, the insulating layer 114 provides a flat surface in the substrate bonding.

The light-emitting element 250 is located on the light-reflecting plate 120a with the insulating layer 114 interposed. The light-emitting element 250 is located directly above the light-reflecting plate 120a.

Thus, by providing the light-reflecting plate 120a, the light that is scattered downward from the light-emitting element 250 is reflected upward by the light-reflecting plate 120a. Accordingly, the luminous efficiency of the light-emitting element 250 is substantially improved. Favorably, when projected onto the XY plane, the outer perimeter of the light-reflecting plate 120a is set not to include the outer perimeter of the transistor 203 when the transistor 203 is projected onto a plane including the light-reflecting plate 120a. Thereby, the transistor 203 does not easily receive the reflected light from the light-reflecting plate 120a, and the probability of the occurrence of malfunctions can be sufficiently reduced. The outer perimeter of the transistor 203 when projected onto the XY plane is the outer perimeter of the TFT channel when projected onto the XY plane.

The light-emitting element 250 includes the light-emitting surface 251S. Similarly to the other embodiments described above, the light-emitting element 250 is a prismatic or cylindrical element that includes a bottom surface 253B on the first surface 102a. The light-emitting surface 251S is the surface opposite to the bottom surface 253B. In the example, the bottom surface 253B is a surface that contacts the insulating layer 114.

The light-emitting element 250 includes a p-type semiconductor layer 253, a light-emitting layer 252, and the n-type semiconductor layer 251. The p-type semiconductor layer 253, the light-emitting layer 252, and the n-type semiconductor layer 251 are stacked in this order from the bottom surface 253B toward the light-emitting surface 251S. According to the embodiment, the light-emitting surface 251S is provided by the n-type semiconductor layer 251. The thickness of the n-type semiconductor layer 251 can be increased because the n-type semiconductor layer 251 can have a lower resistance value than the p-type semiconductor layer 253. It is therefore easy to roughen the light-emitting surface 251S.

The light-emitting element 250 includes a connection part 253a. The connection part 253a is located on the insulating layer 114 and protrudes in one direction from the p-type semiconductor layer 253. The height of the connection part 253a is the same as that of the p-type semiconductor layer 253, or is lower than the p-type semiconductor layer 253, and the light-emitting element 250 is formed in a staircase shape. The connection part 253a is of the p-type and is electrically connected with the p-type semiconductor layer 253. The connection part 253a is connected to one end of the via 261a and electrically connects the p-type semiconductor layer 253 to the via 261a.

The light-emitting element 250 has a shape similar to that of the light-emitting element 150 of the other embodiments described above when projected onto the XY plane. An appropriate shape is selected according to the layout of the circuit elements, etc. The shape of the light-reflecting plate 120a when projected onto the XY plane can be any shape as described above, and an appropriate shape is selected according to the layout of the circuit elements, etc.

The light-emitting element 250 is a light-emitting diode similar to the light-emitting element 150 of the other embodiments described above. Namely, the wavelength of the light emitted by the light-emitting element 250 is, for example, blue light emission of about 467 nm±20 nm or bluish-violet light emission of about 410 nm±20 nm. The wavelength of the light emitted by the light-emitting element 250 is not limited to the values described above and can be an appropriate value. The transistor 203 is located on the TFT underlying film 106. The transistor 203 is an n-channel TFT. The transistor 203 includes the TFT channel 204 and the gate 107. Favorably, similarly to the other embodiments described above, the transistor 203 is formed by a LTPS process, etc. According to the embodiment, the circuit 101 includes the TFT channel 204, the insulating layer 105, the second inter-layer insulating film 108, the vias 111s and 111d, and the wiring layer 110.

The TFT channel 204 includes regions 204s, 204i, and 204d. The regions 204s, 204i, and 204d are located on the TFT underlying film 106. The regions 204s and 204d are doped with an n-type impurity such as phosphorus ions (P⁻), etc. The region 204s has an ohmic connection with the via 111s. The region 204d has an ohmic connection with the via 111d.

The gate 107 is located on the TFT channel 204 with the insulating layer 105 interposed. The insulating layer 105 insulates the TFT channel 204 and the gate 107.

In the transistor 203, a channel is formed in the region 204i when a higher voltage than that of the region 204s is applied to the gate 107. The current that flows between the regions 204s and 204d is controlled by the voltage of the gate 107 with respect to the region 204s. The TFT channel 204 and the gate 107 are formed using materials and formation methods similar to those of the TFT channel 104 and the gate 107 of the other embodiments described above.

The wiring layer 110 includes the wiring portions 110s, 110d1, and 210a. The wiring portions 110s and 110d1 are the same as those of the modification of the first embodiment described above in FIG. 2. A portion of the wiring portion 210a (the first wiring portion) is located above the connection part 253a. For example, another part of the wiring portion 210a extends to the power supply line 3 shown in FIG. 16 below and is connected to the power supply line 3.

The vias 111s and 111d are provided to extend through the second inter-layer insulating film 108. The via 111s is located between the wiring portion 110s and the region 204s. The via 111s electrically connects the wiring portion 110s and the region 204s. The via 111d is located between the wiring portion 110d1 and the region 204d. The via 111d electrically connects the wiring portion 110d1 and the region 204d. The vias 111s and 111d are formed using materials and formation methods similar to those of the other embodiments described above.

The via 261a is provided to extend through the second inter-layer insulating film 108, the insulating layer 105, the TFT underlying film 106, and the first inter-layer insulating film 156. The via 261a is located between the wiring portion 210a and the connection part 253a and electrically connects the wiring portion 210a and the connection part 253a.

For example, the wiring portion 110s (the second wiring portion) is electrically connected to the ground line 4 shown in FIG. 16 below. The wiring portion 110d1 is electrically connected to the n-type semiconductor layer 251 via the light-transmitting electrode 159d.

According to the embodiment, the light-transmitting electrode 159d is provided over the light-emitting surface 251S of the roughened n-type semiconductor layer 251. The light-transmitting electrode 159d is provided over the wiring portion 110d1. The light-transmitting electrode 159d also is located between the light-emitting surface 251S and the wiring portion 110d and electrically connects the n-type semiconductor layer 251 and the wiring portion 110d.

As in the other embodiments described above, the wiring portion 110d may extend to be directly connected to the n-type semiconductor layer 251 as in the example shown in FIG. 1.

Figure 16:
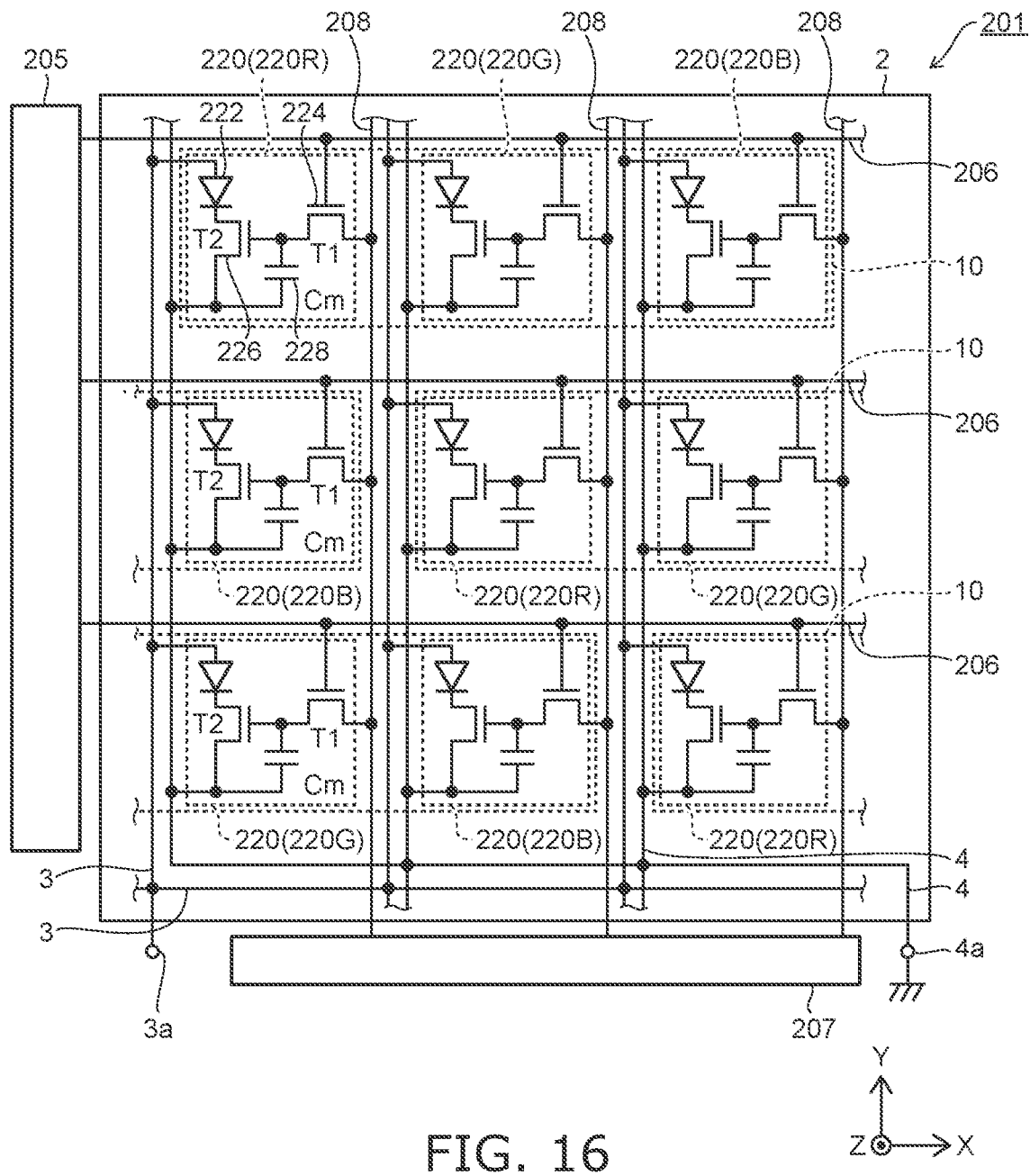
FIG. 16 is a schematic block diagram illustrating the image display device of the second embodiment.

FIG. 16 is a schematic block diagram illustrating the image display device according to the embodiment.

As shown in FIG. 16, the image display device 201 of the embodiment includes the display region 2, a row selection circuit 205, and a signal voltage output circuit 207. In the display region 2, similarly to the other embodiments described above, for example, the subpixels 220 are arranged in a lattice shape in the XY plane.

Similarly to the other embodiments described above, the pixel 10 includes multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes the three subpixels 220R, 220G, and 220B; for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 16, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the ground line 4 and the gate electrode of the drive transistor 226.

To drive the drive transistor 226 that is an n-channel transistor, the row selection circuit 205 and the signal voltage output circuit 207 supply a signal voltage that has a different polarity from that of the other embodiments described above to the signal line 208.

According to the embodiment, because the polarity of the drive transistor 226 is an n-channel, the polarity of the signal voltage and the like are different from those of the other embodiments described above. Namely, the row selection circuit 205 supplies a select signal to a scanning line 206 to sequentially select one row from the arrangement of the m rows of the subpixels 220. The signal voltage output circuit 207 supplies a signal voltage having an analog voltage value necessary for each subpixel 220 of the selected row. The drive transistors 226 of the subpixels 220 of the selected row cause currents corresponding to the signal voltages to flow in the light-emitting elements 222. The light-emitting elements 222 emit light of luminances corresponding to the currents that flow.

A method for manufacturing the image display device of the embodiment will now be described.

FIGS. 17A to 19B are schematic cross-sectional views illustrating the method for manufacturing the image display device of the embodiment.

Figure 17A:
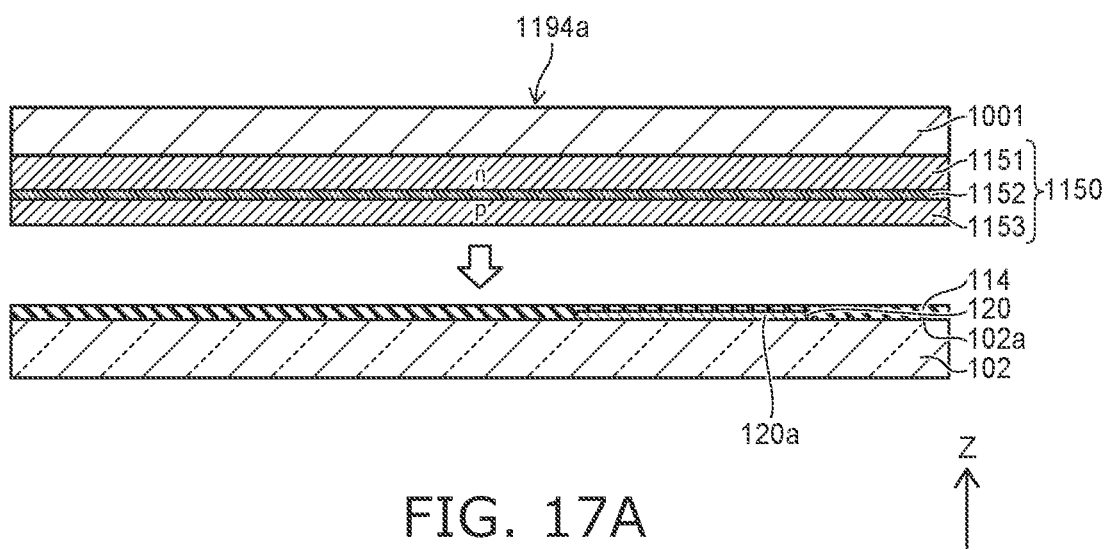
FIG. 17A is a schematic cross-sectional view illustrating a method for manufacturing the image display device of the second embodiment.

According to the method for manufacturing the image display device of the embodiment as shown in FIG. 17A, one semiconductor growth substrate (the second substrate) 1194a is prepared and bonded to one substrate 102 (the third substrate). As in the other embodiments described above, multiple semiconductor growth substrates can be prepared and bonded to one substrate 102. The other embodiments and their various modifications described above, etc., are applicable to the method for bonding the semiconductor layer 1150 to the substrate 102.

The semiconductor growth substrate 1194a includes the semiconductor layer 1150 formed on the crystal growth substrate (the first substrate) 1001. As described above, the crystal growth substrate 1001 is, for example, a Si substrate, a sapphire substrate, etc., and favorably a Si substrate. Alternatively, when a low-temperature crystallization process is used, a more inexpensive glass substrate can be used.

The semiconductor layer 1150 includes the n-type semiconductor layer 1151, the light-emitting layer 1152, and the p-type semiconductor layer 1153. The n-type semiconductor layer 1151, the light-emitting layer 1152, and the p-type semiconductor layer 1153 are stacked in the order of the n-type semiconductor layer 1151, the light-emitting layer 1152, and the p-type semiconductor layer 1153 from the crystal growth substrate 1001 side. Similarly to the other embodiments described above, the formation of the semiconductor layer 1150 can be a low-temperature process of not more than 700° C. by performing epitaxial growth by CVD, MOCVD, or low-temperature sputtering.

The light-reflecting layer 120 (the light-reflective layer) is formed on the first surface 102a before bonding the semiconductor layer 1150 to the substrate 102. The light-reflecting layer 120 may be formed by sputtering, etc., or may be formed by coating a Ag paste or the like in the shape of the light-reflecting plate 120a and then sintering. The light-reflecting plate 120a of the light-reflecting layer 120 is located at a position at which the light-emitting element 250 is formed. The insulating layer 114 is formed over the first surface 102a, the light-reflecting layer 120, and the light-reflecting plate 120a before the semiconductor layer 1150 is bonded to the substrate 102. The insulating layer 114 is formed by CVD, etc. The exposed surface of the insulating layer 114 is planarized by CMP, etc., to be used as the bonding surface with the substrate 102.

The semiconductor growth substrate 1194a is positioned so that the exposed surface of the p-type semiconductor layer 1153 faces the planarized exposed surface of the insulating layer 114 provided on the substrate 102. The exposed surface of the p-type semiconductor layer 1153 is bonded to the exposed surface of the insulating layer 114.

Figure 17B:
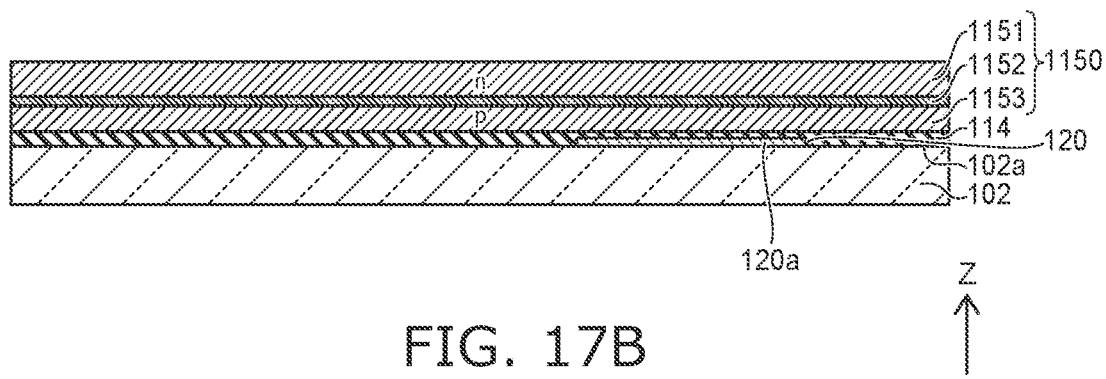
FIG. 17B is a schematic cross-sectional view illustrating the method for manufacturing the image display device of the second embodiment.

As shown in FIG. 17B, the crystal growth substrate 1001 shown in FIG. 17A is removed by wet etching, laser lift-off, etc.

Figure 17C:
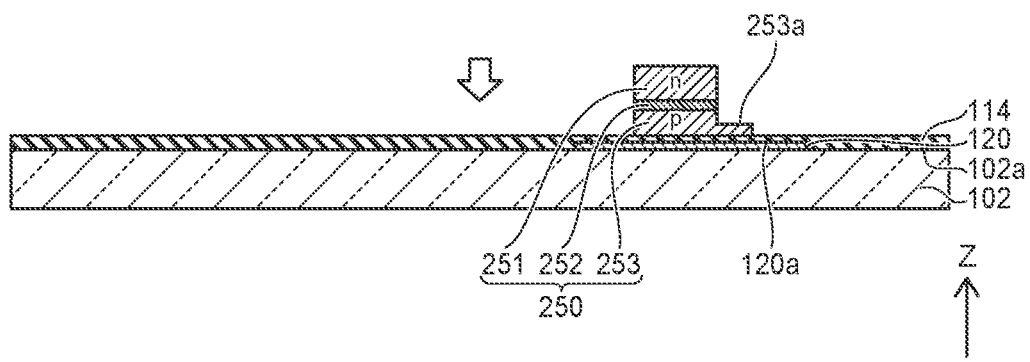
FIG. 17C is a schematic cross-sectional view illustrating the method for manufacturing the image display device of the second embodiment.

As shown in FIG. 17C, the light-emitting element 250 is formed by shaping the semiconductor layer 1150 shown in FIG. 17B into the desired shape by etching. Similarly to the first embodiment, the remaining part of the light-emitting element 250 is formed after forming the connection part 253a. For example, a dry etching process is used to form the light-emitting element 250; favorably, RIE is used.

Figure 18A:
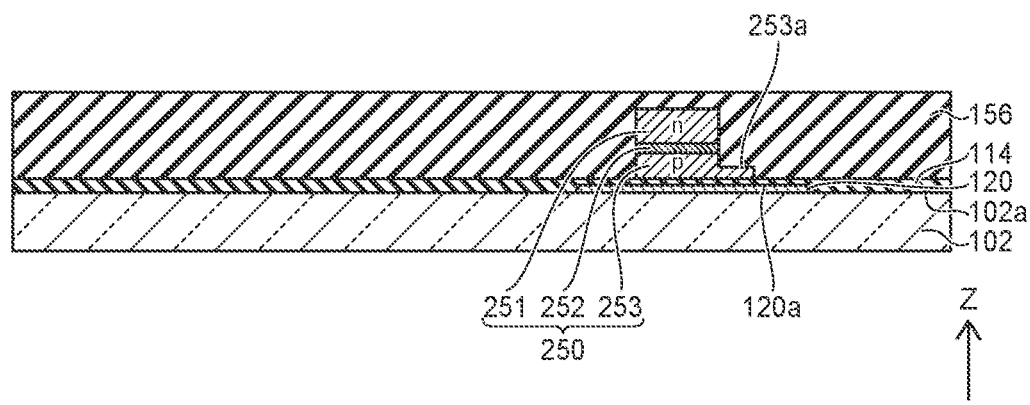
FIG. 18A is a schematic cross-sectional view illustrating the method for manufacturing the image display device of the second embodiment.

As shown in FIG. 18A, the first inter-layer insulating film 156 is formed to cover the insulating layer 114 and the light-emitting element 250.

Figure 18B:
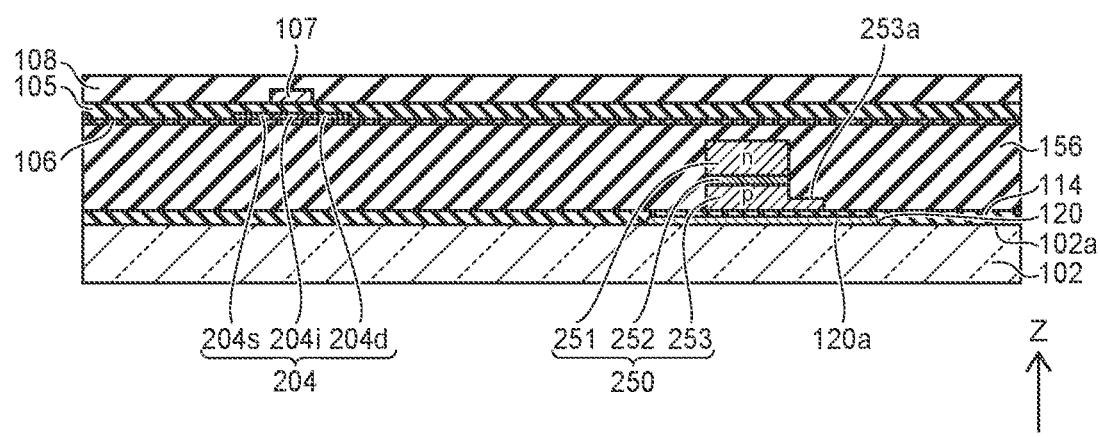
FIG. 18B is a schematic cross-sectional view illustrating the method for manufacturing the image display device of the second embodiment.

As shown in FIG. 18B, the TFT underlying film 106 is formed over the first inter-layer insulating film 156 by CVD, etc. The TFT channel 204 is formed on the planarized TFT underlying film 106. The insulating layer 105 that covers the TFT underlying film 106 and the TFT channel 204 is formed. The gate 107 is formed on the TFT channel 204 with the insulating layer 105 interposed. The second inter-layer insulating film 108 is formed to cover the insulating layer 105 and the gate 107.

Figure 19A:
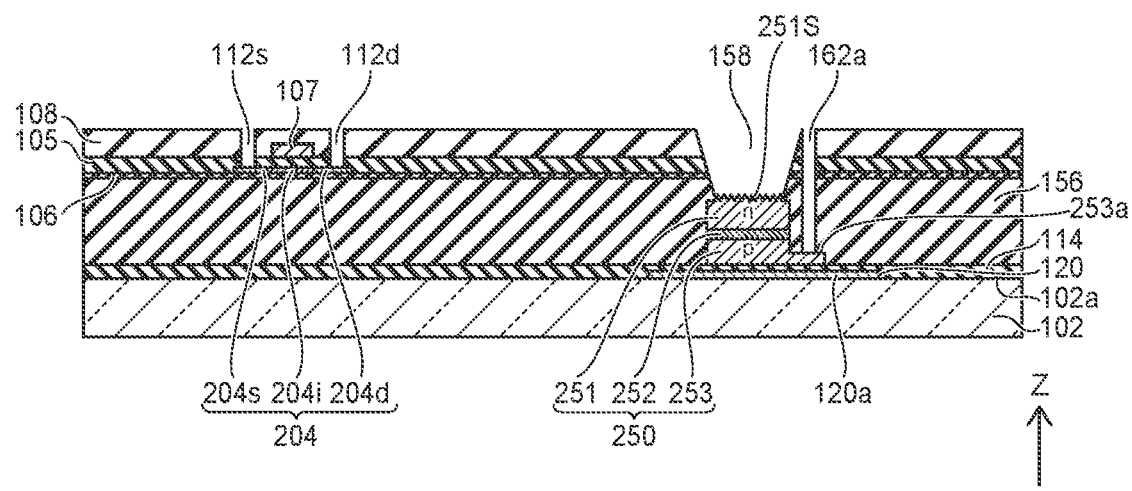
FIG. 19A is a schematic cross-sectional view illustrating the method for manufacturing the image display device of the second embodiment.

As shown in FIG. 19A, a via hole 162a extends through the second inter-layer insulating film 108, the insulating layer 105, the TFT underlying film 106, and the first inter-layer insulating film 156 and is formed to reach the surface of the connection part 253a. The opening 158 is formed to reach the light-emitting surface 251S by removing a portion of the second inter-layer insulating film 108, a portion of the insulating layer 105, a portion of the TFT underlying film 106, and a portion of the first inter-layer insulating film 156. The portion of the second inter-layer insulating film 108, the portion of the insulating layer 105, the portion of the TFT underlying film 106, and the portion of the first inter-layer insulating film 156 are locations of the insulating layers and the insulating films that are formed on the light-emitting surface 251S. The via hole 112d extends through the second inter-layer insulating film 108 and the insulating layer 105 and is formed to reach the surface of the region 204d. The via hole 112s extends through the second inter-layer insulating film 108 and the insulating layer 105 and is formed to reach the surface of the region 204s. For example, RIE or the like is used to form the via holes and openings.

Figure 19B:
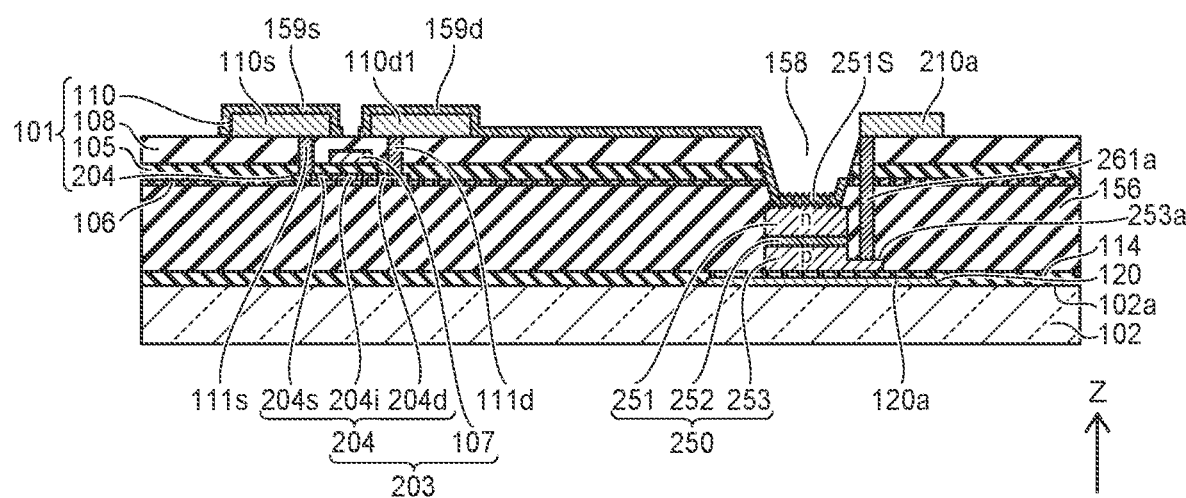
FIG. 19B is a schematic cross-sectional view illustrating the method for manufacturing the image display device of the second embodiment.

As shown in FIG. 19B, the via 261*a* is formed by filling a conductive material into the via hole 162*a* shown in FIG. 19A. The vias 111*d* and 111*s* also are formed by filling the conductive material into the via holes 112*d* and 112*s* shown in FIG. 19A. Subsequently, the wiring layer 110 is formed, and the wiring portions 210*a*, 110*d*1, and 110*s* are formed. The wiring layer 110 may be formed simultaneously with the formation of the vias 261*a*, 111*d*1, and 111*s*.

A transmissive conductive film that covers the second inter-layer insulating film 108, the light-emitting surface 251S, and the wiring layer 110 is formed. The desired light-transmitting electrodes 159*d* and 159*s* are formed by photolithography.

The light-transmitting electrode 159*d* is formed over the light-emitting surface 251S and the wiring portion 110*d*1. The light-transmitting electrode 159*d* also is formed between the light-emitting surface 251S and the wiring portion 110*d* and electrically connects the light-emitting surface 251S and the wiring portion 110*d*. The light-transmitting electrode 159*s* is formed over the wiring portion 110*s*. The light-transmitting electrodes 159*d* and 159*s* are simultaneously formed. The light-transmitting electrode may be formed on the wiring portion 210*a*.

Thereafter, the subpixel 220 of the image display device 201 of the embodiment is formed by providing the color filter 180 (the wavelength conversion member), etc.

Effects of the image display device of the embodiment will now be described.

In the image display device of the embodiment, similarly to the other embodiments described above, in addition to the effects of reducing the time of the transfer process for forming the light-emitting element 250 and reducing the number of processes, the light-emitting surface 251S can be sufficiently roughened by using the n-type semiconductor layer 251 as the light-emitting surface 251S. Therefore, the luminous efficiency can be increased, and an increase of the loss due to the contact resistance can be suppressed.

Third Embodiment

Figure 20:
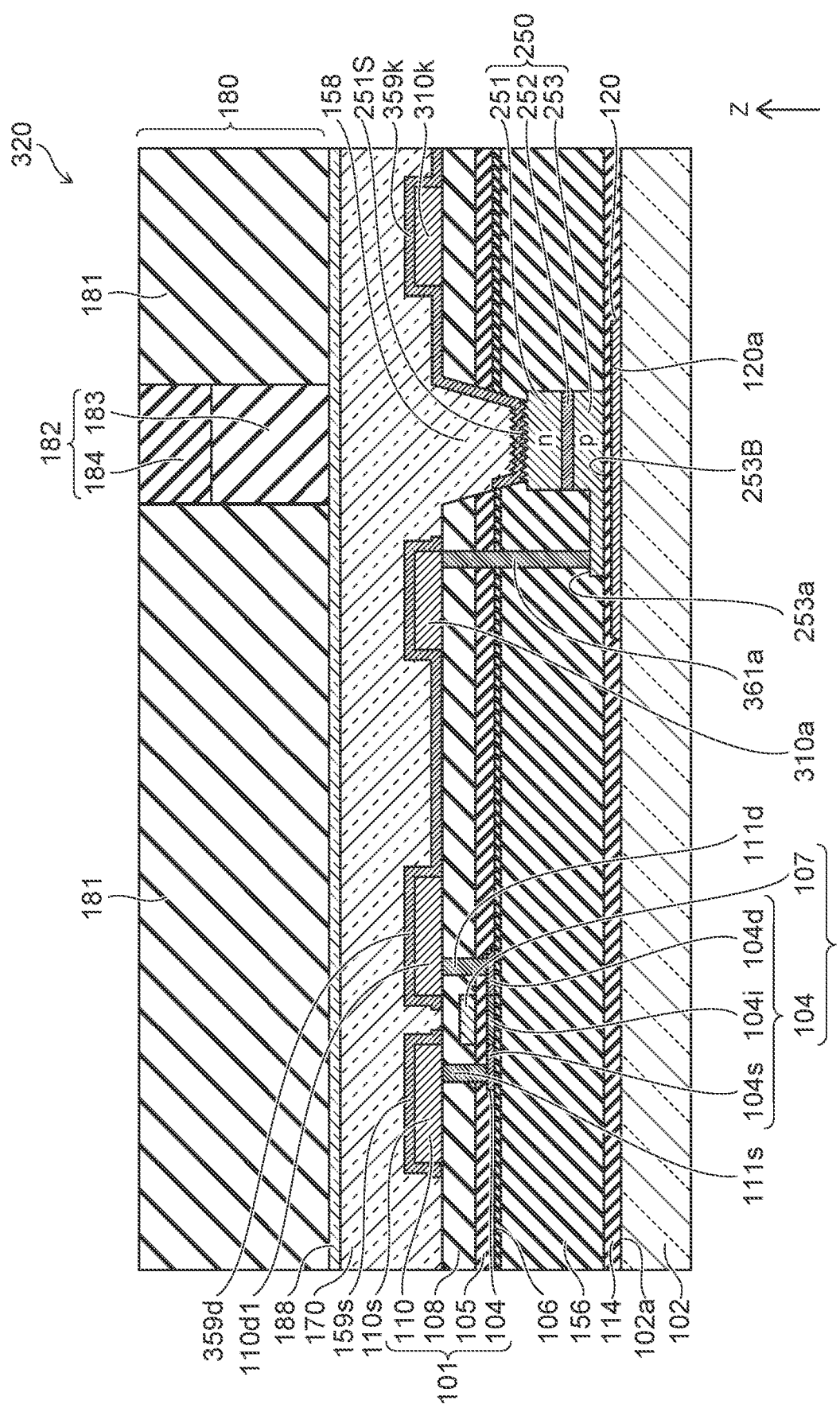
FIG. 20 is a schematic cross-sectional view illustrating a portion of an image display device according to a third embodiment.

FIG. 20 is a schematic cross-sectional view illustrating a portion of an image display device according to the embodiment.

The embodiment differs from the other embodiments described above in that the light-emitting element 250 that uses the n-type semiconductor layer 251 as the light-emitting surface 251S is driven by the p-type transistor 103. The same components as those of the other embodiments described above are marked with the same reference numerals, and a detailed description is omitted as appropriate.

As shown in FIG. 20, a subpixel 320 of the image display device of the embodiment includes the substrate 102, the light-emitting element 250, the first inter-layer insulating film 156, the transistor 103, the second inter-layer insulating film 108, a via 361*a*, and the wiring layer 110. The transistor 103 is a p-channel TFT. The light-emitting element 250 uses the n-type semiconductor layer 251 to provide the light-emitting surface 251S.

The light-emitting element 250 is located on the light-reflecting plate 120*a* with the insulating layer 114 interposed. The light-reflecting plate 120*a* is provided with a configuration similar to that of the other embodiments described above. The light-reflecting plate 120*a* is located directly under the light-emitting element 250. The outer perimeter of the light-reflecting plate 120*a* is set to include the outer perimeter of the light-emitting element 250 when the light-emitting element 250 is projected onto the XY plane. The light-reflecting plate 120*a* substantially improves the luminous efficiency by reflecting the downward-scattered light of the light-emitting element 250 toward the light-emitting surface 251S side.

The light-emitting element 250 is a prismatic or cylindrical element that includes the bottom surface 253B on the first surface 102*a*. The light-emitting surface 251S is the surface opposite to the bottom surface 253B. In the example, the bottom surface 253B is a surface that contacts the insulating layer 114.

The light-emitting element 250 includes the p-type semiconductor layer 253, the light-emitting layer 252, and the n-type semiconductor layer 251. The p-type semiconductor layer 253, the light-emitting layer 252, and the n-type semiconductor layer 251 are stacked in this order from the bottom surface 253B toward the light-emitting surface 251S. The p-type semiconductor layer 253 includes the connection part 253*a*. The connection part 253*a* is located on the insulating layer 114 to protrude from the p-type semiconductor layer 253 in one direction. The connection part 253*a* is connected to one end of the via 361*a* and electrically connects the p-type semiconductor layer 253 to the via 361*a*.

The configuration of the transistor 103 is the same as that of the first embodiment. A description of the detailed configuration of the transistor 103 is omitted.

The wiring layer 110 is formed on the second inter-layer insulating film 108. The wiring layer 110 includes wiring portions 310*k*, 310*a*, 110*d*1, and 110*s*. The wiring portion 310*a* and the wiring portion 310*k* are located proximate to the light-emitting element 250 above the light-emitting element 250. The wiring portion 310*a* (a third wiring portion) is located above the connection part 253*a*. The wiring portion 310*k* (a fourth wiring portion) is located at a position that does not cross the wiring portion 310*a*.

The via 361*a* is provided to extend through the second inter-layer insulating film 108, the insulating layer 105, the TFT underlying film 106, and the first inter-layer insulating film 156. The via 361*a* is located between the wiring portion 310*a* and the connection part 253*a*. The via 361*a* electrically connects the wiring portion 310*a* and the connection part 253*a*.

The vias 111*d* and 111*s* are located similarly to those of the other embodiments described above.

A light-transmitting electrode 359*k* is provided over the wiring portion 310*k*. The light-transmitting electrode 359*k* is provided over the light-emitting surface 251S. The light-transmitting electrode 359*k* also is located between the wiring portion 310*k* and the light-emitting surface 251S and electrically connects the wiring portion 310*k* and the light-emitting surface 251S. For example, the wiring portion 310*k* and the light-transmitting electrode 359*k* are connected to the ground line 4 shown in FIG. 3. Accordingly, the n-type semiconductor layer 251 is electrically connected to the ground line 4 via the light-emitting surface 251S, the light-transmitting electrode 359*k*, and the wiring portion 310*k*.

A light-transmitting electrode 359*d* is provided over the wiring portion 310*a*. The light-transmitting electrode 359*d* is provided over the wiring portion 110*d*1. The light-transmitting electrode 359*k* also is located between the wiring portion 310*a* and the wiring portion 110*d*1 and electrically connects the wiring portion 310*a* and the wiring portion 110*d*1. Accordingly, the p-type semiconductor layer 253 is electrically connected to the region 104*d* via the connection part 253*a*, the via 361*a*, the wiring portion 310*a*, the light-transmitting electrode 359*d*, the wiring portion 110*d*1, and the via 111*d*.

The light-transmitting electrode 159s is provided over the wiring portion 110s. For example, the wiring portion 110s and the light-transmitting electrode 159s are connected to the power supply line 3 shown in FIG. 3. Accordingly, the region 104s of the transistor 103 is electrically connected to the power supply line 3 by the via 111s, the wiring portion 110s, and the light-transmitting electrode 159s.

The vias 361a, 111d, and 111s and the wiring portions 310k, 310a, 110d1, and 110s are formed using materials and formation methods similar to those of the other embodiments and their modifications described above.

Similarly to the other embodiments described above, the color filter 180, etc., also are provided.

A method for manufacturing the image display device of the embodiment will now be described.

FIGS. 21A to 22B are schematic cross-sectional views illustrating the method for manufacturing the image display device of the embodiment.

The same processes as those of the second embodiment can be performed up to the bonding of the semiconductor layer 1150 formed on the crystal growth substrate 1001 to the substrate 102 on which the light-reflecting layer 120 and the insulating layer 114 are formed. The method of the substrate bonding described in the first embodiment may be used. In the following description, the processes of FIGS. 21A to 22B are performed in the processes of FIG. 17B and subsequent processes.

Figure 21A:
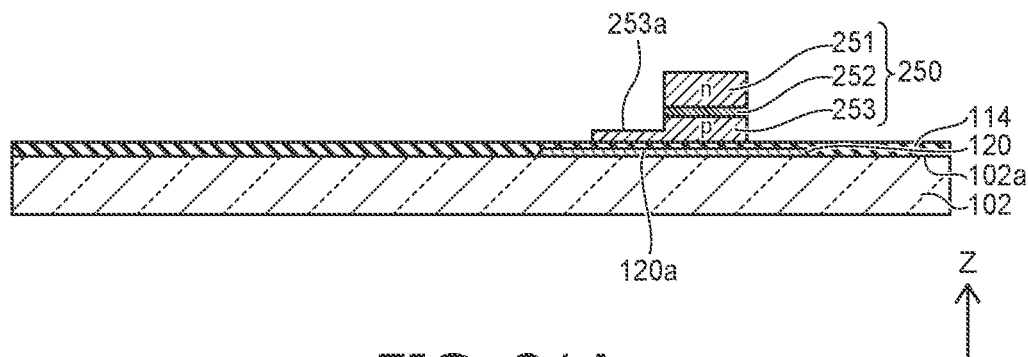
FIG. 21A is a schematic cross-sectional view illustrating a method for manufacturing the image display device of the third embodiment.

As shown in FIG. 21A, the light-emitting element 250 is formed by patterning the semiconductor layer 1150 shown in FIG. 17B into the desired shape. The other parts of the light-emitting element 250 are formed after forming the connection part 253a.

Figure 21B:
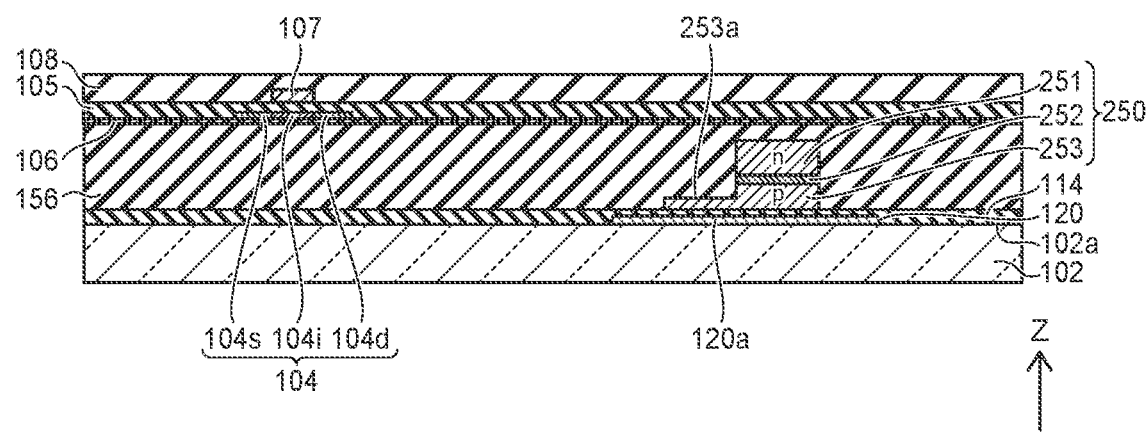
FIG. 21B is a schematic cross-sectional view illustrating the method for manufacturing the image display device of the third embodiment.

As shown in FIG. 21B, the first inter-layer insulating film 156 that covers the insulating layer 114 and the light-emitting element 250 is formed. Similarly to the first embodiment, the TFT underlying film 106 is formed, the TFT channel 104 is formed, the insulating layer 105 is formed, and the gate 107 is formed. The second inter-layer insulating film 108 that covers the insulating layer 105 and the gate 107 is formed.

Figure 22A:
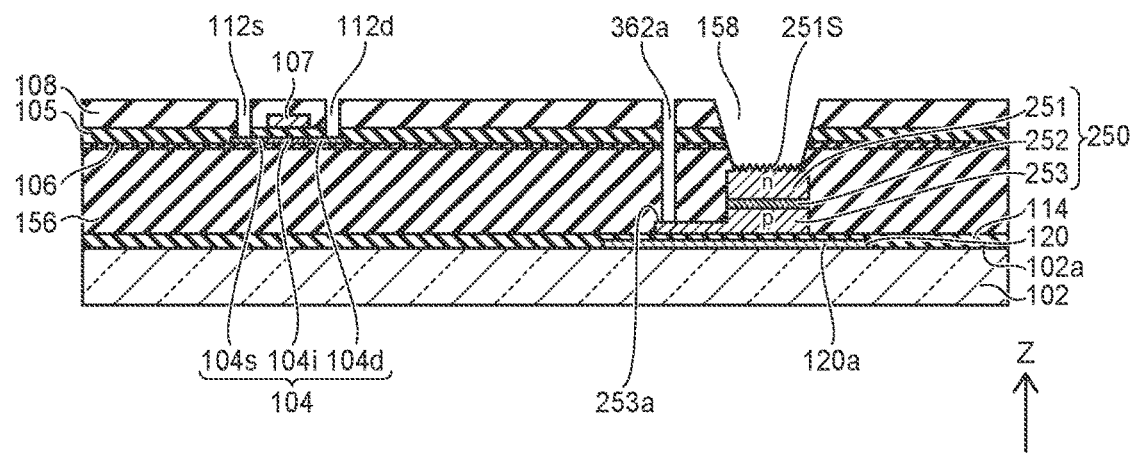
FIG. 22A is a schematic cross-sectional view illustrating the method for manufacturing the image display device of the third embodiment.

As shown in FIG. 22A, a via hole 362a extends through the second inter-layer insulating film 108, the insulating layer 105, the TFT underlying film 106, and the first inter-layer insulating film 156 and is formed to reach the surface of the connection part 253a. The opening 158 and the via holes 112d and 112s are formed similarly to the other embodiments described above.

Figure 22B:
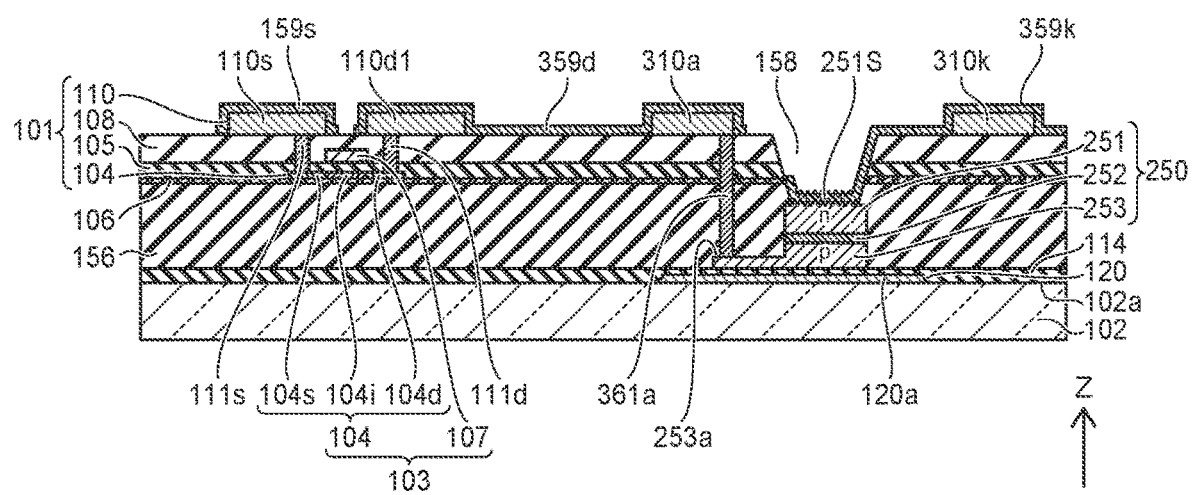
FIG. 22B is a schematic cross-sectional view illustrating the method for manufacturing the image display device of the third embodiment.

As shown in FIG. 22B, the vias 361a, 111d, and 111s are formed by filling a conductive material into the via holes 362a, 112d, and 112s shown in FIG. 22A. The wiring layer 110 is formed on the second inter-layer insulating film 108. The light-transmitting electrodes 359k, 359d, and 159s are formed by forming a transmissive conductive film on the wiring layer 110.

According to the image display device of the embodiment, a circuit configuration can be used in which the p-channel transistor 103 drives the light-emitting element 250 while using the n-type semiconductor layer 251 as the light-emitting surface 251S. Similarly to the second embodiment, the effect of easier roughening of the light-emitting surface is obtained thereby. Also, by roughening the light-emitting surface, the effects of increasing the luminous efficiency and suppressing an increase of the loss due to the contact resistance also can be obtained.

Fourth Embodiment

Figure 23:
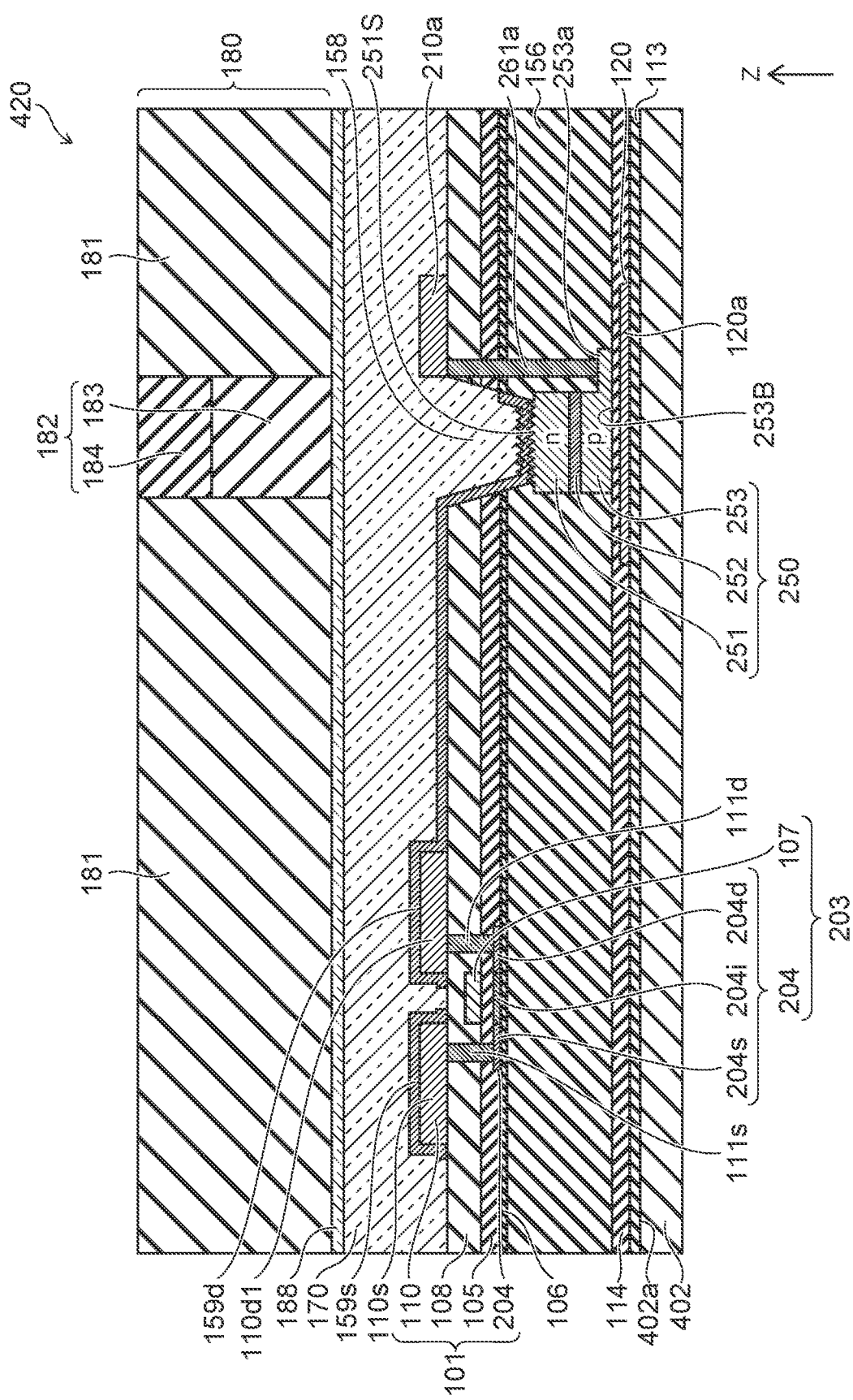
FIG. 23 is a schematic cross-sectional view illustrating a portion of an image display device according to a fourth embodiment.

FIG. 23 is a schematic cross-sectional view illustrating a portion of an image display device according to the embodiment.

The image display device of the embodiment includes a flexible substrate 402 instead of a glass substrate. Circuit elements such as light-emitting elements, transistors, etc., are formed on a first surface 402a of the substrate 402. Otherwise, the embodiment is similar to the other embodiments described above, the same components are marked with the same reference numerals, and a detailed description is omitted as appropriate.

As shown in FIG. 23, the image display device of the embodiment includes a subpixel 420. The subpixel 420 includes the substrate 402. The substrate 402 includes the first surface 402a. A layer 113 that includes a silicon compound is formed on the first surface 402a. For example, the silicon compound-including layer 113 is formed of $SiO_2$, $SiN_x$, etc. The light-reflecting layer 120 is formed on the silicon compound-including layer 113. The silicon compound-including layer 113 is provided to improve the adhesion with the light-reflecting layer 120 that is formed of a metal material.

The insulating layer 114 is formed over the light-reflecting layer 120 and the silicon compound-including layer 113. The insulating layer 114 is planarized by CMP, etc.

The light-emitting element 250 is located on the light-reflecting plate 120a with the insulating layer 114 interposed. In the example, the components and the structures that are higher than the insulating layer 114 are the same as those of the second embodiment described above, and a detailed description is omitted.

The substrate 402 is flexible. For example, the substrate 402 is formed of a polyimide resin, etc. It is favorable for the first inter-layer insulating film 156, the second inter-layer insulating film 108, the wiring layer 110, etc., to be formed of a material that is somewhat flexible to correspond to the flexibility of the substrate 402. The wiring layer 110 that has the longest wiring length has the highest risk of damage when bending. It is therefore desirable to adjust the various film thicknesses, film properties, and materials so that the neutral surface when including the multiple protective films added to the front surface and the back surface, etc., is at the position of the wiring layer 110 as necessary.

In the example, the structures and the components that are higher than the insulating layer 114 are the same as those of the second embodiment, but can be those of the other embodiments and their modifications.

A method for manufacturing the image display device of the embodiment will now be described.

Figure 24A:
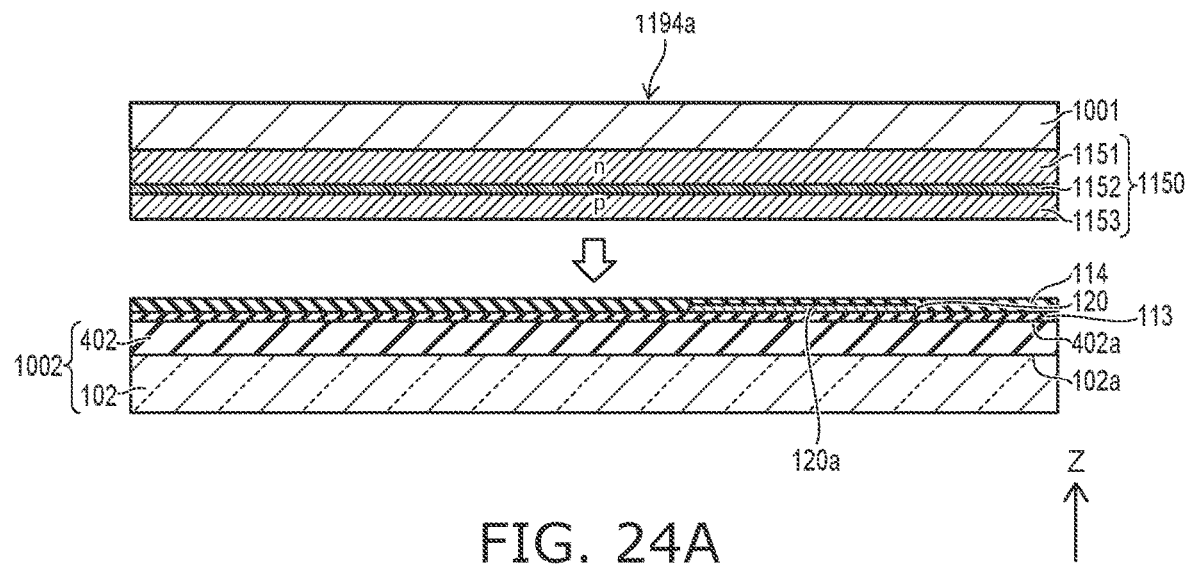
FIG. 24A is a schematic cross-sectional view illustrating a method for manufacturing the image display device of the fourth embodiment.
Figure 24B:
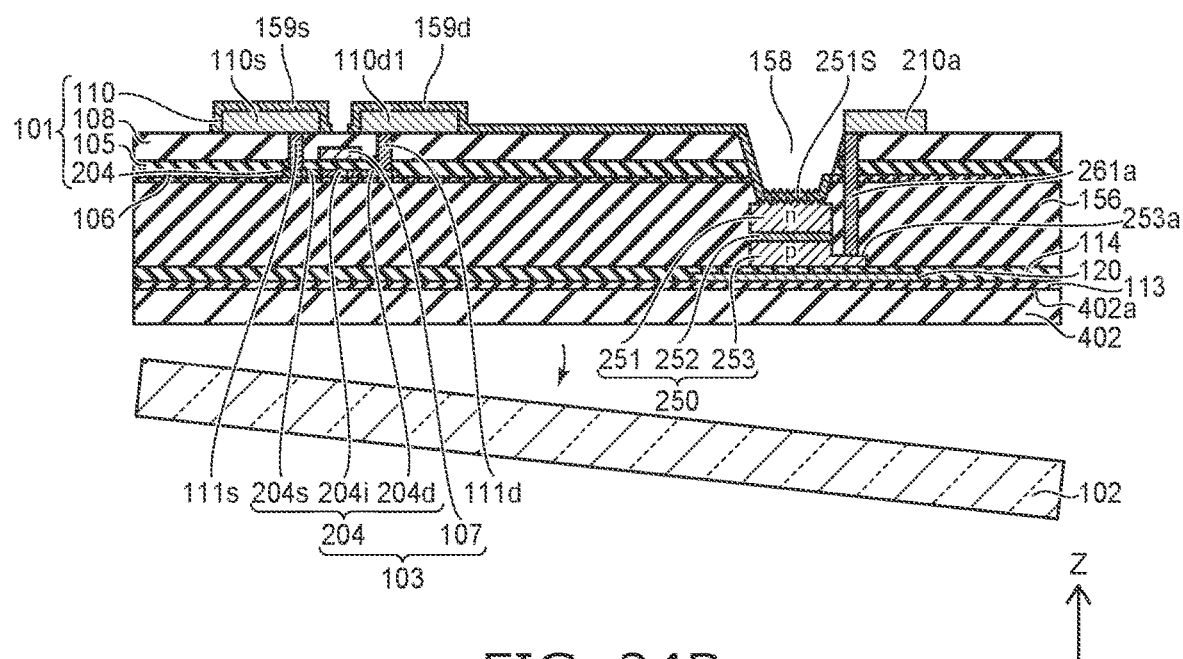
FIG. 24B is a schematic cross-sectional view illustrating the method for manufacturing the image display device of the fourth embodiment.

FIGS. 24A and 24B are schematic cross-sectional views illustrating the method for manufacturing the image display device of the embodiment.

According to the embodiment as shown in FIG. 24A, a substrate 1002 that is different from that of the other embodiments described above is prepared. The substrate 1002 (a fourth substrate) includes the two layers of the substrates 102 and 402. The substrate 102 is, for example, a glass substrate. The substrate 402 is located on the first surface 102a of the substrate 102. For example, the substrate 402 is formed by coating a polyimide material on the first surface 102a of the substrate 102 and by firing. An inorganic film of $SiN_x$ or the like may be formed on the first surface 102a before forming the substrate 402. In such a case, the substrate 402 is formed by coating a polyimide material on the inorganic film and by firing the silicon compound-including layer 113 is formed over the first surface 402a of the substrate 402. The first surface 402a of the substrate 402 is the surface opposite to the surface on which the substrate 102 is located.

The upper structure of the subpixel 420 is formed by, for example, applying the processes of FIGS. 17A to 19B and FIGS. 12 to 13D above to such a substrate 1002.

As shown in FIG. 24B, the substrate 102 is removed from the structure body in which the upper structural component including the not-illustrated color filter and the like are formed. For example, laser lift-off or the like is used to remove the substrate 102. The removal of the substrate 102 is not limited to the timing described above and can be performed at another appropriate timing. For example, the substrate 102 may be removed after the substrate bonding or before forming the color filter. By removing the substrate 102 at an earlier timing, discrepancies such as cracking, chipping, etc., in the manufacturing processes can be reduced.

Effects of the image display device of the embodiment will now be described.

Because the substrate 402 is flexible, bending of the image display device is possible, and adhering to a curved surface, utilizing in a wearable terminal, etc., can be performed without discomfort.

Fifth Embodiment

Figure 25:
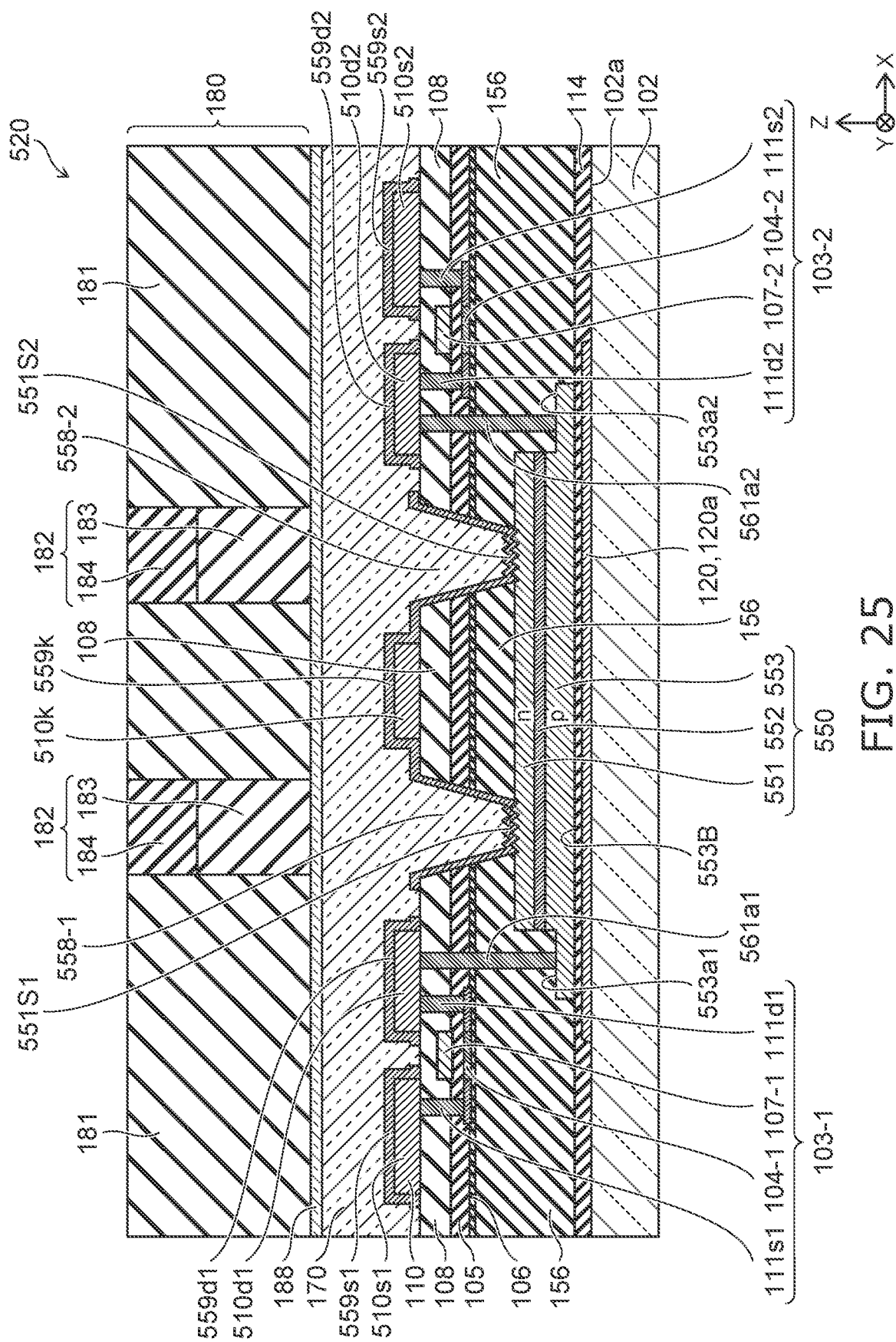
FIG. 25 is a schematic cross-sectional view illustrating a portion of an image display device according to a fifth embodiment.

FIG. 25 is a schematic cross-sectional view illustrating a portion of an image display device according to the embodiment.

According to the embodiment, an image display device that has a higher luminous efficiency is realized by forming multiple light-emitting surfaces 551S1 and 551S2 in a single semiconductor layer 550 that includes a light-emitting layer. In the following description, the same components as those of the other embodiments described above are marked with the same reference numerals, and a detailed description is omitted as appropriate.

As shown in FIG. 25, the image display device of the embodiment includes a subpixel group 520. The subpixel group 520 includes the substrate 102, the semiconductor layer 550, the first inter-layer insulating film 156, transistors 103-1 and 103-2, the second inter-layer insulating film 108, vias 561a1 and 561a2, and the wiring layer 110. The semiconductor layer 550 is located at the first surface 102a side of the substrate 102. In the example, the light-reflecting layer 120 is located between the substrate 102 and the semiconductor layer 550. The light-reflecting layer 120 is located on the first surface 102a. The light-reflecting layer 120 includes the light-reflecting plate 120a. The insulating layer 114 covers the first surface 102a, the light-reflecting layer 120, and the light-reflecting plate 120a. The insulating layer 114 is planarized.

According to the embodiment, holes are injected through one side of the semiconductor layer 550 via the wiring layer 110 and the vias 561a1 and 561a2 by switching the p-channel transistors 103-1 and 103-2 on. Electrons are injected through the other side of the semiconductor layer 550 via the wiring layer 110 by switching the p-channel transistors 103-1 and 103-2 on. In the semiconductor layer 550, a light-emitting layer 552 emits light due to the injection of the holes and electrons and the combination of the holes and electrons. For example, the circuit configuration shown in FIG. 3 is applied to the drive circuit for driving the light-emitting layer 552. A configuration that uses the other embodiments described above also is possible in which the n-type semiconductor layer and the p-type semiconductor layer of the semiconductor layer are vertically interchanged and the semiconductor layer is driven by n-channel transistors. In such a case, the circuit configuration of FIG. 16 is applied to the drive circuit.

The configuration of the subpixel group 520 will now be described in detail.

The semiconductor layer 550 is located on the light-reflecting plate 120a with the insulating layer 114 interposed. The outer perimeter of the light-reflecting plate 120a when projected onto the XY plane is set to include the outer perimeter of the semiconductor layer 550 when the semiconductor layer 550 is projected onto the light-reflecting plate 120a. Favorably, the outer perimeter of the light-reflecting plate 120a when projected onto the XY plane is set not to include the outer perimeters of the transistors 103-1 and 103-2 when the transistors 103-1 and 103-2 are projected onto a plane including the light-reflecting plate 120a. The outer perimeters of the transistors 103-1 and 103-2 when projected onto the XY plane are the outer perimeters of the TFT channels 104-1 and 104-2 when projected onto the XY plane.

The semiconductor layer 550 includes the multiple light-emitting surfaces 551S1 and 551S2. The semiconductor layer 550 is a prismatic or cylindrical stacked body that includes a bottom surface 553B on the first surface 102a. The light-emitting surfaces 551S1 and 551S2 are surfaces opposite to the bottom surface 553B of the semiconductor layer 550. In the example, the bottom surface 553B is a surface that contacts the insulating layer 114. It is favorable for the light-emitting surfaces 551S1 and 551S2 to be surfaces in substantially parallel planes. The substantially parallel planes may be the same plane or may be different planes. The light-emitting surfaces 551S1 and 551S2 are provided to be separated from each other.

The semiconductor layer 550 includes a p-type semiconductor layer 553, the light-emitting layer 552, and an n-type semiconductor layer 551. The p-type semiconductor layer 553, the light-emitting layer 552, and the n-type semiconductor layer 551 are stacked in this order from the bottom surface 553B toward the light-emitting surfaces 551S1 and 551S2.

The p-type semiconductor layer 553 includes connection parts 553a1 and 553a2. The connection part 553a1 is located on the insulating layer 114 to protrude in one direction from the p-type semiconductor layer 553. The connection part 553a2 is located on the insulating layer 114 to protrude from the p-type semiconductor layer 553 in a different direction from the connection part 553a1. The heights of the connection parts 553a1 and 553a2 are less than the height of the semiconductor layer 550, and as in the example, are the same as the height of the p-type semiconductor layer 553, or are less than the height of the p-type semiconductor layer 553, and the semiconductor layer 550 is formed in a staircase shape.

The connection part 553a1 is of the p-type and electrically connects a via 561a1 connected to the connection part 553a1 at one end to the p-type semiconductor layer 553. The connection part 553a2 is of the p-type and electrically connects a via 561a2 connected to the connection part 553a2 at one end to the p-type semiconductor layer 553.

The n-type semiconductor layer 551 includes the two light-emitting surfaces 551S1 and 551S2 at the upper surface. The two light-emitting surfaces 551S1 and 551S2 are arranged to be separated from each other. That is, the one subpixel group 520 substantially includes two subpixels. According to the embodiment, similarly to the other embodiments described above, a display region is formed by arranging the subpixel groups 520 substantially including two subpixels in a lattice shape.

For example, the directions in which the connection parts 553a1 and 553a2 protrude are determined according to the arrangement of the light-emitting surfaces 551S1 and 551S2. For example, the connection part 553a1 is located so that the distance from the light-emitting surface 551S1 is less than the distance from the light-emitting surface 551S2. That is, the connection part 553a1 is located at a position more proximate to a light-emitting surface 553S1 than a light-emitting surface 553S2. For example, the connection part 553a2 is located so that the distance from the light-emitting surface 551S2 is less than the distance from the light-emitting surface 551S1. That is, the connection part 553a2 is located at a position more proximate to the light-emitting surface 551S2 than the light-emitting surface 551S1.

The first inter-layer insulating film 156 (the first insulating film) covers the connection parts 553a1 and 553a2, the side surface of the p-type semiconductor layer 553, the side surface of the light-emitting layer 552, and the side surface of the n-type semiconductor layer 551. The first inter-layer insulating film 156 covers a portion of the upper surface of the n-type semiconductor layer 551. Of the n-type semiconductor layer 551, the light-emitting surfaces 551S1 and 551S2 are not covered with the first inter-layer insulating film 156. Similarly to the other embodiments described above, the first inter-layer insulating film 156 is favorably a white resin.

The TFT underlying film 106 is formed over the first inter-layer insulating film 156. The TFT underlying film 106 is not provided on the light-emitting surfaces 551S1 and 551S2. The TFT underlying film 106 is planarized, and the TFT channels 104-1 and 104-2, etc., are formed on the TFT underlying film 106.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The second inter-layer insulating film 108 (the second insulating film) covers the insulating layer 105 and the gates 107-1 and 107-2.

The TFT channels 104-1 and 104-2 include regions doped to be of the p-type, and the transistors 103-1 and 103-2 are p-channel TFTs. The transistor 103-1 is located at a position more proximate to the light-emitting surface 551S1 than the light-emitting surface 551S2. The transistor 103-2 is located at a position more proximate to the light-emitting surface 551S2 than the light-emitting surface 551S1.

An opening 558-1 is provided above the light-emitting surface 551S1. An opening 558-2 is provided above the light-emitting surface 551S2. The second inter-layer insulating film 108, the insulating layer 105, the TFT underlying film 106, and the first inter-layer insulating film 156 are not provided in the openings 558-1 and 558-2, and the light-emitting surfaces 551S1 and 551S2 are exposed from the second inter-layer insulating film 108, the insulating layer 105, the TFT underlying film 106, and the first inter-layer insulating film 156.

A light-transmitting electrode 559k is provided over the light-emitting surfaces 551S1 and 551S2. Electrons are injected via the light-transmitting electrode 559k and the light-emitting surfaces 551S1 and 551S2. The light-emitting surfaces 551S1 and 551S2 are covered with the light-transmitting electrode 559k, and the openings 558-1 and 558-2 are filled with the surface resin layer 170.

The light-emitting surfaces 551S1 and 551S2 are squares, rectangles, other polygons, circles, etc., when projected onto the XY plane. The shapes of the uppermost portions of the openings 558-1 and 558-2 also can be squares, rectangles, other polygons, circles, etc. For example, as in the example, it is favorable for the openings 558-1 and 558-2 to be formed in tapered shapes so that the surface areas widen upward to reduce loss due to light reflected by the wall surfaces of the openings 558-1 and 558-2. When projected onto the XY plane, the shapes of the light-emitting surfaces 551S1 and 551S2 and the shapes of the uppermost portions of the openings 558-1 and 558-2 may be similar or may not be similar.

The wiring layer 110 is located on the second inter-layer insulating film 108. The wiring layer 110 includes wiring portions 510s1, 510d1, 510k, 510d2, and 510s2.

The wiring portion 510k is located between the light-emitting surface 551S1 and the light-emitting surface 551S2. The light-transmitting electrode 559k is provided over the wiring portion 510k. For example, the wiring portion 510k and the light-transmitting electrode 559k are connected to the ground line 4 of FIG. 3.

The vias 111d1, 111s1, 111d2, and 111s2 are provided to extend through the second inter-layer insulating film 108, the insulating layer 105, and the TFT underlying film 106. The via 111d1 is located between the wiring portion 510d1 and one region of the transistor 103-1 doped to be of the p-type. The via 111s1 is located between the wiring portion 510s1 and another region of the transistor 103-1 doped to be of the p-type. The via 111d2 is located between the wiring portion 510d2 and one region of the transistor 103-2 doped to be of the p-type. The via 111s2 is located between the wiring portion 510s2 and another region of the transistor 103-2 doped to be of the p-type.

The wiring portion 510d1 is located above the connection part 553a1. The wiring portion 510d1 is connected to the p-type region corresponding to the drain electrode of the transistor 103-1 by the via 111d1. The wiring portion 510s1 is connected to the p-type region corresponding to the source electrode of the transistor 103-1 by the via 111s1. The wiring portion 510d2 is located above the connection part 553a2. The wiring portion 510d2 is connected to the region corresponding to the drain electrode of the transistor 103-2 by the via 111d2. The wiring portion 510s2 is connected to the region corresponding to the source electrode of the transistor 103-2 by the via 111s2.

The via 561a1 is provided to extend through the second inter-layer insulating film 108, the insulating layer 105, the TFT underlying film 106, and the first inter-layer insulating film 156. The via 561a1 is located between the connection part 553a1 and the wiring portion 510d1 and electrically connects the connection part 553a1 and the wiring portion 510d1.

The via 561a2 is provided to extend through the second inter-layer insulating film 108, the insulating layer 105, the TFT underlying film 106, and the first inter-layer insulating film 156. The via 561a2 is located between the connection part 553a2 and the wiring portion 510d2 and electrically connects the connection part 553a2 and the wiring portion 510d2.

The transistors 103-1 and 103-2 are drive transistors of adjacent subpixels and are sequentially driven. Holes that are supplied from one of the two transistors 103-1 and 103-2 are injected into the light-emitting layer 552, electrons that are supplied from the wiring portion 510k are injected into the light-emitting layer 552, and the light-emitting layer 552 emits light.

According to the embodiment, the drift current that flows in a direction parallel to the XY plane is suppressed by the resistance of the n-type semiconductor layer 551 and the p-type semiconductor layer 553. Therefore, the electrons that are injected from the light-emitting surfaces 551S1 and 551S2 and the holes that are injected from the vias 561a1 and 561a2 both travel along the stacking direction of the semiconductor layer 550. Because a light emission source substantially does not operate further outward than the light-emitting surfaces 551S1 and 551S2, the multiple light-emitting surfaces 551S1 and 551S2 that are located in one semiconductor layer 550 can be caused to emit light respectively by the transistors 103-1 and 103-2.

As described above, because a light emission source does not operate further outward than the light-emitting surfaces 551S1 and 551S2, the light-reflecting plate 120a also may be provided for each light-emitting surfaces 551S1 and 551S2.

The method for manufacturing the image display device of the embodiment will now be described.

FIGS. 26A to 28B are schematic cross-sectional views illustrating the method for manufacturing the image display device of the embodiment.

Figure 26A:
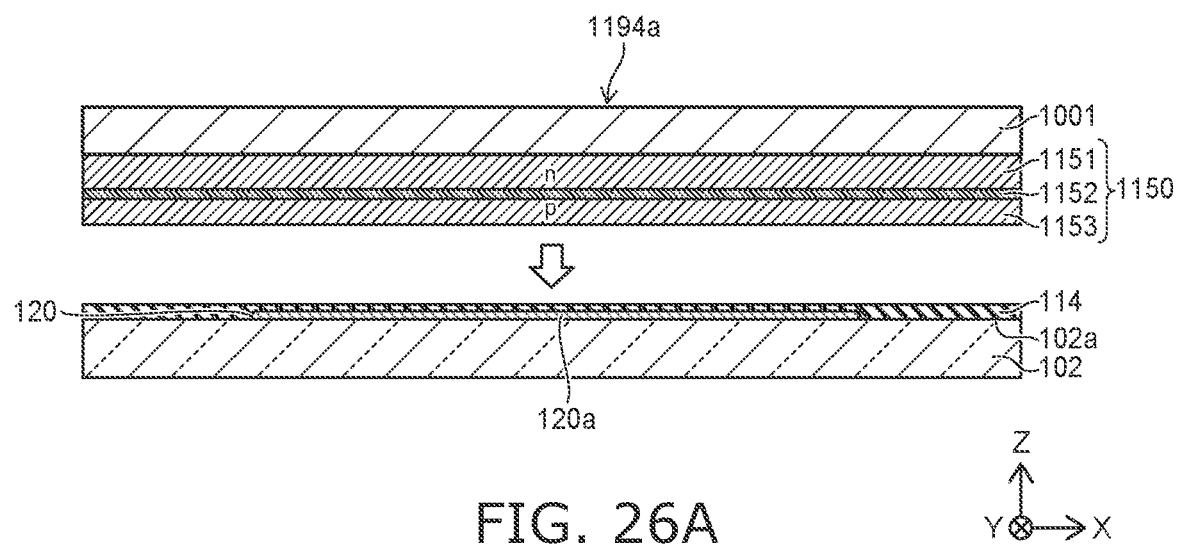
FIG. 26A is a schematic cross-sectional view illustrating a method for manufacturing the image display device of the fifth embodiment.

As shown in FIG. 26A, the semiconductor growth substrate (the second substrate) 1194a and the substrate 102 (the third substrate) are prepared. The light-reflecting layer 120 that includes the light-reflecting plate 120a and the insulating layer 114 that covers the light-reflecting layer 120 are provided beforehand on the first surface 102a of the substrate 102. The semiconductor growth substrate 1194a is the same as that shown in FIG. 6A, and a detailed description is omitted. The bonding of the substrates to each other is performed by bonding the exposed surface of the p-type semiconductor layer 1153 formed in the semiconductor growth substrate 1194a to the planarized insulating layer 114.

Figure 26B:
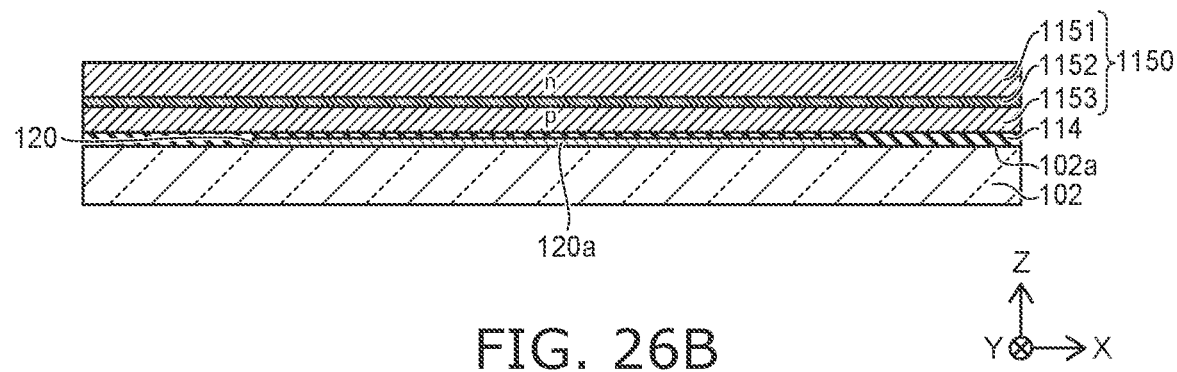
FIG. 26B is a schematic cross-sectional view illustrating the method for manufacturing the image display device of the fifth embodiment.

As shown in FIG. 26B, the crystal growth substrate 1001 shown in FIG. 26A is removed. For example, wet etching, laser lift-off, or the like is used to remove the crystal growth substrate 1001.

Figure 26C:
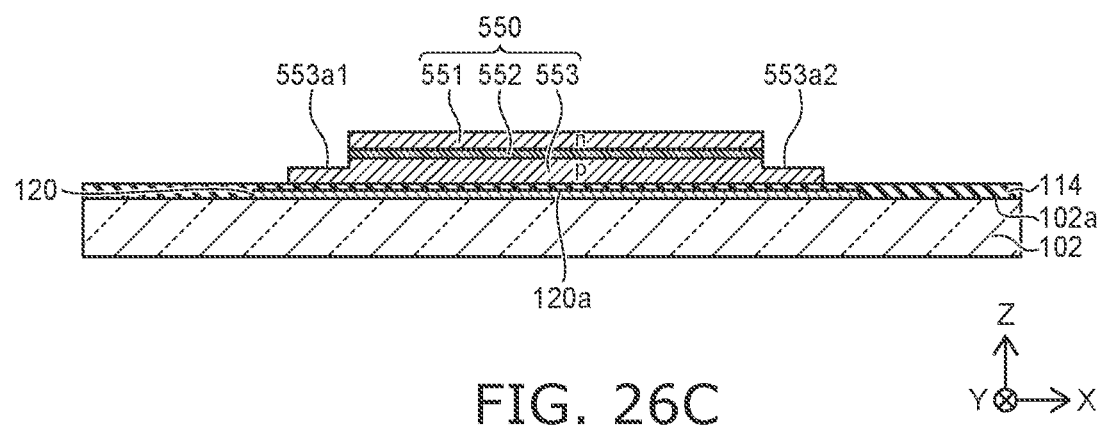
FIG. 26C is a schematic cross-sectional view illustrating the method for manufacturing the image display device of the fifth embodiment.

As shown in FIG. 26C, the semiconductor layer 550 that includes the connection parts 553a1 and 553a2 is formed by patterning the semiconductor layer 1150 shown in FIG. 26B into a desired shape by etching. When projected onto the XY plane, the desired shape is, for example, a square, a rectangle, another polygon, a circle, etc.

Figure 27A:
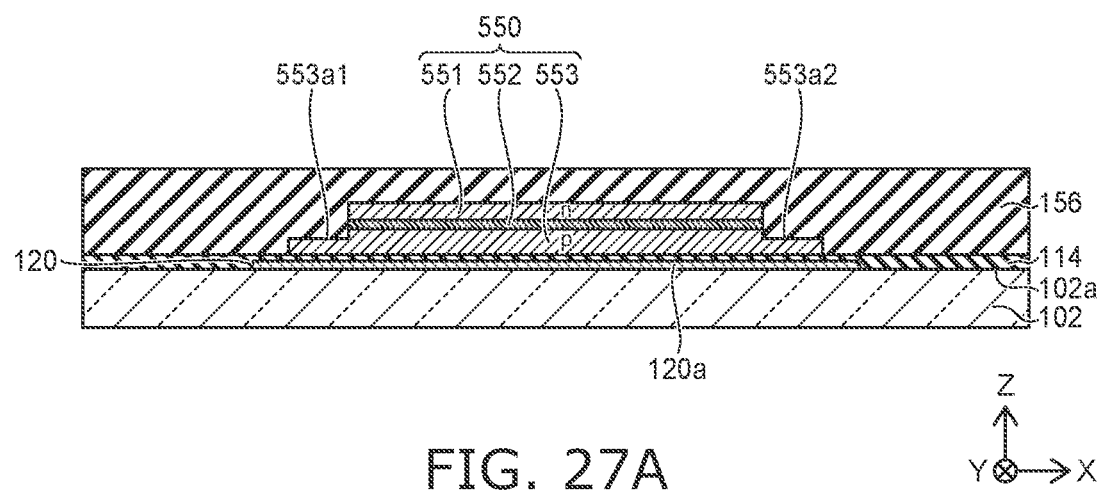
FIG. 27A is a schematic cross-sectional view illustrating the method for manufacturing the image display device of the fifth embodiment.

As shown in FIG. 27A, the first inter-layer insulating film 156 is formed to cover the insulating layer 114 and the semiconductor layer 550.

Figure 27B:
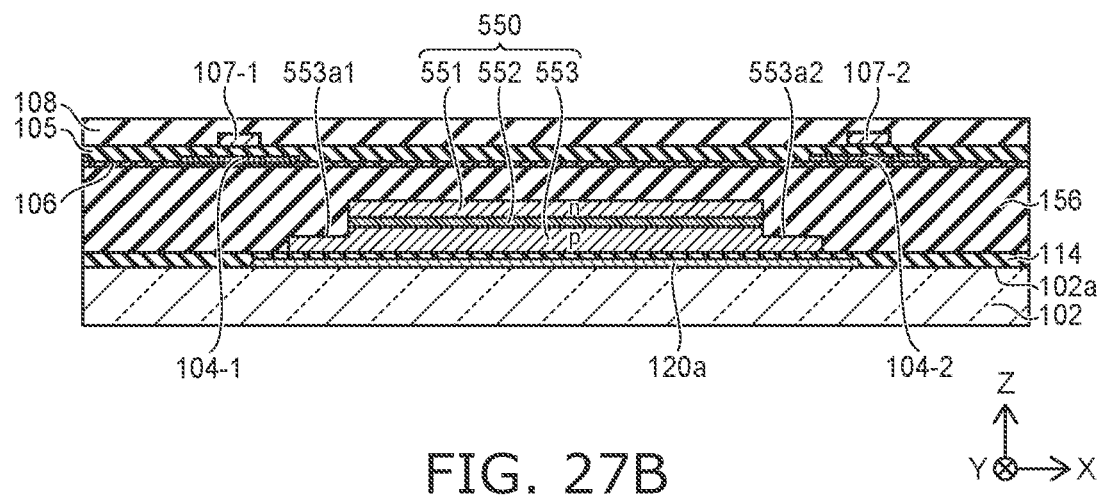
FIG. 27B is a schematic cross-sectional view illustrating the method for manufacturing the image display device of the fifth embodiment.

As shown in FIG. 27B, the TFT underlying film 106 is formed on the first inter-layer insulating film 156, and the TFT channels 104-1 and 104-2 are formed on the TFT underlying film 106. The insulating layer 105 is formed over the TFT underlying film 106 and the TFT channels 104-1 and 104-2. The gate 107-1 is formed on the TFT channel 104-1 with the insulating layer 105 interposed. The gate 107-2 is formed on the TFT channel 104-2 with the insulating layer 105 interposed. The second inter-layer insulating film 108 is formed over the insulating layer 105 and the gates 107-1 and 107-2. The formation methods, materials, etc., of the TFT channels 104-1 and 104-2, the insulating layer 105, the gates 107-1 and 107-2, etc., can be similar to those of the other embodiments described above.

Figure 28A:
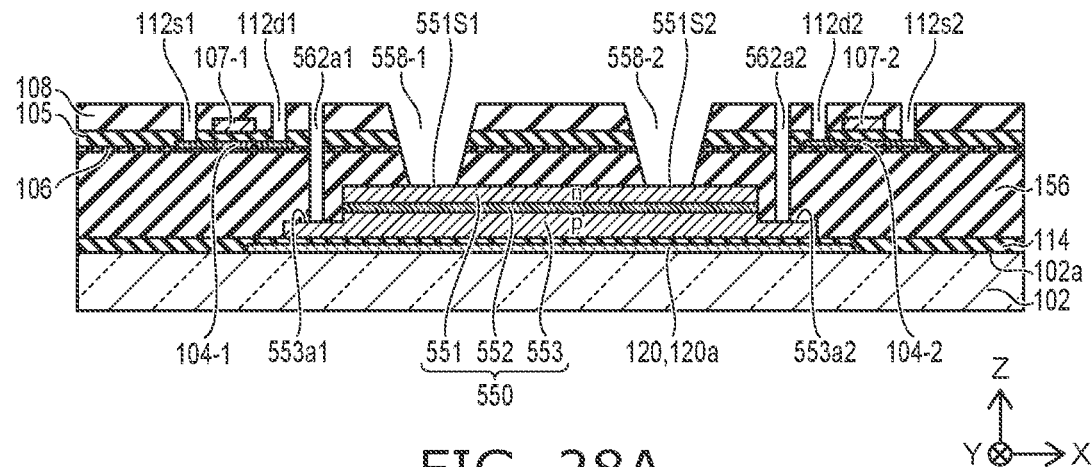
FIG. 28A is a schematic cross-sectional view illustrating the method for manufacturing the image display device of the fifth embodiment.

As shown in FIG. 28A, via holes 112d1 and 112s1 that extend through the second inter-layer insulating film 108, the insulating layer 105, and the TFT underlying film 106 and reach the TFT channel 104-1 are formed. The via holes 112d2 and 112s2 that extend through the second inter-layer insulating film 108, the insulating layer 105, and the TFT underlying film 106 and reach the TFT channel 104-2 are formed. A via hole 562a1 that extends through the second inter-layer insulating film 108, the insulating layer 105, the TFT underlying film 106, and the first inter-layer insulating film 156 and reaches the connection part 553a1 is formed. A via hole 562a2 that extends through the second inter-layer insulating film 108, the insulating layer 105, the TFT underlying film 106, and the first inter-layer insulating film 156 and reaches the connection part 553a2 is formed. The opening 558-1 that reaches the light-emitting surface 551S1 is formed by removing a portion of the second inter-layer insulating film 108, a portion of the insulating layer 105, a portion of the TFT underlying film 106, and a portion of the first inter-layer insulating film 156. The opening 558-2 that reaches the light-emitting surface 551S2 is formed by removing a portion of the second inter-layer insulating film 108, a portion of the insulating layer 105, a portion of the TFT underlying film 106, and a portion of the first inter-layer insulating film 156.

Figure 28B:
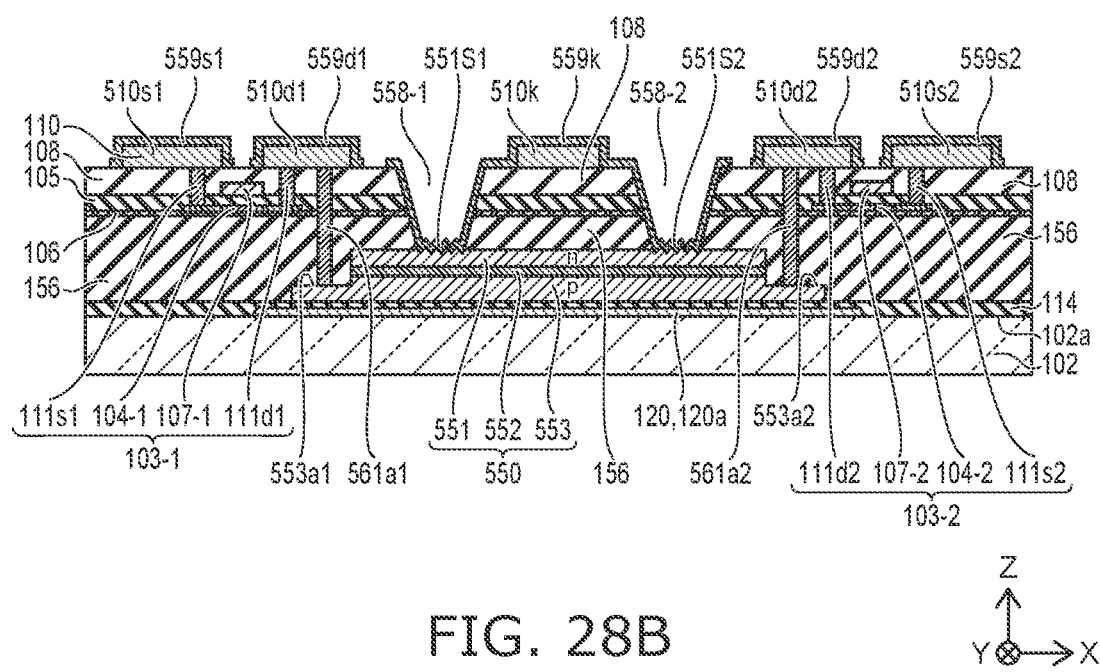
FIG. 28B is a schematic cross-sectional view illustrating the method for manufacturing the image display device of the fifth embodiment.

As shown in FIG. 28B, the vias 111d1, 111s1, 111d2, 111s2, 561a1, and 561a2 are formed by filling the via holes 112d1, 112s1, 112d2, 112s2, 562a1, and 562a2 with a conductive material. The wiring layer 110 is formed, and the wiring portions 510d1, 510s1, 510d2, 510s2, and 510k are formed.

The light-emitting surfaces 551S1 and 551S2 each are roughened. Subsequently, light-transmitting electrodes 559d1, 559s1, 559d2, 559s2, and 559k are formed by providing a transmissive conductive film to cover the wiring layer 110. The light-transmitting electrode 559k is formed to cover the light-emitting surfaces 551S1 and 551S2 and electrically connects the light-emitting surfaces 551S1 and 551S2 and the wiring portion 510k.

Thus, the subpixel group 520 that includes the semiconductor layer 550 including the two light-emitting surfaces 551S1 and 551S2 is formed.

Although two light-emitting surfaces 551S1 and 551S2 are provided in one semiconductor layer 550 in the example, the number of light-emitting surfaces is not limited to two; it is also possible to provide three or more light-emitting surfaces in one semiconductor layer 550. As an example, one column or two columns of subpixels may be realized in a single semiconductor layer 550. as described below, the recombination current that does not contribute to the light emission per light-emitting surface is reduced thereby, and the effect of realizing a finer light-emitting element can be increased.

(Modification)

Figure 29:
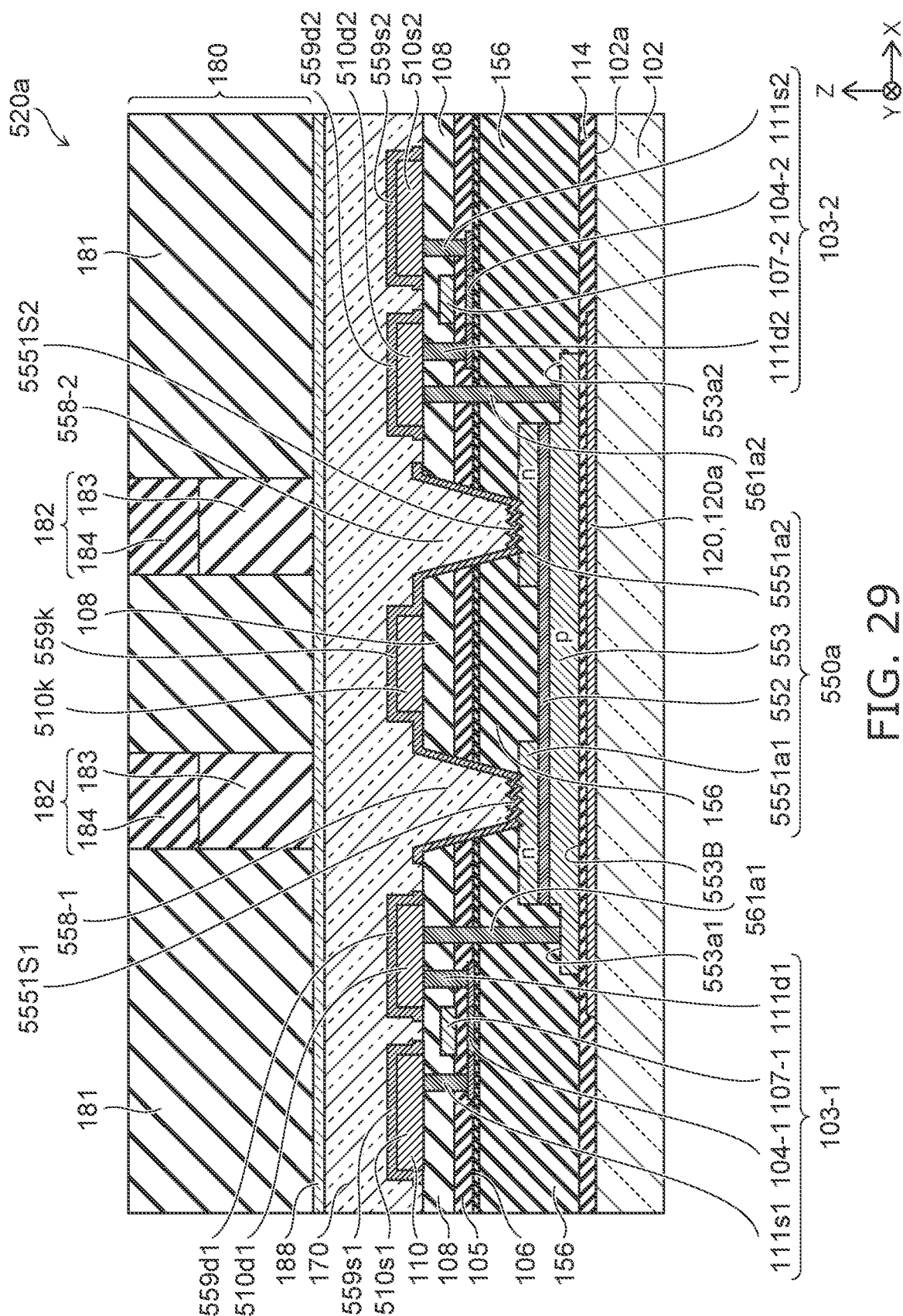
FIG. 29 is a schematic cross-sectional view illustrating a portion of an image display device according to a modification of the fifth embodiment.

FIG. 29 is a schematic cross-sectional view illustrating a portion of an image display device according to a modification of the embodiment.

The modification differs from the fifth embodiment described above in that two n-type semiconductor layers 5551a1 and 5551a2 are located on the light-emitting layer 552. Otherwise, the modification is the same as the fifth embodiment, the same components are marked with the same reference numerals, and a detailed description is omitted as appropriate.

As shown in FIG. 29, the image display device of the modification includes a subpixel group 520a. The subpixel group 520a includes a semiconductor layer 550a. The semiconductor layer 550a includes the p-type semiconductor layer 553, the light-emitting layer 552, and the n-type semiconductor layers 5551a1 and 5551a2. The p-type semiconductor layer 553 and the light-emitting layer 552 are stacked in this order from the insulating layer 114 side. The n-type semiconductor layers 5551a1 and 5551a2 each are stacked on the light-emitting layer 552.

The n-type semiconductor layers 5551a1 and 5551a2 are arranged to be separated along the X-axis direction on the light-emitting layer 552. The first inter-layer insulating film 156 is located between the n-type semiconductor layers 5551a1 and 5551a2, and the n-type semiconductor layers 5551a1 and 5551a2 are divided by the first inter-layer insulating film 156.

The n-type semiconductor layers 5551a1 and 5551a2 have substantially the same shape when projected onto the XY plane, and the shape may be substantially a square, a rectangle, another polygon, a circle, etc.

The n-type semiconductor layer 5551a1 includes a light-emitting surface 5551S1. The n-type semiconductor layer 5551a2 includes a light-emitting surface 5551S2. The light-emitting surface 5551S1 is the surface of the n-type semiconductor layer 5551a1 exposed from the first inter-layer insulating film 156, the TFT underlying film 106, the insulating layer 105, and the second inter-layer insulating film 108 by the opening 558-1. The light-emitting surface 5551S2 is the surface of the n-type semiconductor layer 5551a2 exposed from the first inter-layer insulating film 156, the TFT underlying film 106, the insulating layer 105, and the second inter-layer insulating film 108 by the opening 558-2.

Similarly to the shapes of the light-emitting surfaces according to the fifth embodiment, the shapes of the light-emitting surfaces 5551S1 and 5551S2 when projected onto the XY plane are substantially the same shape and are a shape such as substantially a square, etc. The shapes of the light-emitting surfaces 5551S1 and 5551S2 are not limited to rectangles such as those of the embodiment and may be circles, ellipses, polygons such as hexagons, etc. The shapes of the light-emitting surfaces 5551S1 and 5551S2 may be similar to or different from the shapes of the openings 558-1 and 558-2.

The light-transmitting electrode 559k is located on each of the light-emitting surfaces 5551S1 and 5551S2. The light-transmitting electrode 559k also is located on the wiring portion 510k. The light-transmitting electrode 559k is located between the wiring portion 510k and the light-emitting surface 5551S1 and located between the wiring portion 510k and the light-emitting surface 5551S2. The light-transmitting electrode 559k electrically connects the wiring portion 510k and the light-emitting surfaces 5551S1 and 5551S2.

A manufacturing method of the modification will now be described.

FIGS. 30A to 31B are schematic cross-sectional views illustrating the method for manufacturing the image display device of the modification.

Processes similar to the processes described in reference to FIGS. 26A and 26B according to the fifth embodiment described above up to the process of bonding the substrates to each other are applied to the modification. The process of FIG. 26B described above and subsequent processes will now be described.

Figure 30A:
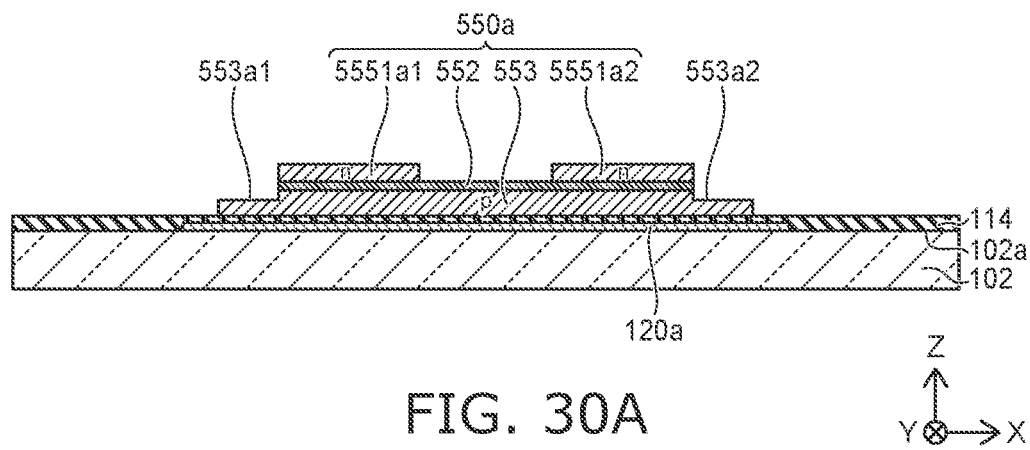
FIG. 30A is a schematic cross-sectional view illustrating a method for manufacturing the image display device of the modification of the fifth embodiment.

According to the modification as shown in FIG. 30A, the light-emitting layer 552 and the p-type semiconductor layer 553 that includes the connection parts 553a1 and 553a2 are formed by etching the semiconductor layer 1150 shown in FIG. 26B. The two n-type semiconductor layers 5551a1 and 5551a2 are formed by further etching. The etching may be performed deeper when forming the n-type semiconductor layers 5551a1 and 5551a2. For example, the etching for forming the n-type semiconductor layers 5551a1 and 5551a2 may be performed to exceed a depth that reaches the light-emitting layer 552 and the p-type semiconductor layer 553. Thus, when the n-type semiconductor layers are formed by performing deep etching, it is desirable to etch outward of the outer perimeters of the light-emitting surfaces 5551S1 and 5551S2 shown in FIG. 29 by not less than 1 μm. The recombination current can be suppressed by separating the etching position outward from the outer perimeters of the light-emitting surfaces 5551S1 and 5551S2.

Figure 30B:
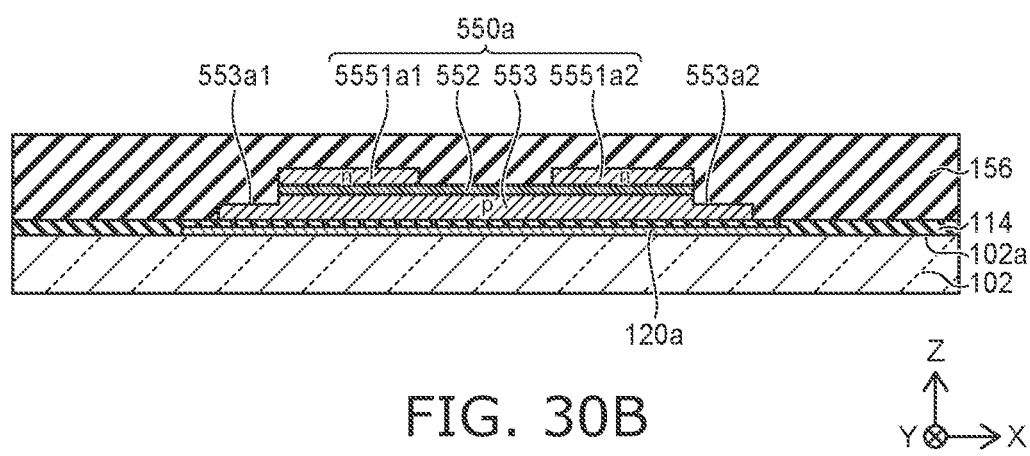
FIG. 30B is a schematic cross-sectional view illustrating the method for manufacturing the image display device of the modification of the fifth embodiment.

As shown in FIG. 30B, the first inter-layer insulating film 156 is formed to cover the insulating layer 114 and the semiconductor layer 550a.

Figure 30C:
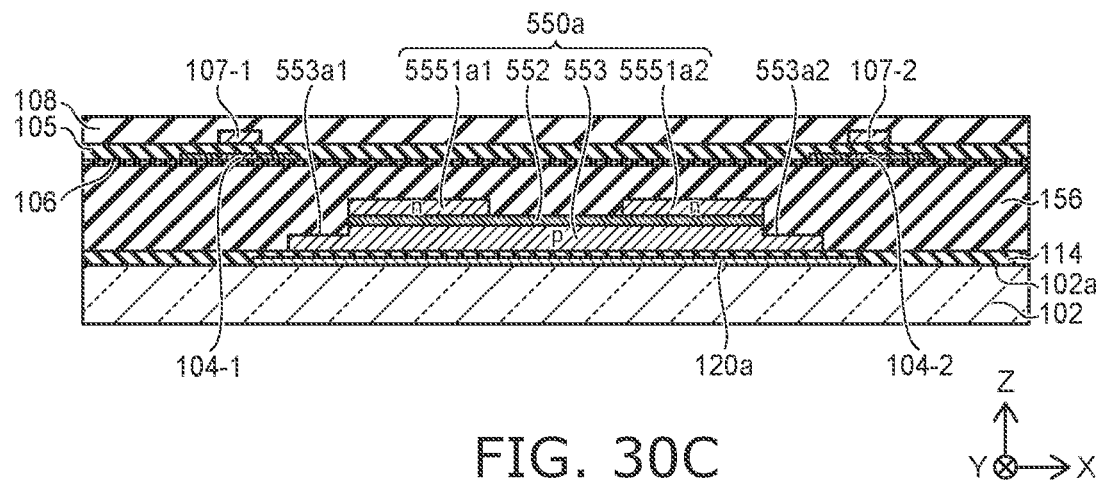
FIG. 30C is a schematic cross-sectional view illustrating the method for manufacturing the image display device of the modification of the fifth embodiment.

As shown in FIG. 30C, the TFT underlying film 106 is formed on the first inter-layer insulating film 156, and the TFT channels 104-1 and 104-2 are formed on the TFT underlying film 106. Furthermore, the insulating layer 105 is formed on the TFT channels 104-1 and 104-2, and the gates 107-1 and 107-2 are formed on the insulating layer 105. The second inter-layer insulating film 108 is formed to cover the insulating layer 105 and the gates 107-1 and 107-2.

Figure 31A:
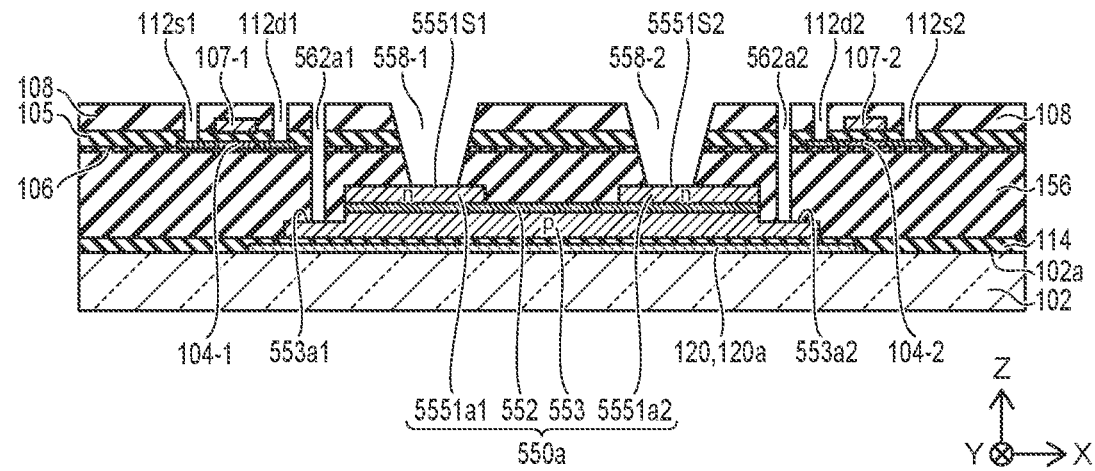
FIG. 31A is a schematic cross-sectional view illustrating the method for manufacturing the image display device of the modification of the fifth embodiment.

As shown in FIG. 31A, the via holes 112d1, 112s1, 112d2, 112s2, 562a1, and 562a2 are formed similarly to those of the fifth embodiment. The opening 558-1 are formed to reach the light-emitting surface 5551S1 by removing the second inter-layer insulating film 108, the insulating layer 105, the TFT underlying film 106, and the first inter-layer insulating film 156. The opening 558-2 is formed to reach the light-emitting surface 5551S2 by removing the second inter-layer insulating film 108, the insulating layer 105, the TFT underlying film 106, and the first inter-layer insulating film 156.

Figure 31B:
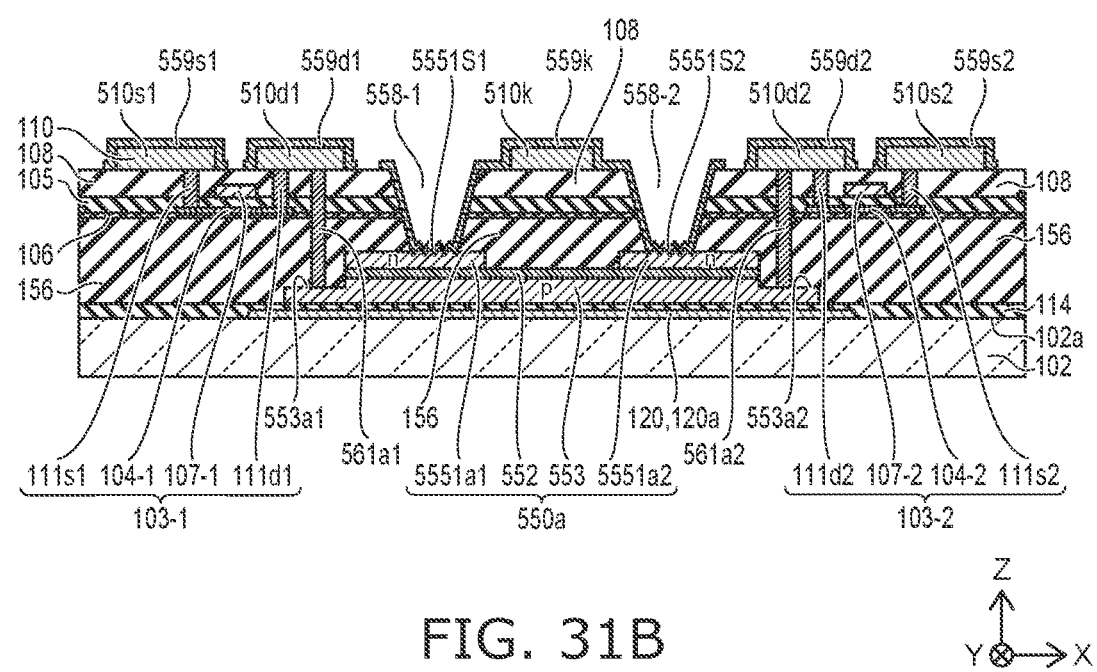
FIG. 31B is a schematic cross-sectional view illustrating the method for manufacturing the image display device of the modification of the fifth embodiment.

As shown in FIG. 31B, similarly to the fifth embodiment, the wiring layer 110 is formed, and transmissive conductive films are formed.

Thus, the subpixel group 520a that includes the two light-emitting surfaces 5551S1 and 5551S2 is formed.

According to the modification as well, similarly to the fifth embodiment, the number of light-emitting surfaces is not limited to two, and three or more light-emitting surfaces may be provided in one semiconductor layer 550a.

Effects of the image display device of the embodiment will now be described.

Figure 32:
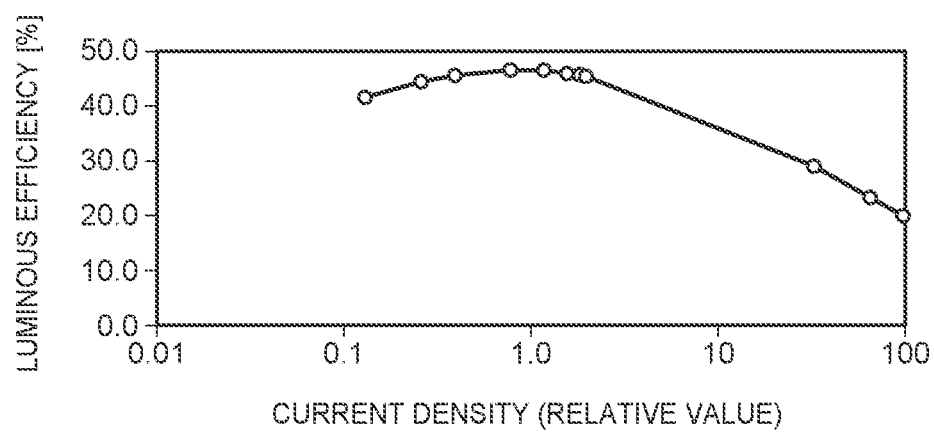
FIG. 32 is a graph illustrating a characteristic of a pixel LED element.

FIG. 32 is a graph illustrating a characteristic of a pixel LED element.

The vertical axis of FIG. 32 is the luminous efficiency (%). The horizontal axis is the current density of the current caused to flow to the pixel LED element shown as a relative value.

As shown in FIG. 32, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency has a maximum exists in the pixel LED element.

It may be expected that a highly efficient image display device is realized by suppressing the current density so that a sufficient luminance is obtained from the light-emitting element. However, it is shown by FIG. 32 that there is a tendency for the current density to decrease and for the luminous efficiency to reduce for a low current density.

As described in the first to fourth embodiments, the light-emitting element is formed by individually dividing by etching or the like all of the layers of the semiconductor layer 1150 that includes the light-emitting layer. At this time, the junction surface between the light-emitting layer and the n-type semiconductor layer is exposed at the end portion. Similarly, the junction surface between the light-emitting layer and the p-type semiconductor layer is exposed at the end portion.

When such end portions exist, electrons and holes recombine at the end portions. On the other hand, such recombination does not contribute to the light emission. The recombination at the end portions occurs substantially regardless of the current caused to flow in the light-emitting element. It is considered that the recombination occurs according to the lengths of the junction surfaces that contribute to the light emission at the end portions.

When two light-emitting elements that have cubic shapes of the same dimensions emit light, end portions are formed at four side surfaces for each light-emitting element; therefore, the two light-emitting elements have a total of eight end portions, and recombination may occur at eight end portions.

In contrast, according to the embodiment, the semiconductor layers 550 and 550a include four side surfaces, and there are four end portions of the two light-emitting surfaces. However, the region between the openings 558-1 and 558-2 substantially does not contribute to the light emission because few electrons and holes are injected; therefore, the end portions that contribute to the light emission can be considered to be six. Thus, according to the embodiment, by substantially reducing the number of end portions of the semiconductor layer, the recombination that does not contribute to the light emission is reduced. By reducing the recombination that does not contribute to the light emission, the drive current per light-emitting surface is reduced.

When reducing the distance between the subpixels for higher definition or the like, when the current density is relatively high, etc., the distance between the light-emitting surface 551S1 and the light-emitting surface 55152 becomes short in the subpixel group 520 of the fifth embodiment. In such a case, when the n-type semiconductor layer is shared as in the fifth embodiment, there is a risk that a portion of the electrons injected into the light-emitting surface being driven may shunt, and the light-emitting surface that is not being driven may have a micro light emission. In the subpixel group 520a of the modification, the n-type semiconductor layer is divided into two, and each n-type semiconductor layer includes a light-emitting surface; therefore, the micro light emission of the light-emitting surface at the side that is not driven can be reduced.

In the semiconductor layer that includes the light-emitting layer according to the embodiment, the p-type semiconductor layer, the light-emitting layer, and the n-type semiconductor layer are stacked in this order from the first inter-layer insulating film 156 side, and the roughening of the exposed surface of the n-type semiconductor layer is favorable from the perspective of increasing the luminous efficiency. Similarly to the other embodiments, the n-type semiconductor layer, the light-emitting layer, and the p-type semiconductor layer may be stacked in the order described above instead of the stacking order of the p-type semiconductor layer and the n-type semiconductor layer.

Specific examples of the subpixels and subpixel groups of the image display devices of the embodiments are described above. Each specific example is an example, and other configuration examples are possible by appropriately combining the configurations and procedures of processes of these embodiments. For example, the n-type semiconductor layer can be the light-emitting surface instead of the p-type semiconductor layer according to the first embodiment, and the p-type semiconductor layer can be the light-emitting surface instead of the n-type semiconductor layer being the light-emitting surface according to the second to fourth embodiments.

Sixth Embodiment

The image display device described above can be used as an image display module having the appropriate number of pixels in, for example, a computer display, a television, a portable terminal such as a smartphone, car navigation, etc.

Figure 33:
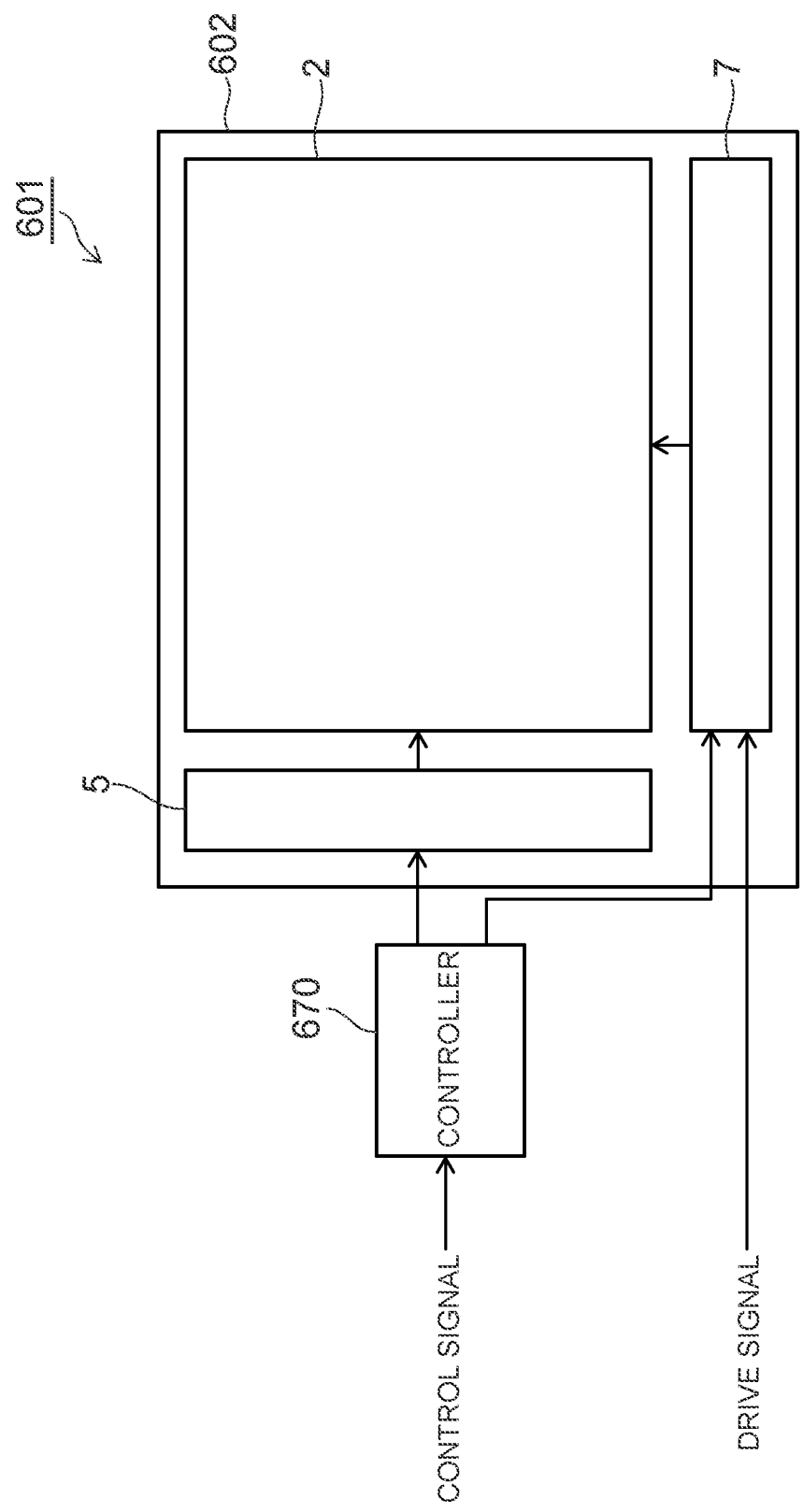
FIG. 33 is a block diagram illustrating an image display device according to a sixth embodiment.

FIG. 33 is a block diagram illustrating the image display device according to the embodiment.

FIG. 33 shows the major parts of the configuration of a computer display.

As shown in FIG. 33, the image display device 601 includes an image display module 602. The image display module 602 is, for example, an image display device that includes the configuration according to the first embodiment described above. The image display module 602 includes the display region 2 in which the multiple subpixels including the subpixels 20 are arranged, the row selection circuit 5, and the signal voltage output circuit 7.

The image display device 601 further includes a controller 670. The controller 670 receives input of control signals that are separated and generated by not-illustrated interface circuitry, and controls the driving and the drive order of the subpixels in the row selection circuit 5 and the signal voltage output circuit 7.

(Modification)

The image display device described above can be used as an image display module including the appropriate number of pixels in, for example, a computer display, a television, a portable terminal such as a smartphone, car navigation, etc.

Figure 34:
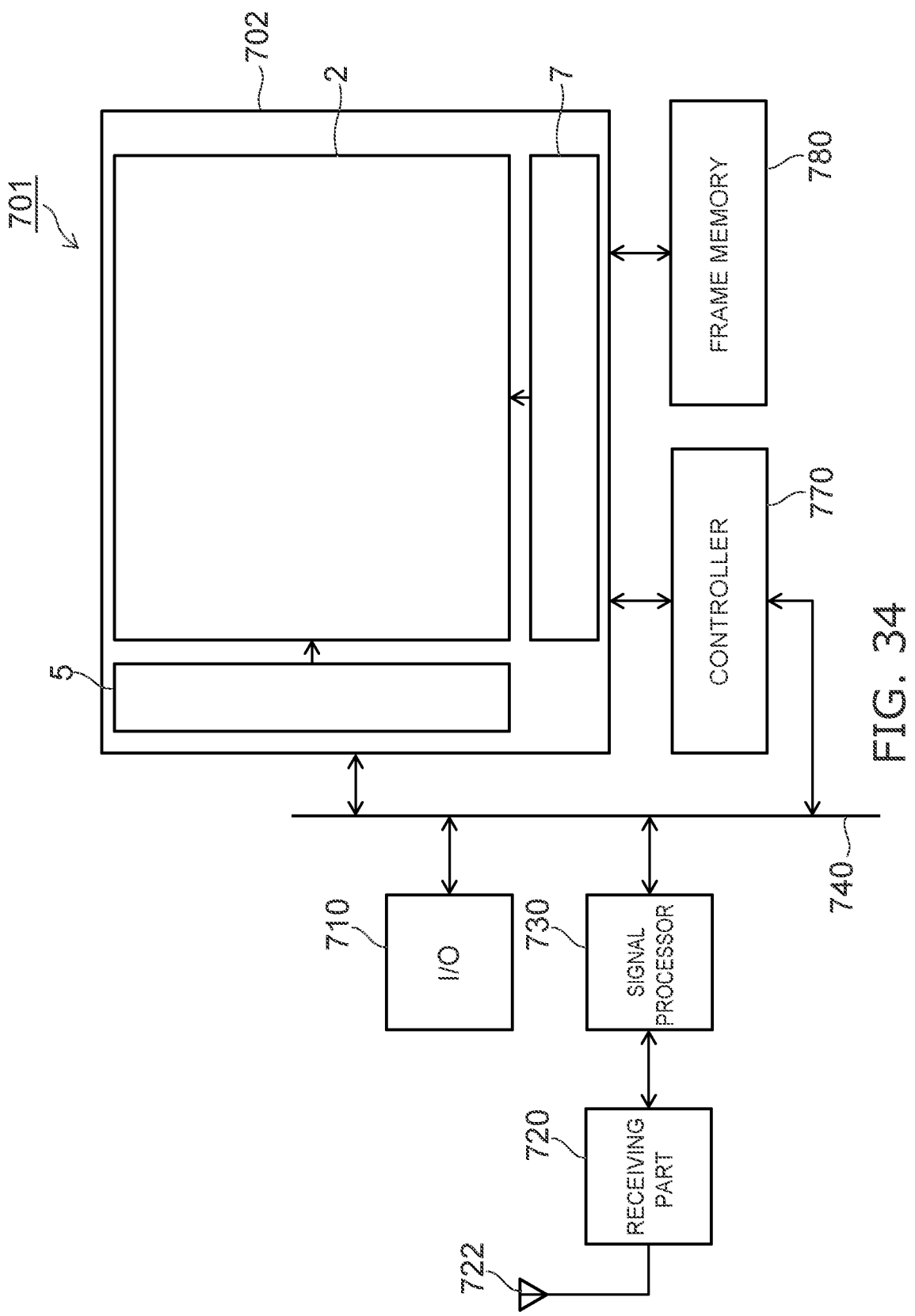
FIG. 34 is a block diagram illustrating an image display device according to a modification of the sixth embodiment.

FIG. 34 is a block diagram illustrating an image display device according to a modification of the embodiment.

FIG. 34 shows the configuration of a high-definition thin television.

As shown in FIG. 34, the image display device 701 includes an image display module 702. The image display module 702 is, for example, the image display device 1 that includes the configuration according to the first embodiment described above. The image display device 701 includes a controller 770 and a frame memory 780. Based on a control signal supplied by a bus 740, the controller 770 controls the drive order of the subpixels of the display region 2. The frame memory 780 stores one frame of display data and is used for smooth processing such as video image reproduction, etc.

The image display device 701 includes an I/O circuit 710. The I/O circuit 710 is labeled as simply "I/O" in FIG. 34. The I/O circuit 710 provides an interface circuitry for connecting with an external terminal, a device, etc. The I/O circuit 710 includes, for example, an audio interface, a USB interface that connects an external hard disk device, etc.

The image display device 701 includes a receiving part 720 and a signal processor 730. An antenna 722 is connected to the receiving part 720, and the necessary signal is separated and generated from the radio wave received by the antenna 722. The signal processor 730 includes a DSP (Digital Signal Processor), a CPU (Central Processing Unit), etc., and the signal that is separated and generated by the receiving part 720 is separated and generated into image data, voice data, etc., by the signal processor 730.

Other image display devices also can be made by using the receiving part 720 and the signal processor 730 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment or other embodiments may be used. Also, it goes without saying that the configurations of the image display modules according to the embodiments and modifications include many subpixels as shown in FIG. 14.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A method for manufacturing an image display device, the method comprising:
   preparing at least one structure comprising a semiconductor layer formed on a first substrate, the semiconductor layer including a light-emitting layer;
   bonding the semiconductor layer to a first surface of a second substrate;
   removing the first substrate;
   forming a light-emitting element by etching the semiconductor layer, the light-emitting element including a bottom surface on the first surface, and a light-emitting surface located opposite to the bottom surface;
   forming a first insulating film that covers the first surface and the light-emitting element;
   forming a circuit element on the first insulating film;
   forming a second insulating film that covers the circuit element and the first insulating film;
   exposing a surface that includes the light-emitting surface by removing a portion of the first insulating film and a portion of the second insulating film;
   forming a via that extends through the first and second insulating films; and
   forming a wiring layer on the second insulating film, wherein
   the light-emitting element comprises a connection part formed on the first surface, and
   the via is located between the wiring layer and the connection part and electrically connects the wiring layer and the connection part.

2. The method for manufacturing the image display device according to claim 1, the method further comprising:
   before the step of bonding the semiconductor layer to the first surface, forming a light-reflective layer on the first surface; and
   forming an insulating layer on the light-reflective layer.

3. The method for manufacturing the image display device according to claim 2, wherein:
   the light-reflective layer comprises a first part that is light-reflective,
   the light-emitting element is formed on the first part, and
   in a plan view, an outer perimeter of the first part includes an outer perimeter of the light-emitting element when the light-emitting element is projected onto the first part.

4. The method for manufacturing the image display device according to claim 1, wherein:
   in the step of preparing the at least one structure, a plurality of the structures are prepared, and
   the step of bonding the semiconductor layer to the second substrate comprises bonding the semiconductor layers of the plurality of structures to the single second substrate.

5. The method for manufacturing the image display device according to claim 1, wherein:
   the second substrate comprises a light-transmitting substrate.

6. The method for manufacturing the image display device according to claim 5, wherein:
   the second substrate further comprises a third substrate located on the light-transmitting substrate,
   the third substrate is flexible, and
   the step of bonding the semiconductor layer to the second substrate comprises, after bonding the semiconductor layer to the third substrate, removing the light-transmitting substrate.

7. The method for manufacturing the image display device according to claim 1, wherein:
   the semiconductor layer comprises an n-type semiconductor layer, the light-emitting layer, and a p-type semiconductor layer, stacked in this order from a first substrate side, and
   the p-type semiconductor layer includes the connection part.

8. The method for manufacturing the image display device according to claim 1, the method further comprising:
   forming a light-transmitting electrode at the exposed light-emitting surface.

9. The method for manufacturing the image display device according to claim 1, wherein:
   the semiconductor layer comprises a gallium nitride compound semiconductor.

10. The method for manufacturing the image display device according to claim 1, the method further comprising:
    forming a wavelength conversion member on the light-emitting element.

11. An image display device, comprising:
    a substrate including a first surface;
    a light-emitting element including a bottom surface on the first surface, and a light-emitting surface opposite to the bottom surface;
    a first insulating film covering the first surface and a lateral surface of the light-emitting element;
    a circuit element located on the first insulating film;
    a second insulating film covering the circuit element and the first insulating film;
    a via provided to extend through the first and second insulating films; and
    a wiring layer located on the second insulating film, wherein:
    the light-emitting element comprises a connection part formed on the first surface, and the via is located between the wiring layer and the connection part and electrically connects the wiring layer and the connection part.

12. The image display device according to claim 11, wherein:
the substrate comprises a light-transmitting substrate.

13. The image display device according to claim 11, wherein:
the substrate includes a substrate that is flexible.

14. The image display device according to claim 11, further comprising:
a light-reflective layer located on the first surface; and
an insulating layer covering the light-reflective layer.

15. The image display device according to claim 14, wherein:
the light-reflective layer comprises a first part,
the light-emitting element is located on the first part, and
in a plan view, an outer perimeter of the first part includes an outer perimeter of the light-emitting element when the light-emitting element is projected onto the first part.

16. The image display device according to claim 11, wherein:
the light-emitting element comprises a first semiconductor layer of a first conductivity type, a light-emitting layer, and a second semiconductor layer of a second conductivity type, stacked in this order from the first surface toward the light-emitting surface, the second conductivity type is different from the first conductivity type, and
the first semiconductor layer comprises the connection part.

17. The image display device according to claim 16, wherein:
the wiring layer comprises:
a first wiring portion connected to the via, and
a second wiring portion connected to a surface including the light-emitting surface, and
the second semiconductor layer is electrically connected to the circuit element via the second wiring portion and the surface including the light-emitting surface.

18. The image display device according to claim 16, wherein:
the wiring layer comprises:
a third wiring portion connected to the via, and
a fourth wiring portion connected to a surface including the light-emitting surface, and
the first semiconductor layer is electrically connected to the circuit element by the via and the third wiring portion.

19. The image display device according to claim 16, wherein:
the first conductivity type is a p-type, and
the second conductivity type is an n-type.

20. The image display device according to claim 16, further comprising:
a light-transmitting electrode located on the light-emitting surface, wherein:
the second semiconductor layer is connected to the wiring layer via the light-transmitting electrode.

21. The image display device according to claim 11, wherein:
the light-emitting element comprises a gallium nitride compound semiconductor.

22. The image display device according to claim 11, wherein:
the circuit element comprises a thin film transistor.

23. The image display device according to claim 11, further comprising:
a wavelength conversion member on the light-emitting element.

24. An image display device, comprising:
a substrate including a first surface;
a semiconductor layer including a bottom surface on the first surface, a surface opposite to the bottom surface, and a plurality of light-emitting surfaces at the surface,
a first insulating film covering the first surface and a lateral surface of the semiconductor layer;
a plurality of transistors located on the first insulating film;
a second insulating film covering the plurality of transistors and the first insulating film;
a plurality of vias extending through the first and second insulating films; and
a wiring layer located on the second insulating film, wherein:
the semiconductor layer comprises a connection part formed on the first surface, and
the plurality of vias are located between the wiring layer and the connection part and electrically connect the wiring layer and the connection part.

25. The image display device according to claim 24, wherein:
the semiconductor layer comprises a first semiconductor layer of a first conductivity type, a light-emitting layer, and a second semiconductor layer of a second conductivity type, stacked in this order from the bottom surface toward the plurality of light-emitting surfaces,
the second conductivity type is different from the first conductivity type, and
the second semiconductor layer is divided by the first insulating film.

* * * * *